United States Patent
Yamane

(10) Patent No.: US 12,549,152 B2
(45) Date of Patent: Feb. 10, 2026

(54) ACOUSTIC WAVE DEVICE

(71) Applicant: Murata Manufacturing Co., Ltd., Nagaokakyo (JP)

(72) Inventor: Takashi Yamane, Nagaokakyo (JP)

(73) Assignee: MURATA MANFACTURING CO., LTD., Kyoto (JP)

( * ) Notice: Subject to any disclaimer, the term of this patent is extended or adjusted under 35 U.S.C. 154(b) by 181 days.

(21) Appl. No.: 18/371,046

(22) Filed: Sep. 21, 2023

(65) Prior Publication Data

US 2024/0106410 A1    Mar. 28, 2024

(30) Foreign Application Priority Data

Sep. 26, 2022 (JP) ................. 2022-152695

(51) Int. Cl.
*H03H 9/02* (2006.01)
(52) U.S. Cl.
CPC .... *H03H 9/02228* (2013.01); *H03H 9/02015* (2013.01)
(58) Field of Classification Search
CPC ........... H03H 9/02228; H03H 9/02015; H03H 9/02866; H03H 9/02559; H03H 9/02574

USPC .................................................. 333/193–196
See application file for complete search history.

(56) References Cited

U.S. PATENT DOCUMENTS

| | | | | |
|---|---|---|---|---|
| 2010/0277036 | A1* | 11/2010 | Shimizu | H03H 9/02897 310/313 B |
| 2019/0326878 | A1* | 10/2019 | Kakita | H03H 9/6483 |
| 2019/0379347 | A1 | 12/2019 | Goto et al. | |
| 2020/0366270 | A1* | 11/2020 | Matsuoka | H03H 9/02275 |

FOREIGN PATENT DOCUMENTS

JP    2019-216414 A    12/2019

\* cited by examiner

*Primary Examiner* — Jorge L Salazar, Jr.
(74) *Attorney, Agent, or Firm* — Keating & Bennett, LLP

(57) ABSTRACT

An acoustic wave device includes a monocrystalline spinel substrate made of a magnesium aluminate single crystal, a piezoelectric layer on the monocrystalline spinel substrate, and an IDT electrode on the piezoelectric layer. Euler angles $(\varphi, \theta, \psi)$ of the magnesium aluminate single crystal of the monocrystalline spinel substrate are within a range of any of regions A in FIGS. 5 to 41.

20 Claims, 24 Drawing Sheets

ACOUSTIC WAVE DEVICE

CROSS REFERENCE TO RELATED APPLICATIONS

This application claims the benefit of priority to Japanese Patent Application No. 2022-152695 filed on Sep. 26, 2022. The entire contents of this application are hereby incorporated herein by reference.

BACKGROUND OF THE INVENTION

1. Field of the Invention

The present invention relates to an acoustic wave device.

2. Description of the Related Art

An acoustic wave device has so far been widely used as, for example, a filter of a mobile phone. Japanese Unexamined Patent Application Publication No. 2019-216414 discloses an example of the acoustic wave device. In the disclosed acoustic wave device, a piezoelectric layer is disposed on a polycrystalline spinel layer. An IDT (Inter digital Transducer) electrode is disposed on the piezoelectric layer.

In the acoustic wave device disclosed in Japanese Unexamined Patent Application Publication No. 2019-216414, however, there is a possibility that a higher-order mode generating near a main mode cannot be sufficiently suppressed.

SUMMARY OF THE INVENTION

Preferred embodiments of the present invention provide acoustic wave devices capable of effectively suppressing generation of the higher-order mode near the main mode.

An acoustic wave device according to a preferred embodiment of the present invention includes a monocrystalline spinel substrate made of a magnesium aluminate single crystal, a piezoelectric layer on the monocrystalline spinel substrate, and an IDT electrode on the piezoelectric layer, wherein $\phi$, $\theta$, and $\psi$ of Euler angles ($\phi$, $\theta$, $\psi$) of the magnesium aluminate single crystal of the monocrystalline spinel substrate are angles within a range of any of regions A in FIGS. 5 to 41.

With the acoustic wave devices according to preferred embodiments of the present invention, the generation of the higher-order mode near the main mode can be effectively suppressed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified from the following description of specific preferred embodiments of the present invention with reference to the drawings.

It is to be noted that the preferred embodiments described in the present disclosure are merely illustrative, and that components in the different preferred embodiments can be partly replaced or combined with each other between those preferred embodiments.

Figure 1:
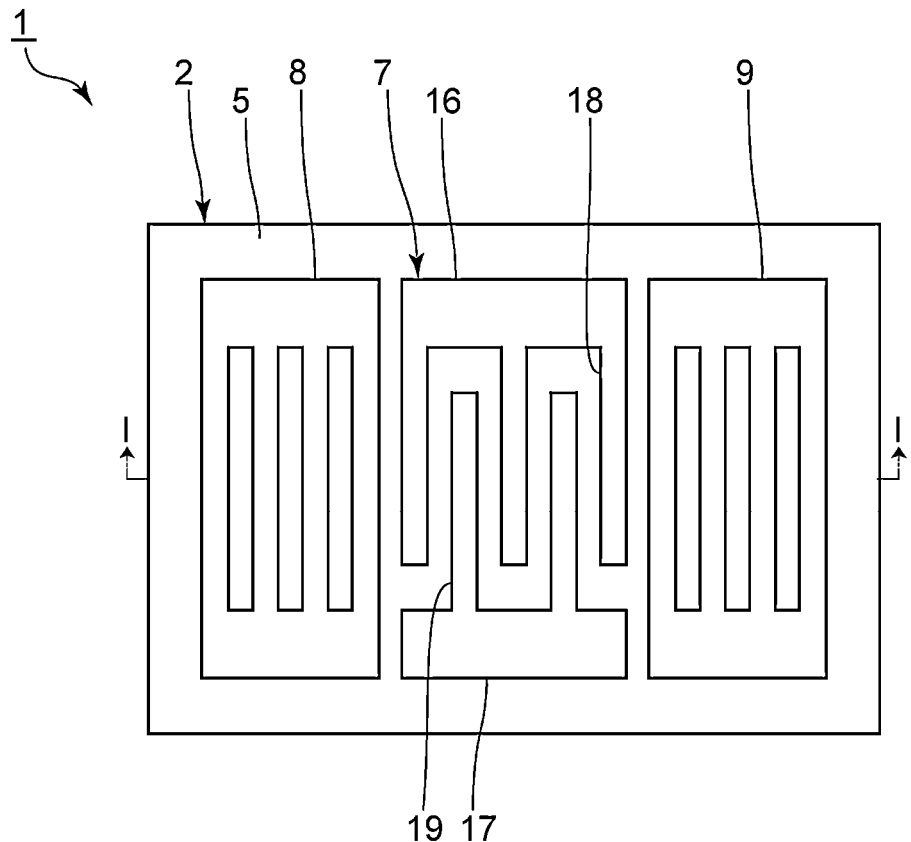
FIG. 1 is a plan view of an acoustic wave device according to a first preferred embodiment of the present invention.
Figure 2:
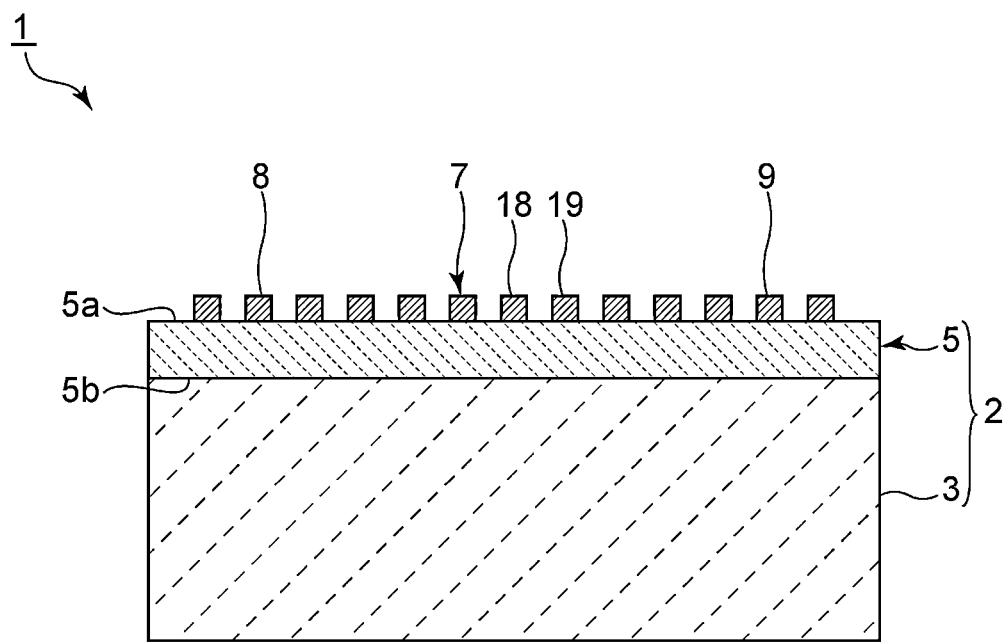
FIG. 2 is a sectional view taken along a line I-I in FIG. 1.

FIG. 1 is a plan view of an acoustic wave device according to a first preferred embodiment of the present invention. FIG. 2 is a sectional view taken along a line I-I in FIG. 1.

As illustrated in FIGS. 1 and 2, an acoustic wave device 1 includes a piezoelectric substrate 2. As illustrated in FIG. 2, the piezoelectric substrate 2 includes a monocrystalline spinel substrate 3 and a piezoelectric layer 5. In this preferred embodiment, the piezoelectric layer 5 is disposed directly on the monocrystalline spinel substrate 3. Alternatively, the piezoelectric layer 5 may be disposed indirectly on the monocrystalline spinel substrate 3 with another layer interposed therebetween.

The monocrystalline spinel substrate 3 is specifically a magnesium aluminate single crystal substrate. In the acoustic wave device 1, the magnesium aluminate single crystal of the monocrystalline spinel substrate 3 is specifically a single crystal of $MgAlO_2$.

In this preferred embodiment, the piezoelectric layer 5 is a rotated Y cut lithium tantalate layer. To be more specific, the piezoelectric layer 5 is a rotated Y cut $LiTaO_3$ layer. When it is assumed that the Euler angles of the piezoelectric layer 5 are denoted by ($φ_{LT}$, $θ_{LT}$, $ψ_{LT}$), $φ_{LT}$ indicates an angle within a range of 0°±5°, $θ_{LT}$ indicates an angle within a range of −180° or more and 180° or less, and $ψ_{LT}$ indicates an angle within a range of 0°±5°. Alternatively, the piezoelectric layer 5 may be a lithium niobate layer such as a $LiNbO_3$ layer, for example.

The piezoelectric layer 5 includes a first principal surface 5a and a second principal surface 5b. The first principal surface 5a and the second principal surface 5b are opposite to each other. Of the first principal surface 5a and the second principal surface 5b, the second principal surface 5b is positioned on a side closer to the monocrystalline spinel substrate 3. An IDT electrode 7 and a pair of reflectors 8 and 9 are disposed on the first principal surface 5a of the piezoelectric layer 5.

As illustrated in FIG. 1, the IDT electrode 7 includes a first busbar 16, a second busbar 17, multiple first electrode fingers 18, and multiple second electrode fingers 19. The first busbar 16 and the second busbar 17 are disposed opposite to each other. Respective one ends of the first electrode fingers 18 are connected to the first busbar 16. Respective one ends of the second electrode fingers 19 are connected to the second busbar 17. The first electrode fingers 18 and the second electrode fingers 19 are interdigitated with each other. Upon application of an AC voltage to the IDT electrode 7, an acoustic wave is excited. A main mode is excited while a higher-order mode is also excited. In various preferred embodiments of the present invention, the higher-order mode is an SH mode or an SV mode.

In the following, the first electrode fingers 18 and the second electrode fingers 19 are simply referred to as electrode fingers in some cases. When a direction in which the electrode fingers extend is referred to as an electrode finger extension direction, the reflector 8 and the reflector 9 are disposed opposite to each other in the direction orthogonal to the electrode finger extension direction in a sandwiching relation to the IDT electrode 7. In the acoustic wave device 1, Al is used as materials of the IDT electrode 7 and the pair of reflectors 8. The materials of the IDT electrode 7 and the pair of reflectors are not limited to Al mentioned above. The IDT electrode 7 and the pair of reflectors may be each formed of a single-layer metal film or a multilayer metal film.

The Euler angles (φ, θ, ψ) indicating the crystal orientation of the above-mentioned magnesium aluminate single crystal is now described with reference to FIG. 3.

Figure 3:
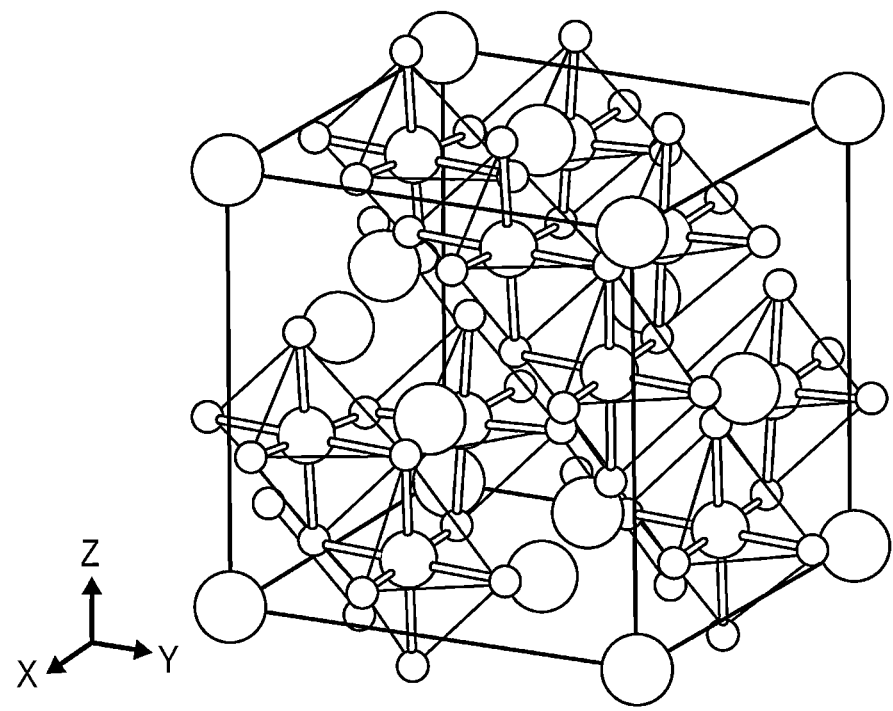
FIG. 3 is a schematic view to explain definition of a crystal orientation of a magnesium aluminate single crystal.

FIG. 3 is a schematic view to explain definition of the crystal orientation of the magnesium aluminate single crystal.

As illustrated in FIG. 3, a crystal structure of the magnesium aluminate single crystal has an X-axis, a Y-axis, and a Z-axis. In the crystal structure of the magnesium aluminate single crystal, Z-X-Z are set as rotation axes on as assumption that a direction of rotation of a right-hand screw is positive. The Euler angles (φ, θ, ψ) indicating the crystal orientation are obtained as an orientation through the following three steps a) to c). a) (X, Y, Z) is rotated by "φ" about the Z-axis, thus resulting in (X1, Y1, Z1). Then, b) (X1, Y1, Z1) is rotated by "θ" about an X1-axis, thus resulting in (X2, Y2, Z2). Furthermore, c) (X2, Y2, Z2) is rotated by "ψ" about a Z2-axis, thus resulting in (X3, Y3, Z3). The finally obtained orientation is expressed as the Euler angles (φ, θ, ψ).

Figure 4:
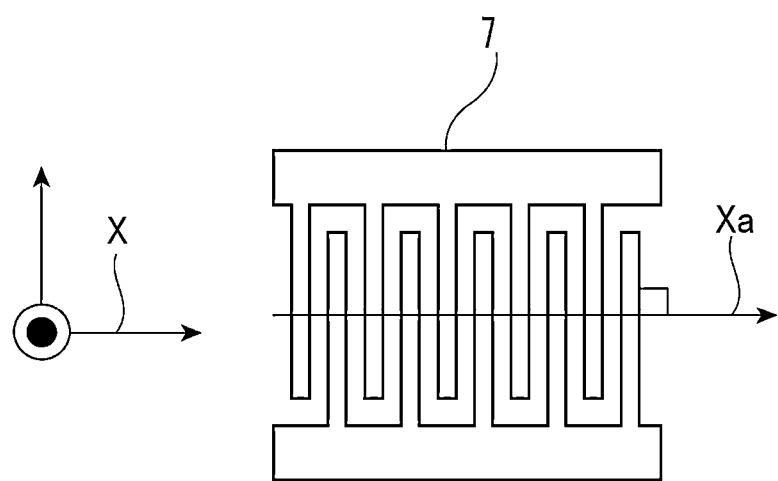
FIG. 4 is a schematic plan view illustrating a relationship between an X-axis of the magnesium aluminate single crystal and an electrode finger extension direction of an IDT electrode when Euler angles ($\phi$, $\theta$, $\psi$) indicating the crystal orientation of the magnesium aluminate single crystal are (0°, 0°, 0°).

FIG. 4 is a schematic plan view illustrating a relationship between the X-axis of the magnesium aluminate single crystal and the electrode finger extension direction of the IDT electrode when the Euler angles (φ, θ, ψ) indicating the crystal orientation of the magnesium aluminate single crystal are (0°, 0°, 0°).

A direction orthogonal to the electrode finger extension direction of the IDT electrode 7 is assumed to be a direction Xa. In this preferred embodiment, as illustrated in FIG. 4, when the Euler angles ($\phi$, $\theta$, $\psi$) of the magnesium aluminate single crystal are (0°, 0°, 0°), the X-axis and the direction Xa are in the same direction.

In the acoustic wave device 1, a direction in which the piezoelectric layer 5 illustrated in FIG. 2 is laminated on the monocrystalline spinel substrate 3 is a Z-direction when the Euler angles ($\phi$, $\theta$, $\psi$) of the magnesium aluminate single crystal of the monocrystalline spinel substrate 3 are (0°, 0°, 0°).

This preferred embodiment is featured in the following points. 1) The piezoelectric layer 5 is disposed on the monocrystalline spinel substrate 3. 2) $\phi$, $\theta$, and $\psi$ of the Euler angles ($\phi$, $\theta$, $\psi$) of the magnesium aluminate single crystal of the monocrystalline spinel substrate 3 are angles within a range of any of regions A in FIGS. 5 to 41. With those features, generation of the higher-order mode near the main mode can be effectively suppressed. Details of those features will be described below.

In the past, a multilayer substrate including a polycrystalline spinel substrate and a piezoelectric layer has been used in some cases. However, an acoustic velocity of a transversal bulk wave in the polycrystalline spinel substrate is 5484 m/s and is substantially constant. It is, therefore, very difficult to suppress the higher-order mode by adjusting a cutoff frequency to a lower value, for example. In the following, the transversal bulk wave is referred to as a transversal wave. The transversal wave includes a fast transversal wave and a slow transversal wave. In this Disclosure, it is assumed that the transversal wave indicates the slow transversal wave unless otherwise specified.

Unlike the related art, in this preferred embodiment, a multilayer substrate including the monocrystalline spinel substrate 3 and the piezoelectric layer 5 is used. In such a case, an acoustic velocity of the transversal wave in the monocrystalline spinel substrate 3 can be easily adjusted by adjusting the Euler angles ($\phi$, $\theta$, $\psi$) in the magnesium aluminate single crystal of the monocrystalline spinel substrate 3. By adjusting the acoustic velocity of the transversal wave in the monocrystalline spinel substrate 3 to become higher or lower than 5484 m/s, the higher-order mode can be more effectively suppressed from generating near the main mode than in the related art. The feature capable of realizing the above-mentioned result is that $\phi$, $\theta$, and $\psi$ of the Euler angles ($\phi$, $\theta$, $\psi$) of the magnesium aluminate single crystal in the acoustic wave device 1 are set to the angles within the range of any of the regions A in FIGS. 5 to 41.

In this Disclosure, when a difference in acoustic velocity is within 1% of the acoustic velocity, different acoustic velocities are regarded as the same. For example, acoustic velocities within a range of 5484 m/s±5.84 m/s are regarded as the same acoustic velocity. In the following, therefore, the acoustic velocities within the range of 5484 m/s±5.84 m/s are regarded as 5484 m/s. It is known that, if $\phi$ of the Euler angles ($\phi$, $\theta$, $\psi$) of the magnesium aluminate single crystal is an angle within a range of $\phi$±5°, the acoustic velocity of the transversal wave in the monocrystalline spinel substrate 3 does not change.

FIGS. 5 to 41 are each a chart illustrating ranges of $\theta$ and $\psi$ in which the acoustic velocity of the transversal wave in the monocrystalline spinel substrate is other than 5484 m/s for each range of $\phi$ of the Euler angles ($\phi$, $\theta$, $\psi$) of the magnesium aluminate single crystal. For example, FIG. 5 is a chart illustrating the ranges of $\theta$ and $\psi$ in which the acoustic velocity of the transversal wave in the monocrystalline spinel substrate is other than 5484 m/s when $\phi$ of the Euler angles ($\phi$, $\theta$, $\psi$) of the magnesium aluminate single crystal is −180° or more and less than −175°.

Figure 5:
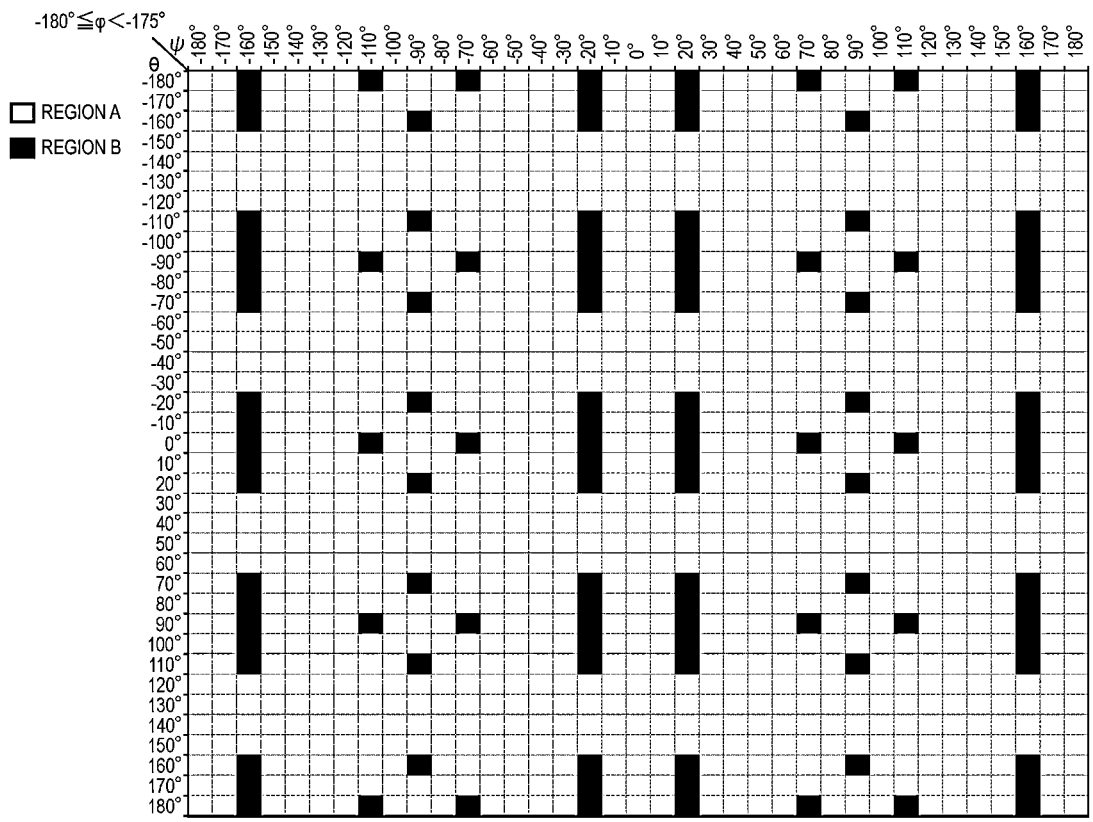
FIG. 5 is a chart illustrating ranges of $\theta$ and $\psi$ in which an acoustic velocity of a transversal wave in a monocrystalline spinel substrate is other than 5484 m/s when $\phi$ of Euler angles ($\phi$, $\theta$, $\psi$) of the magnesium aluminate single crystal is −180° or more and less than −175°.
Figure 6:
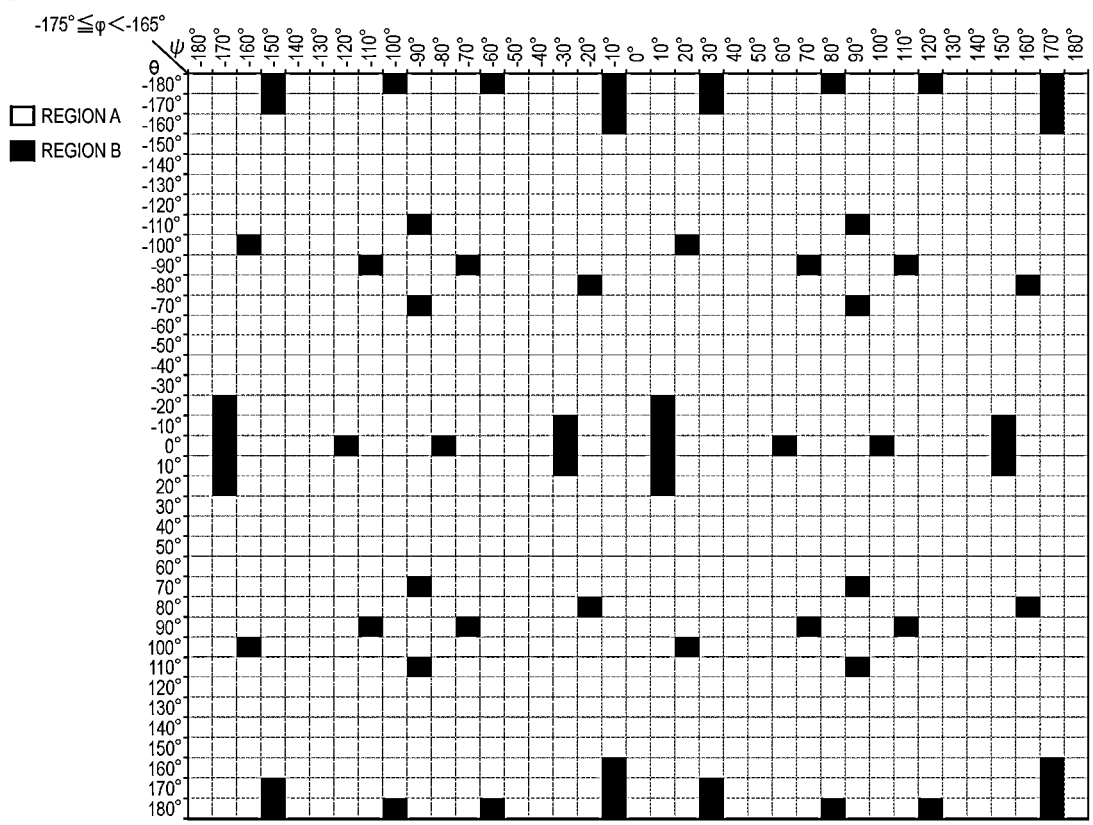
FIG. 6 is a chart illustrating ranges of $\theta$ and $\psi$ in which the acoustic velocity of the transversal wave in the monocrystalline spinel substrate is other than 5484 m/s when $\phi$ of the Euler angles ($\phi$, $\theta$, $\psi$) of the magnesium aluminate single crystal is −175° or more and less than −165°.
Figure 7:
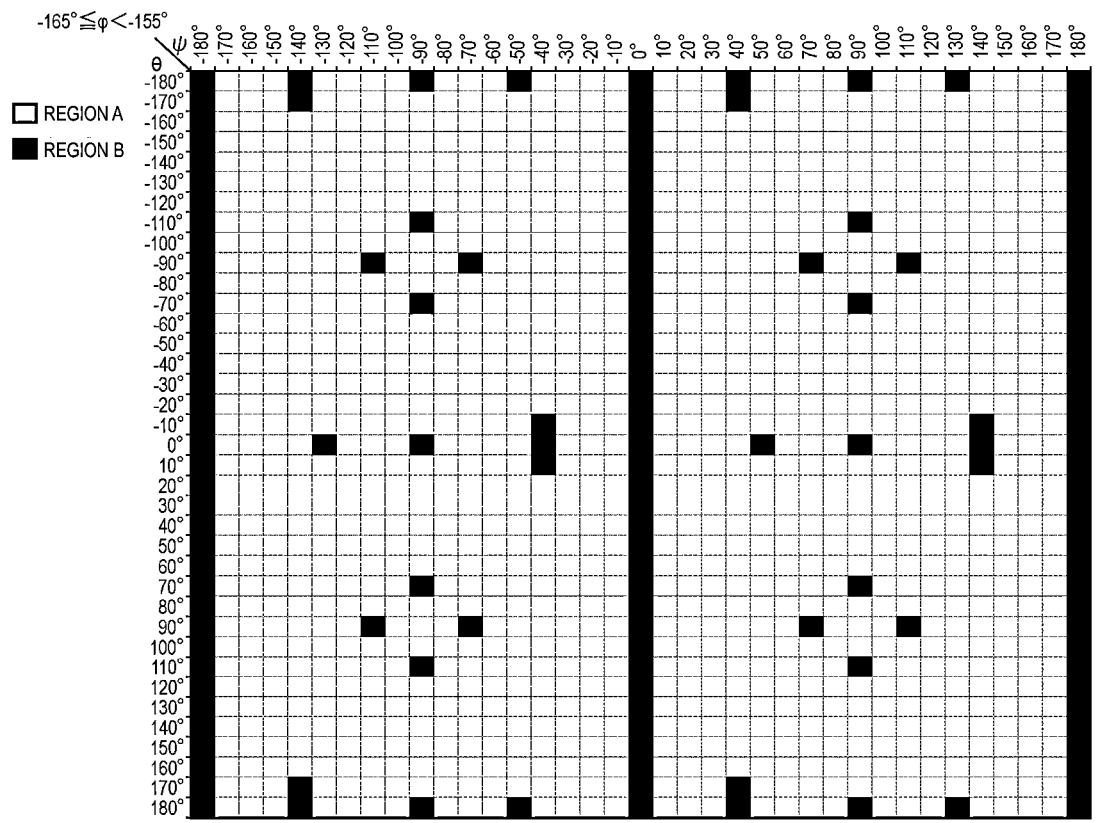
FIG. 7 is a chart illustrating ranges of $\theta$ and $\psi$ in which the acoustic velocity of the transversal wave in the monocrystalline spinel substrate is other than 5484 m/s when $\phi$ of the Euler angles ($\phi$, $\theta$, $\psi$) of the magnesium aluminate single crystal is −165° or more and less than −155°.
Figure 8:
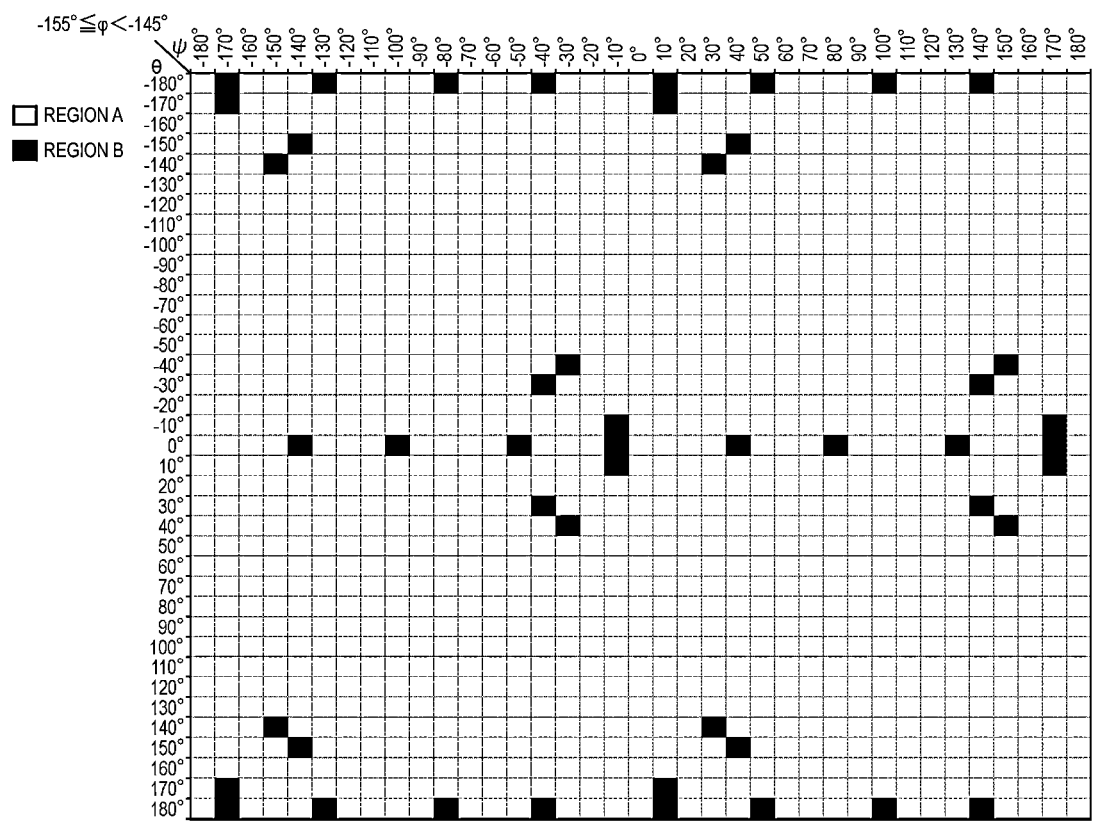
FIG. 8 is a chart illustrating ranges of $\theta$ and $\psi$ in which the acoustic velocity of the transversal wave in the monocrystalline spinel substrate is other than 5484 m/s when $\phi$ of the Euler angles ($\phi$, $\theta$, $\psi$) of the magnesium aluminate single crystal is −155° or more and less than −145°.
Figure 9:
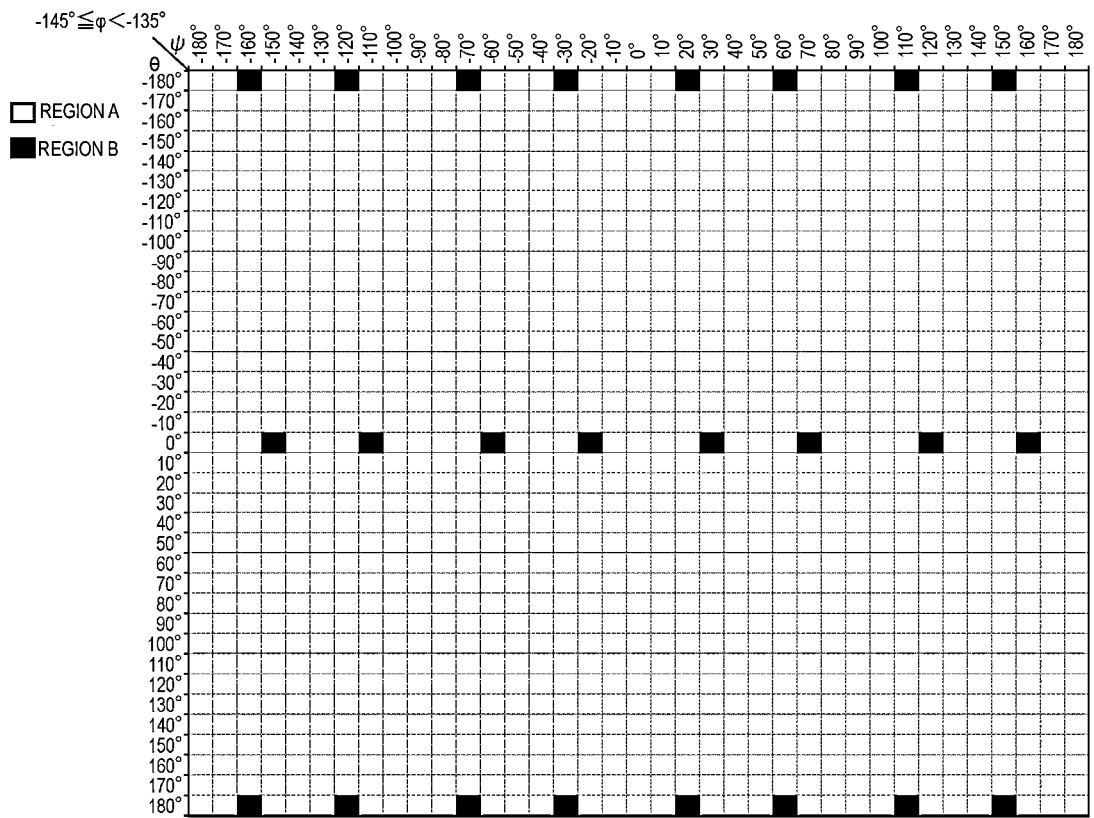
FIG. 9 is a chart illustrating ranges of $\theta$ and $\psi$ in which the acoustic velocity of the transversal wave in the monocrystalline spinel substrate is other than 5484 m/s when $\phi$ of the Euler angles ($\phi$, $\theta$, $\psi$) of the magnesium aluminate single crystal is −145° or more and less than −135°.
Figure 10:
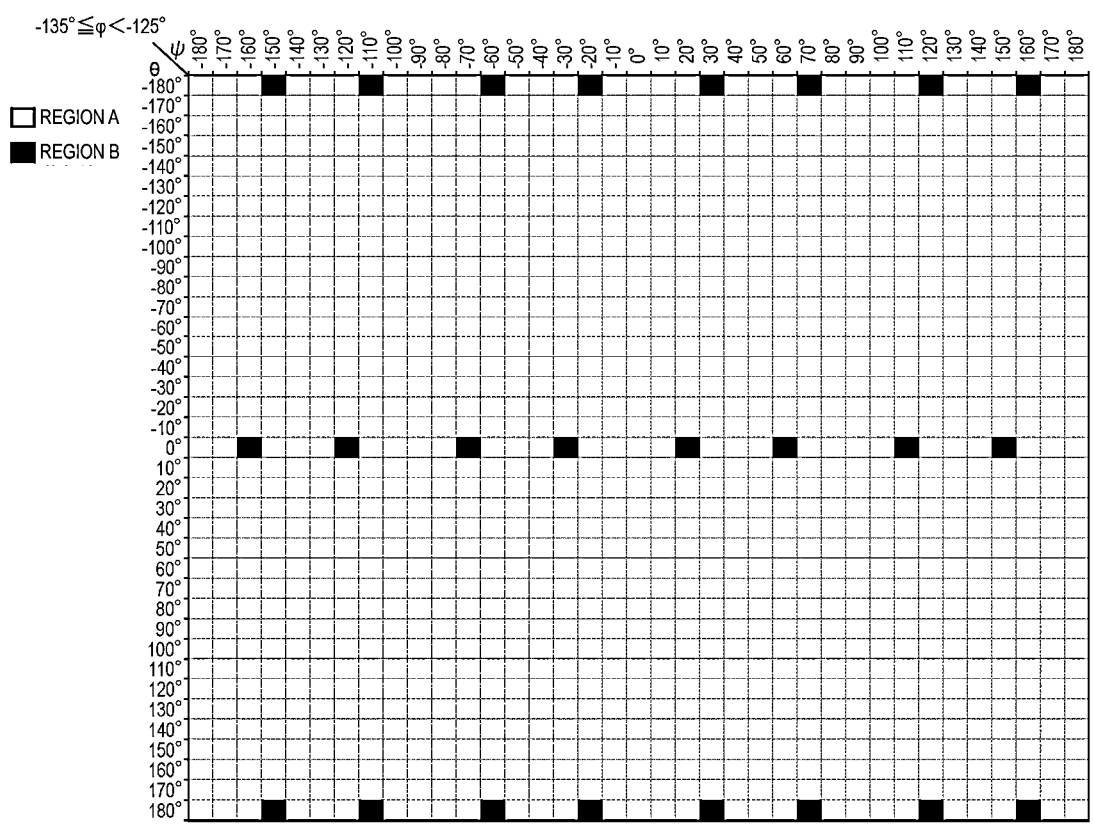
FIG. 10 is a chart illustrating ranges of $\theta$ and $\psi$ in which the acoustic velocity of the transversal wave in the monocrystalline spinel substrate is other than 5484 m/s when $\phi$ of the Euler angles ($\phi$, $\theta$, $\psi$) of the magnesium aluminate single crystal is −135° or more and less than −125°.
Figure 11:
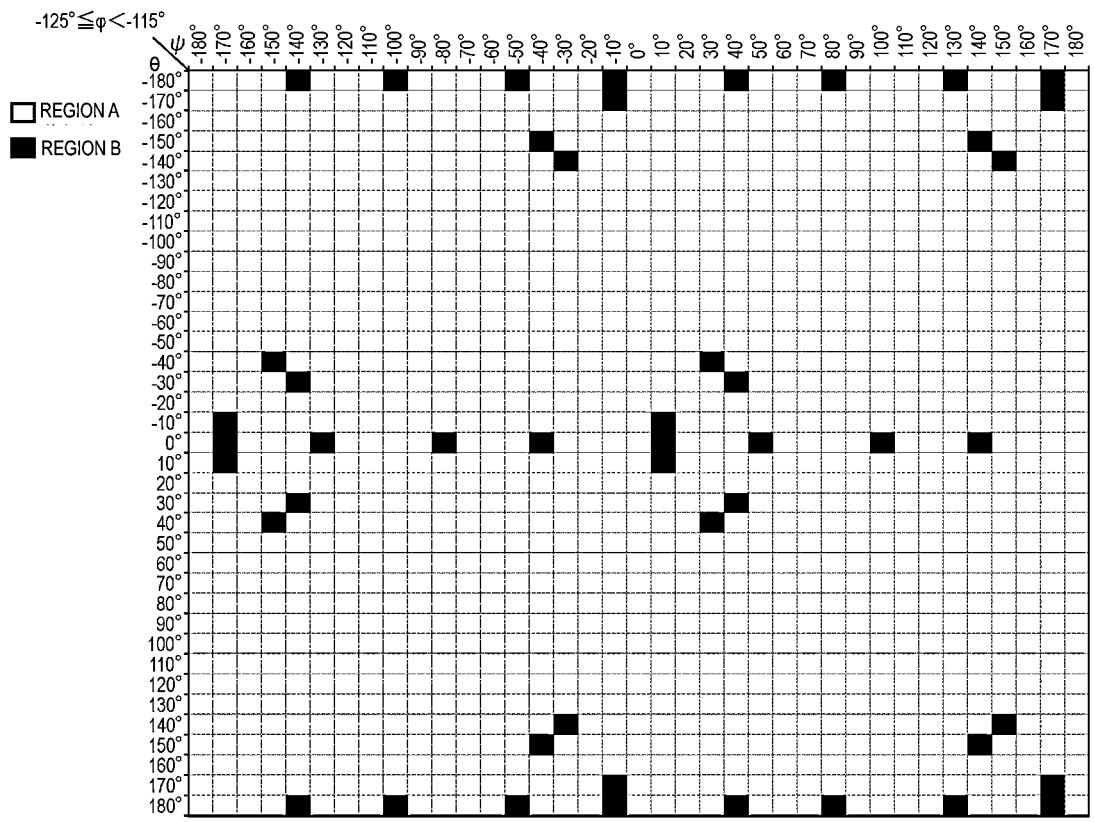
FIG. 11 is a chart illustrating ranges of $\theta$ and $\psi$ in which the acoustic velocity of the transversal wave in the monocrystalline spinel substrate is other than 5484 m/s when $\phi$ of the Euler angles ($\phi$, $\theta$, $\psi$) of the magnesium aluminate single crystal is −125° or more and less than −115°.
Figure 12:
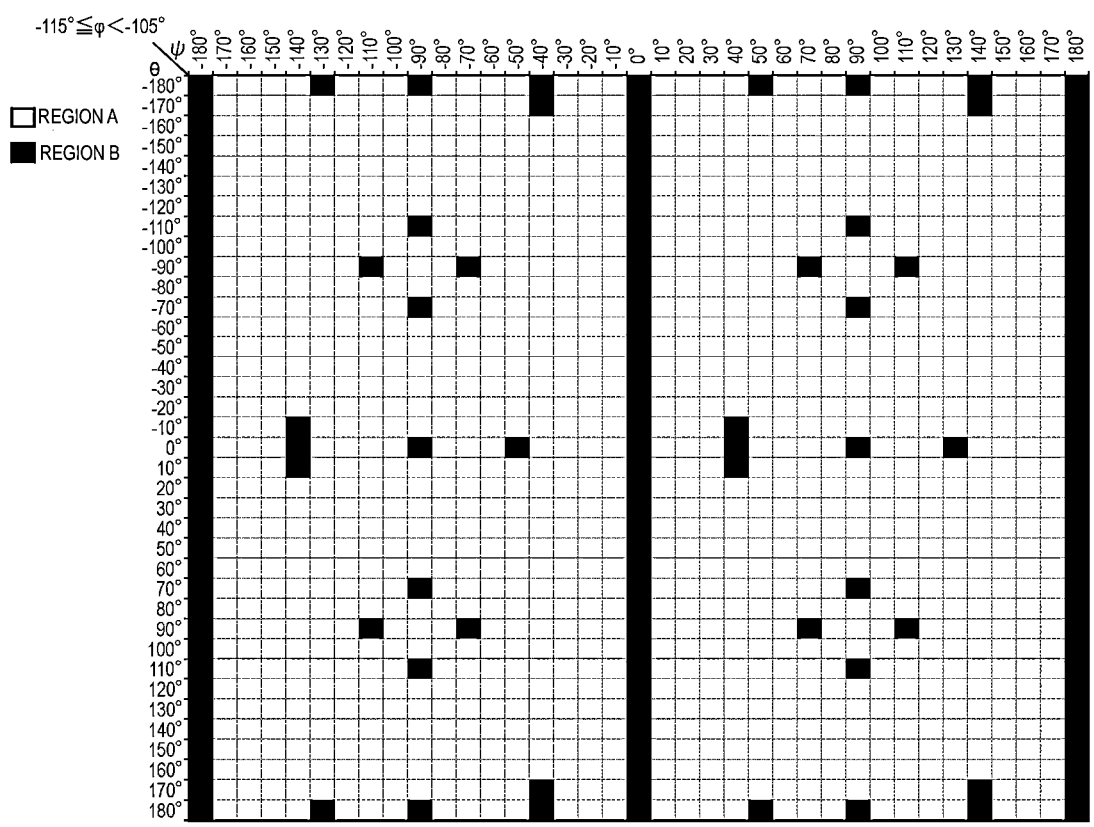
FIG. 12 is a chart illustrating ranges of $\theta$ and $\psi$ in which the acoustic velocity of the transversal wave in the monocrystalline spinel substrate is other than 5484 m/s when $\phi$ of the Euler angles ($\phi$, $\theta$, $\psi$) of the magnesium aluminate single crystal is −115° or more and less than −105°.
Figure 13:
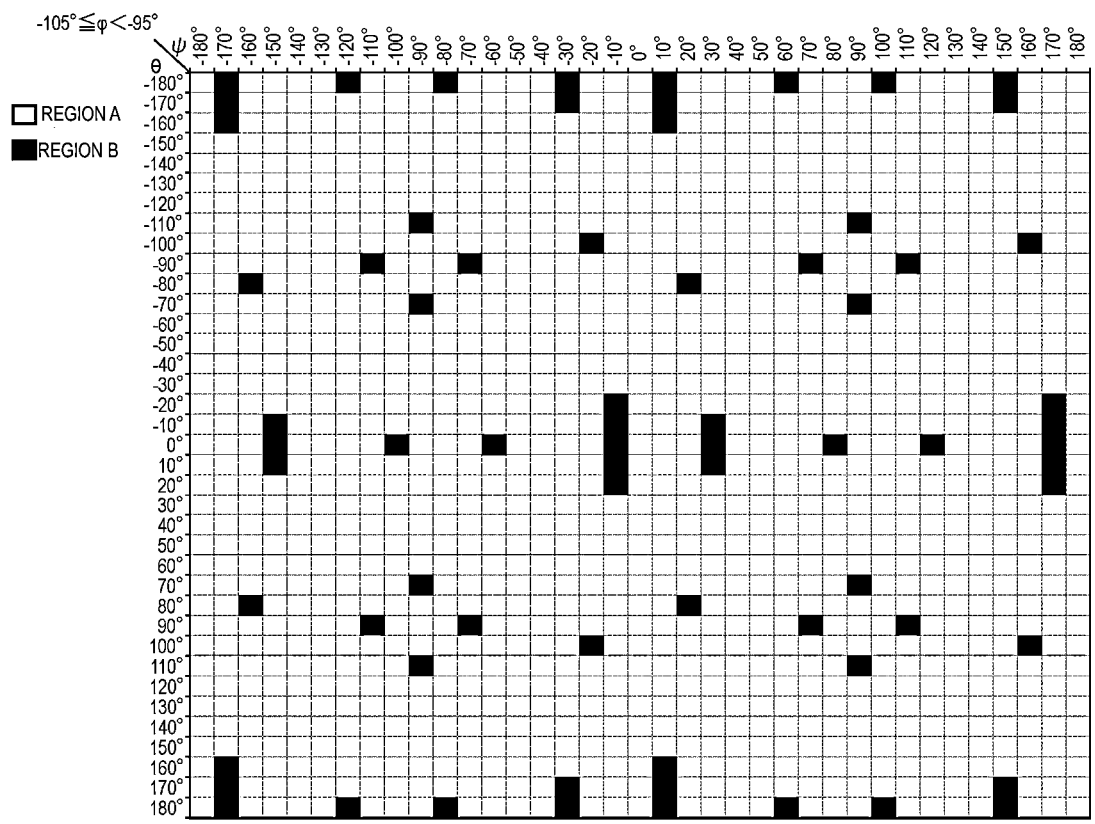
FIG. 13 is a chart illustrating ranges of $\theta$ and $\psi$ in which the acoustic velocity of the transversal wave in the monocrystalline spinel substrate is other than 5484 m/s when $\phi$ of the Euler angles ($\phi$, $\theta$, $\psi$) of the magnesium aluminate single crystal is −105° or more and less than −95°.
Figure 14:
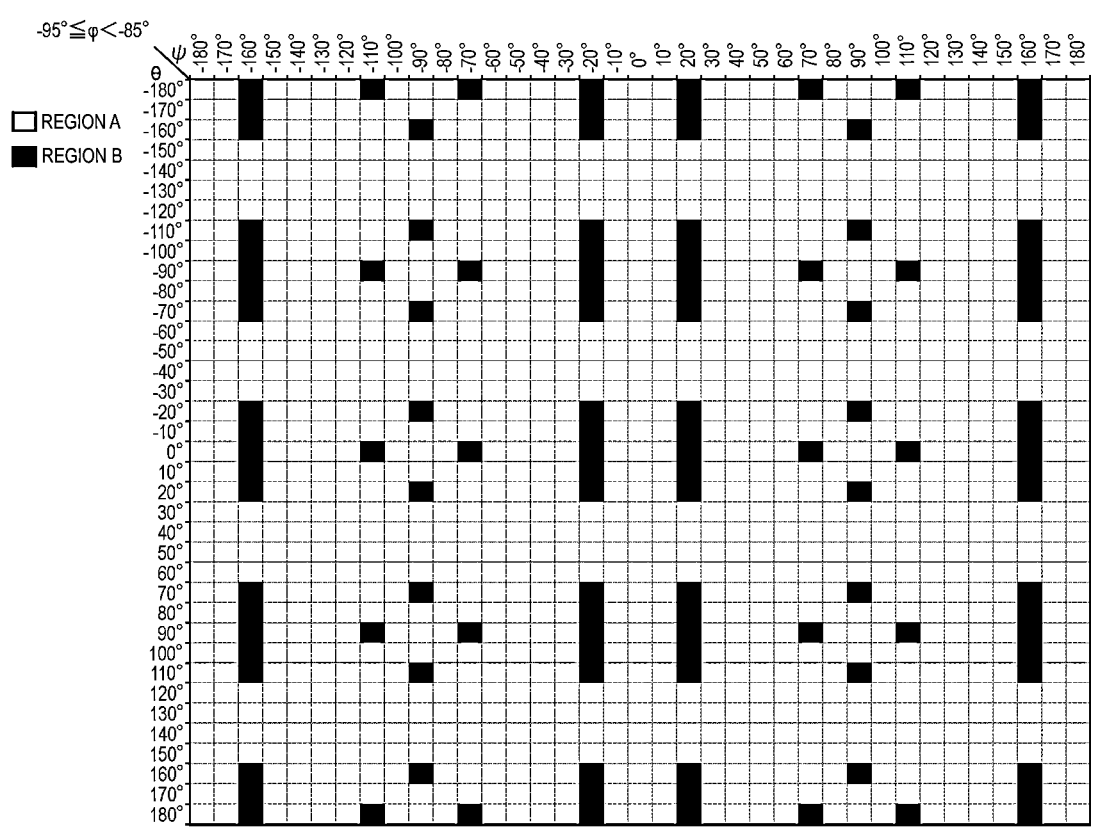
FIG. 14 is a chart illustrating ranges of $\theta$ and $\psi$ in which the acoustic velocity of the transversal wave in the monocrystalline spinel substrate is other than 5484 m/s when $\phi$ of the Euler angles ($\phi$, $\theta$, $\psi$) of the magnesium aluminate single crystal is −95° or more and less than −85°.
Figure 15:
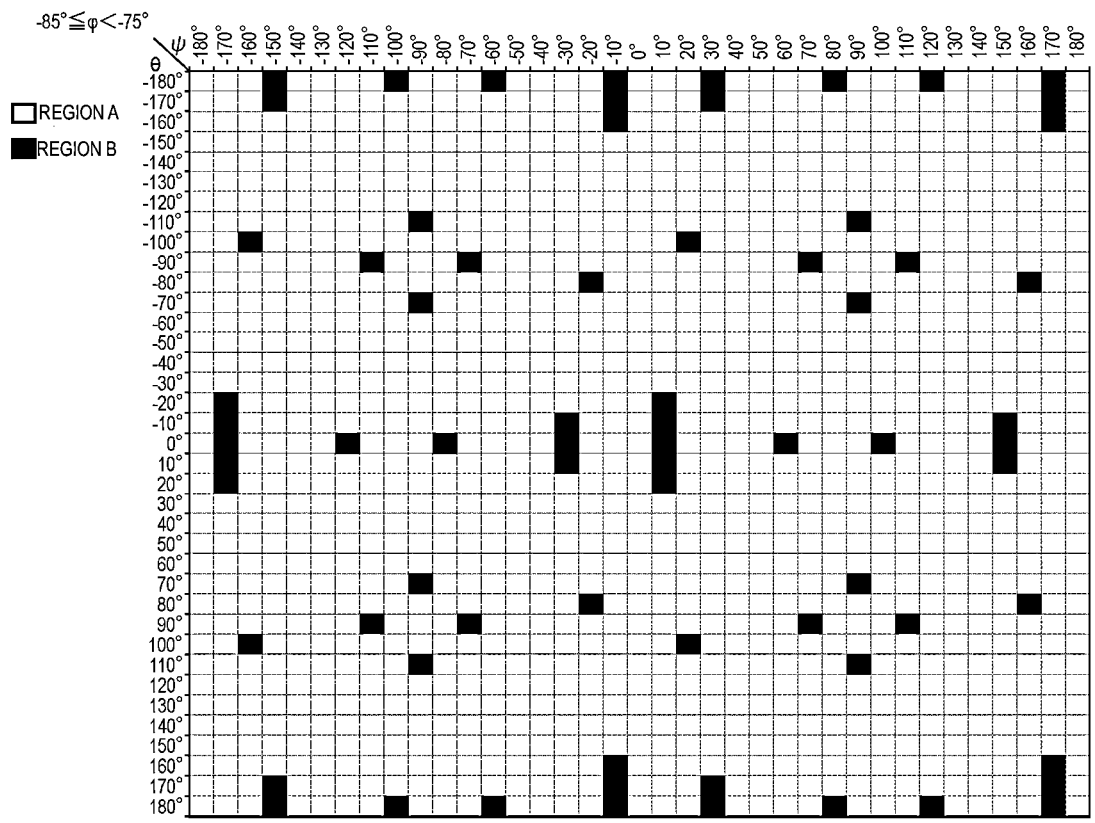
FIG. 15 is a chart illustrating ranges of $\theta$ and $\psi$ in which the acoustic velocity of the transversal wave in the monocrystalline spinel substrate is other than 5484 m/s when $\phi$ of the Euler angles ($\phi$, $\theta$, $\psi$) of the magnesium aluminate single crystal is −85° or more and less than −75°.
Figure 16:
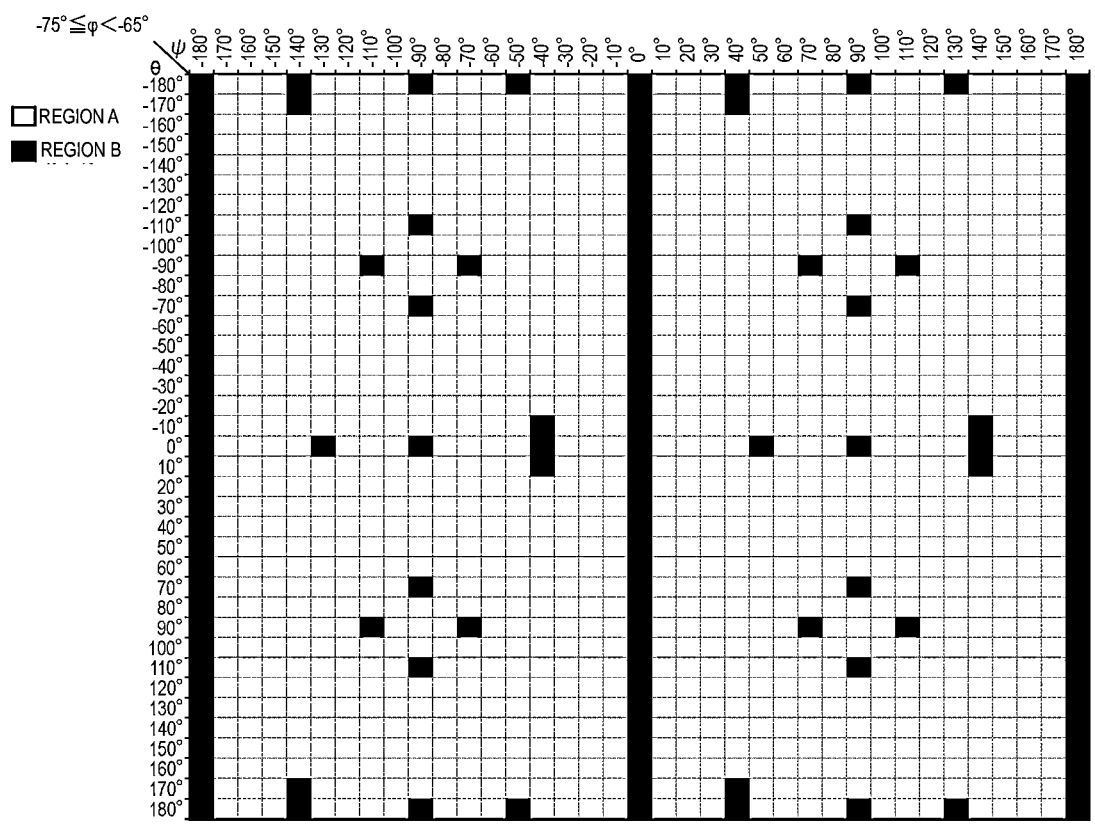
FIG. 16 is a chart illustrating ranges of $\theta$ and $\psi$ in which the acoustic velocity of the transversal wave in the monocrystalline spinel substrate is other than 5484 m/s when $\phi$ of the Euler angles ($\phi$, $\theta$, $\psi$) of the magnesium aluminate single crystal is −75° or more and less than −65°.
Figure 17:
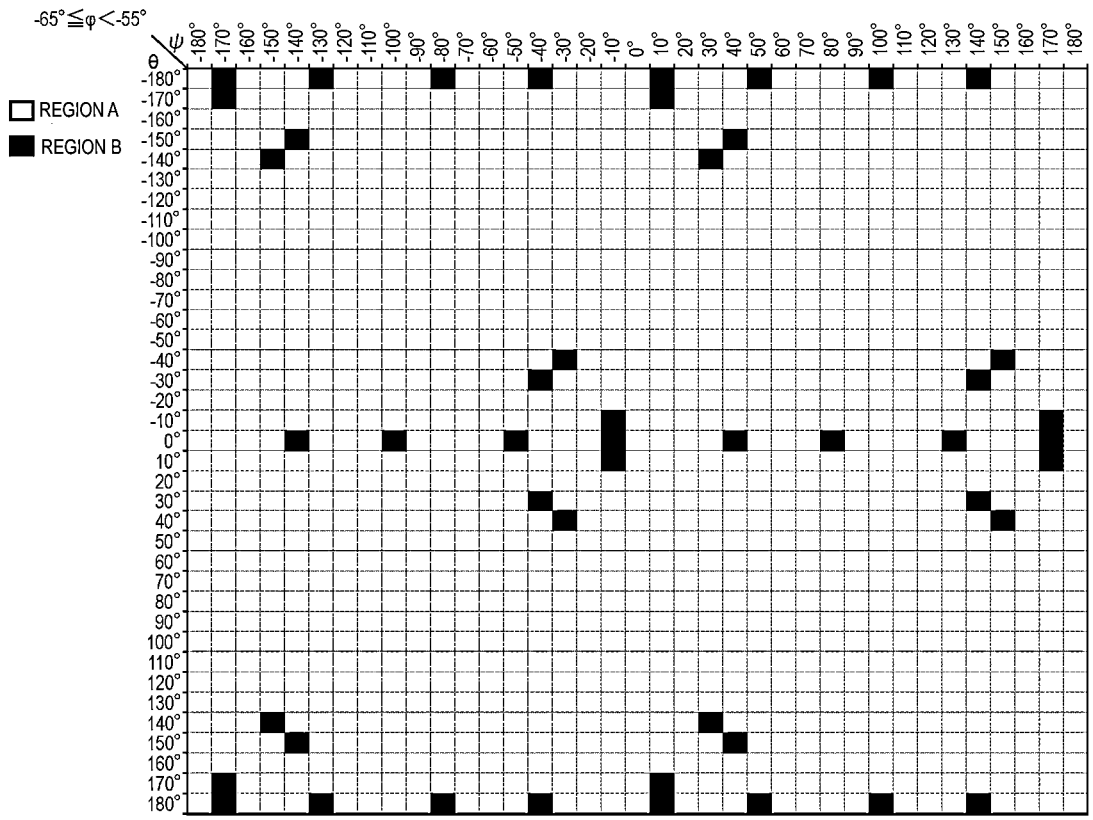
FIG. 17 is a chart illustrating ranges of $\theta$ and $\psi$ in which the acoustic velocity of the transversal wave in the monocrystalline spinel substrate is other than 5484 m/s when $\phi$ of the Euler angles (φ, θ, ψ) of the magnesium aluminate single crystal is −65° or more and less than −55°.
Figure 18:
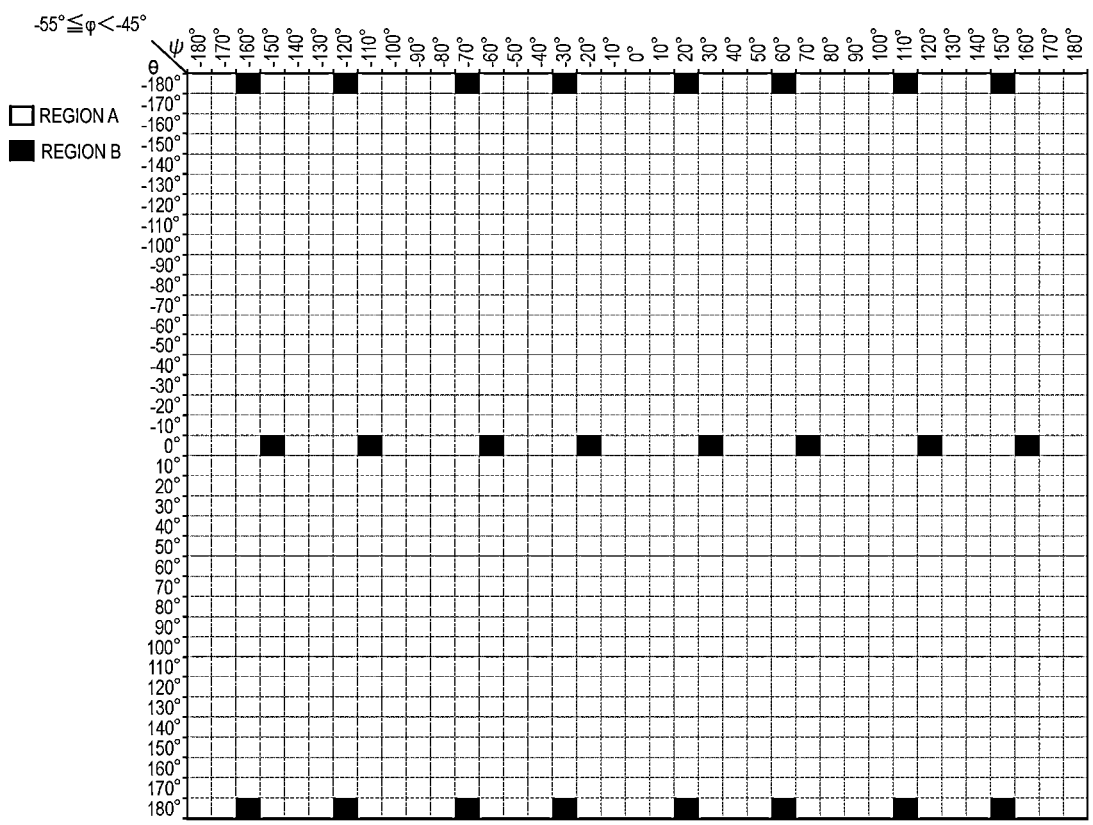
FIG. 18 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is −55° or more and less than −45°.
Figure 19:
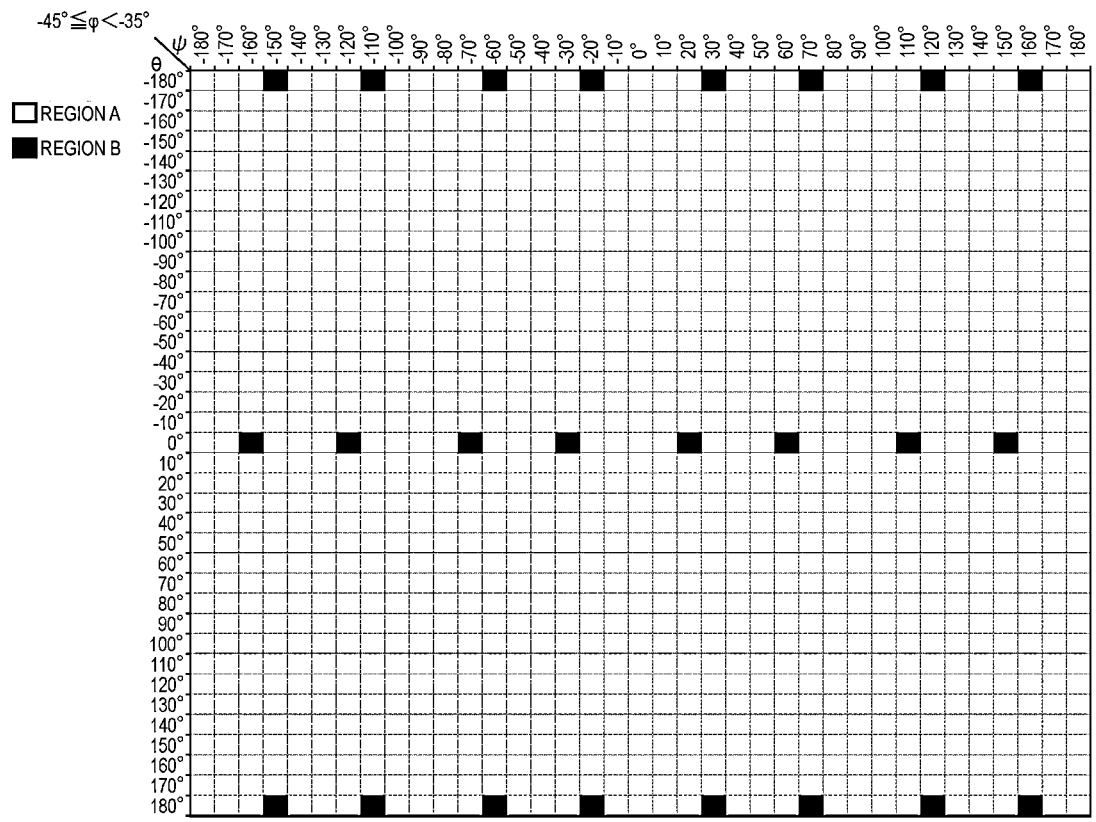
FIG. 19 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is −45° or more and less than −35°.
Figure 20:
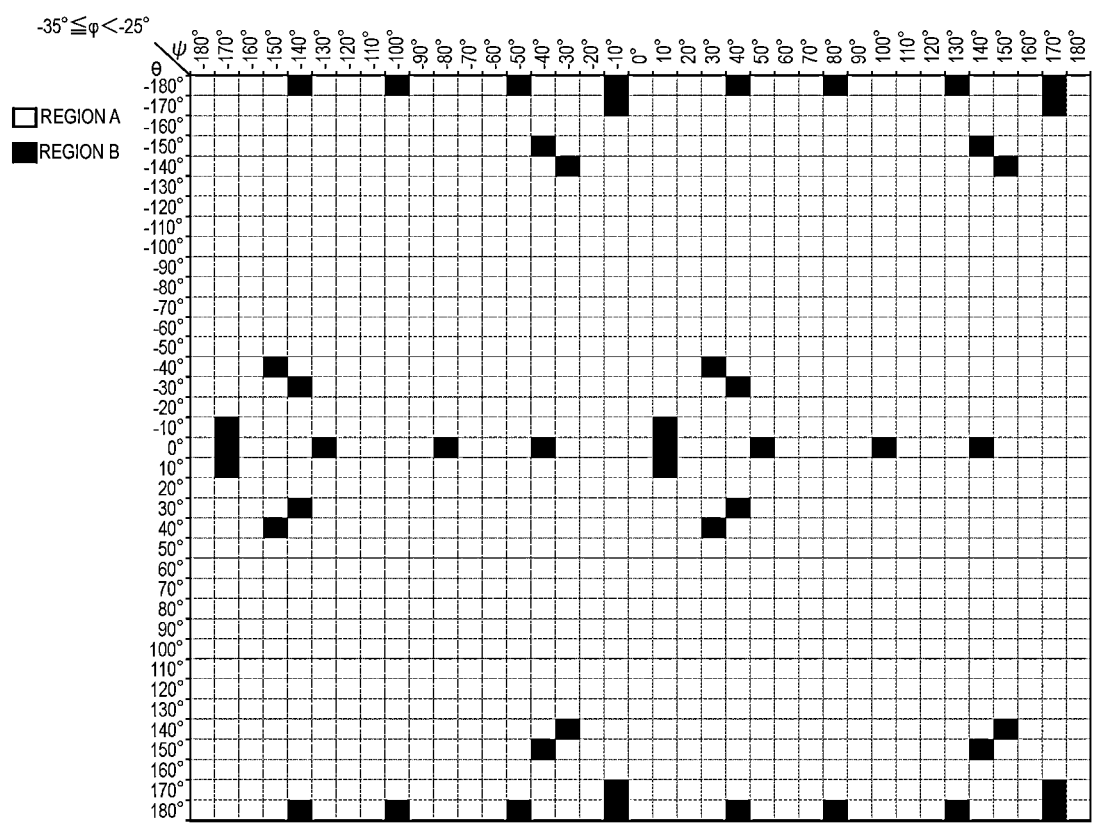
FIG. 20 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is −35° or more and less than −25°.
Figure 21:
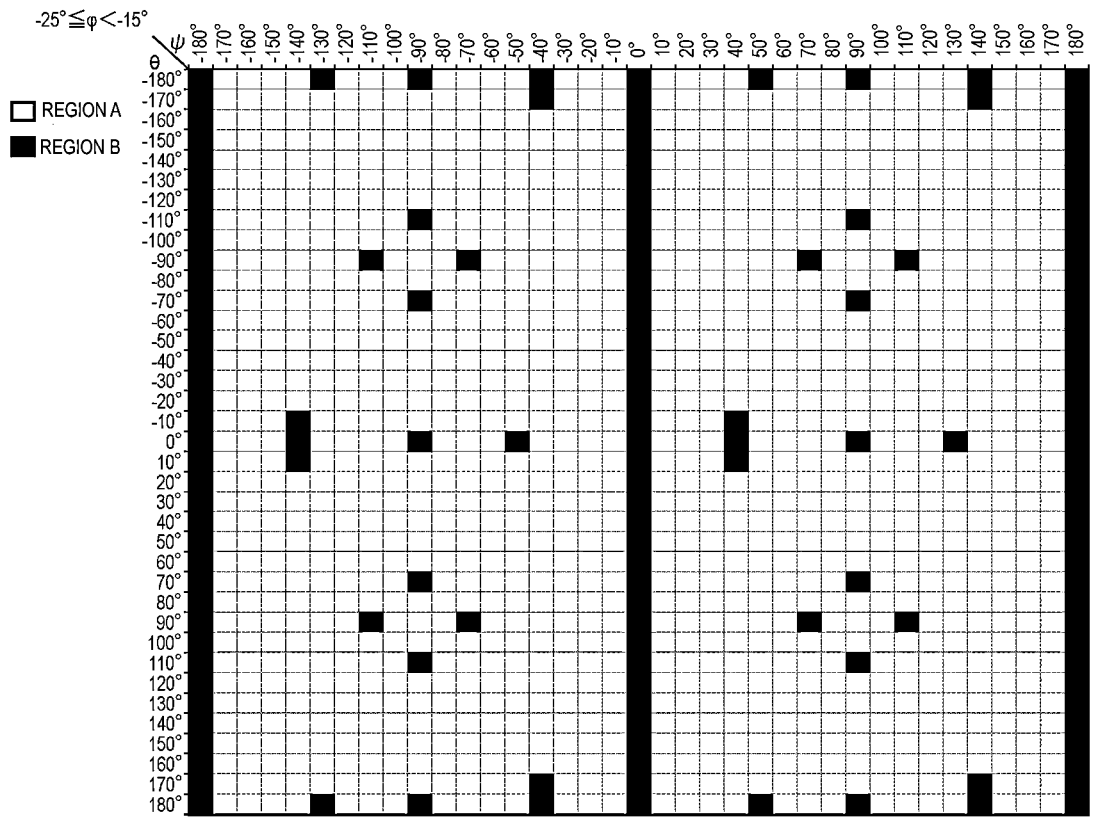
FIG. 21 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is −25° or more and less than −15°.
Figure 22:
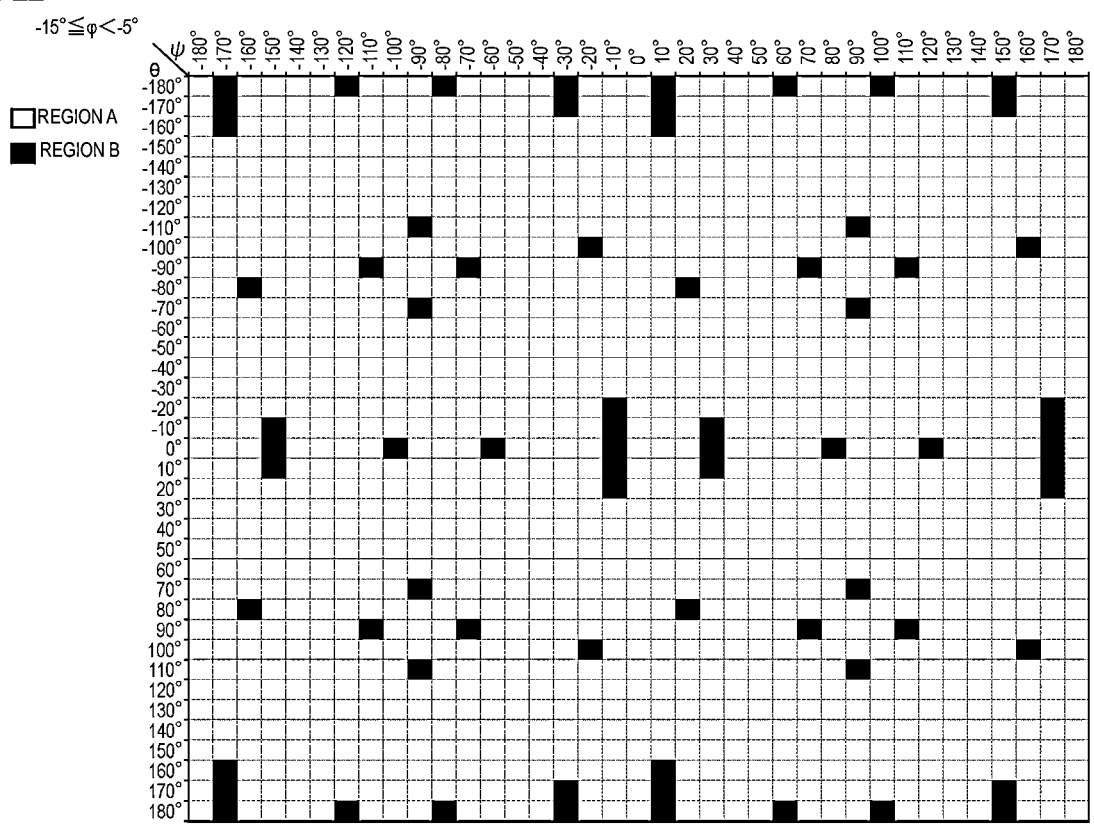
FIG. 22 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is −15° or more and less than −5°.
Figure 23:
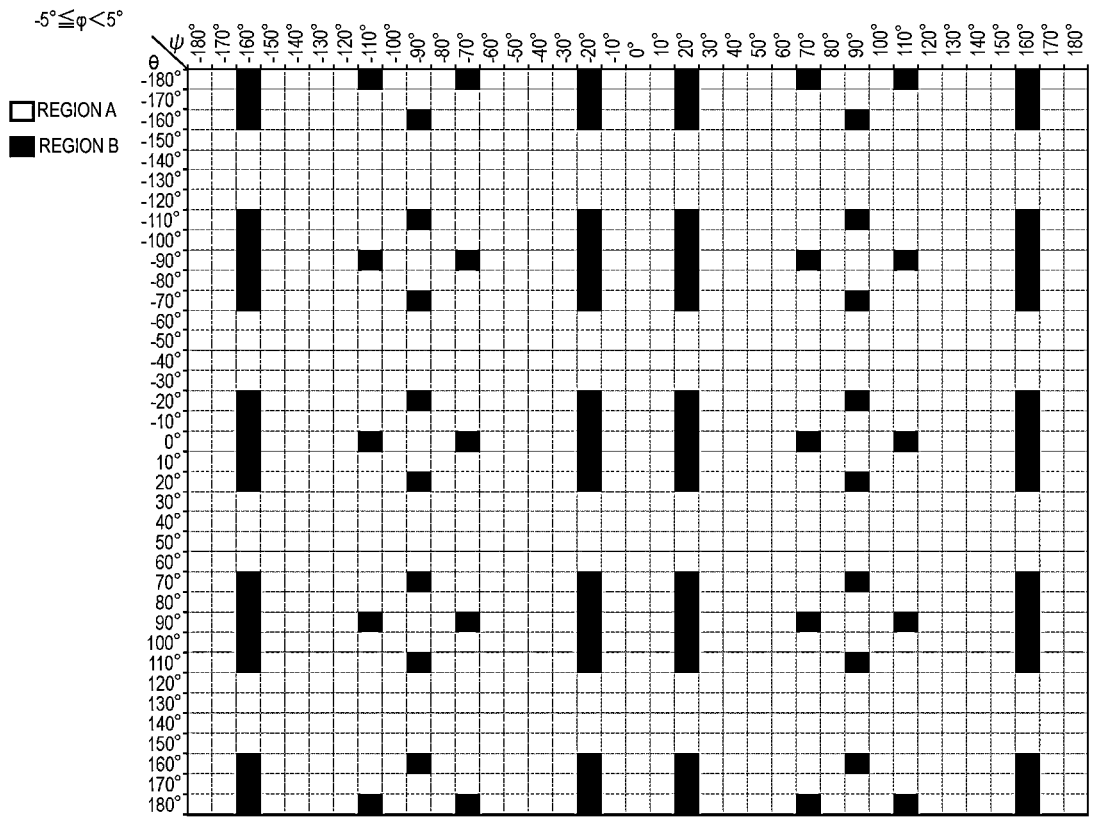
FIG. 23 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is −5° or more and less than 5°.
Figure 24:
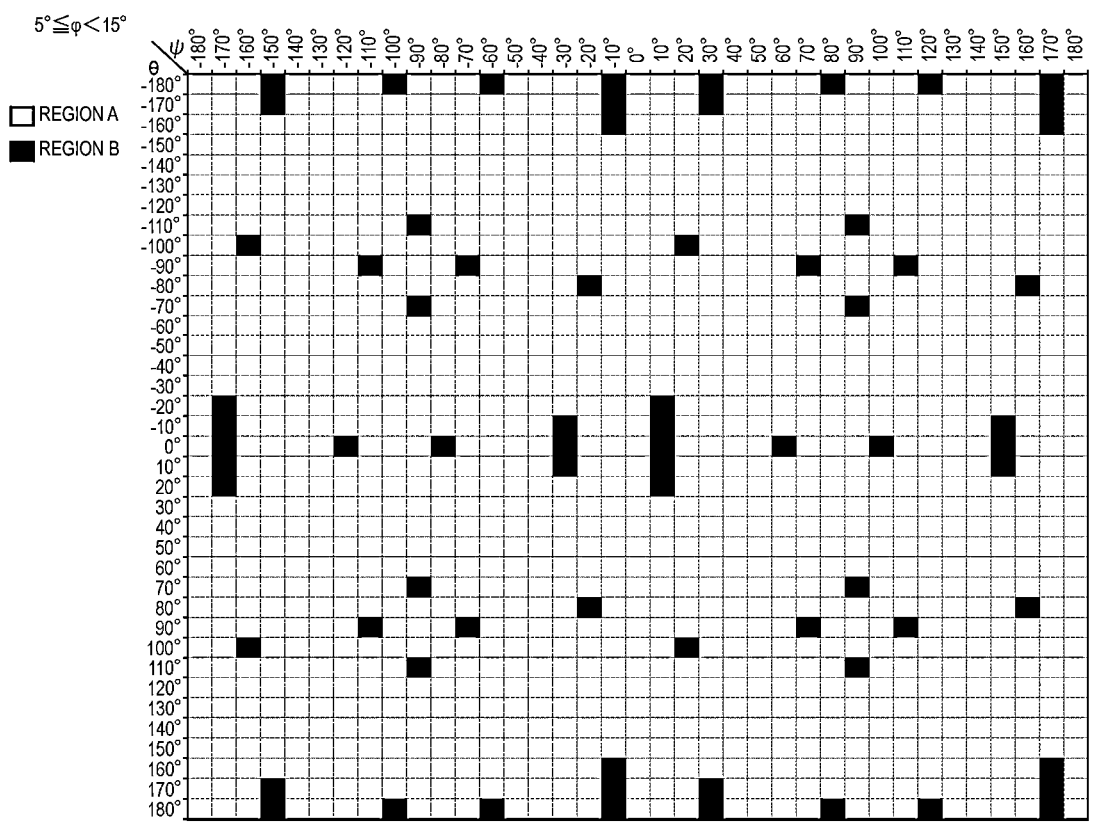
FIG. 24 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 5° or more and less than 15°.
Figure 25:
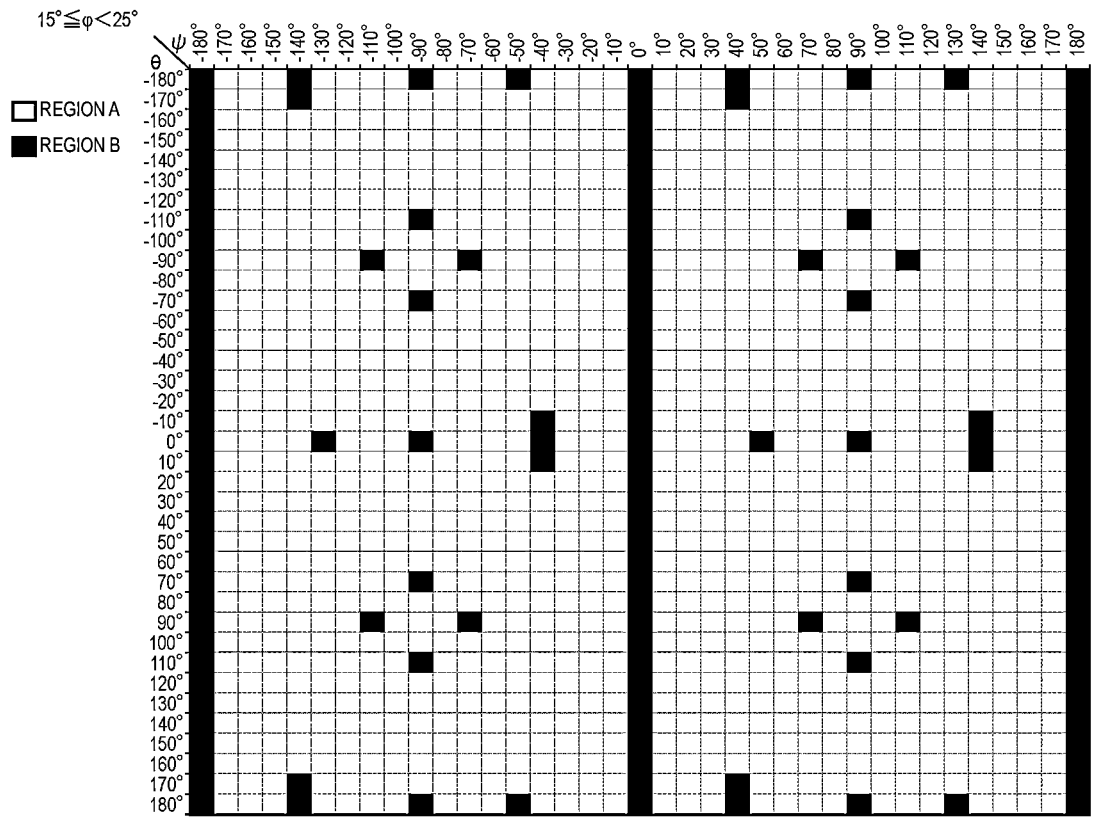
FIG. 25 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 15° or more and less than 25°.
Figure 26:
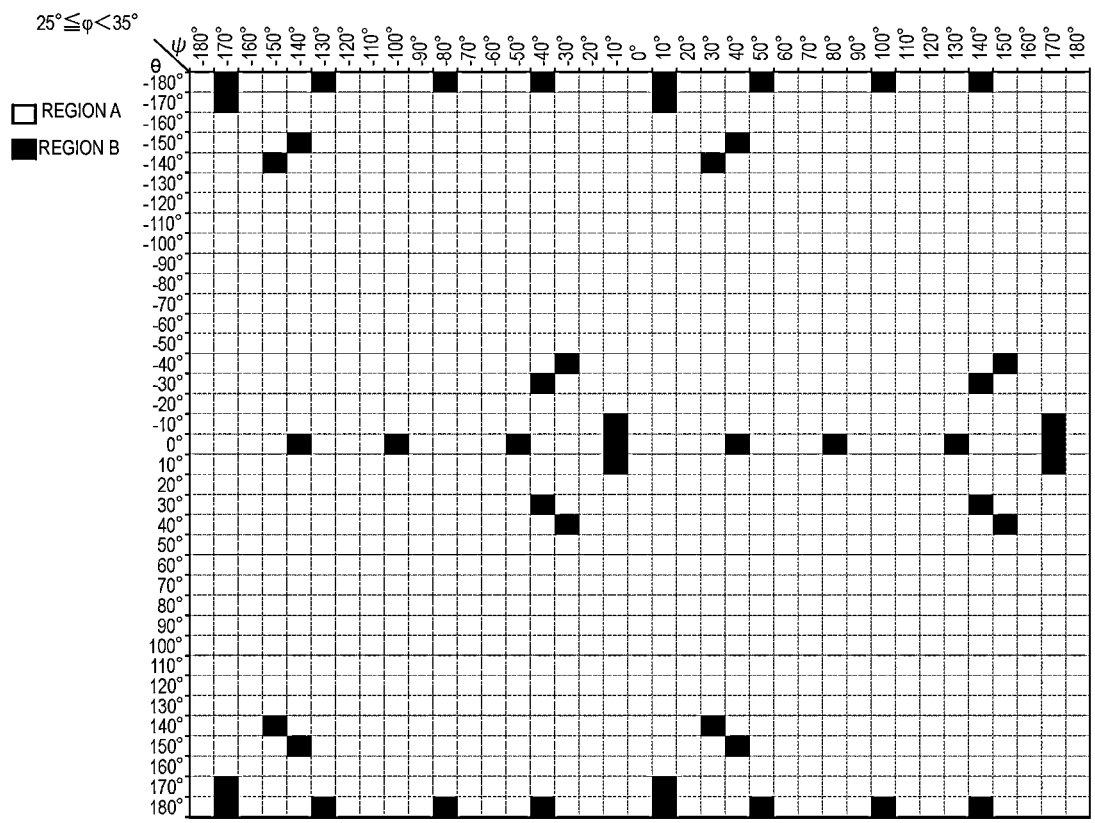
FIG. 26 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 25° or more and less than 35°.
Figure 27:
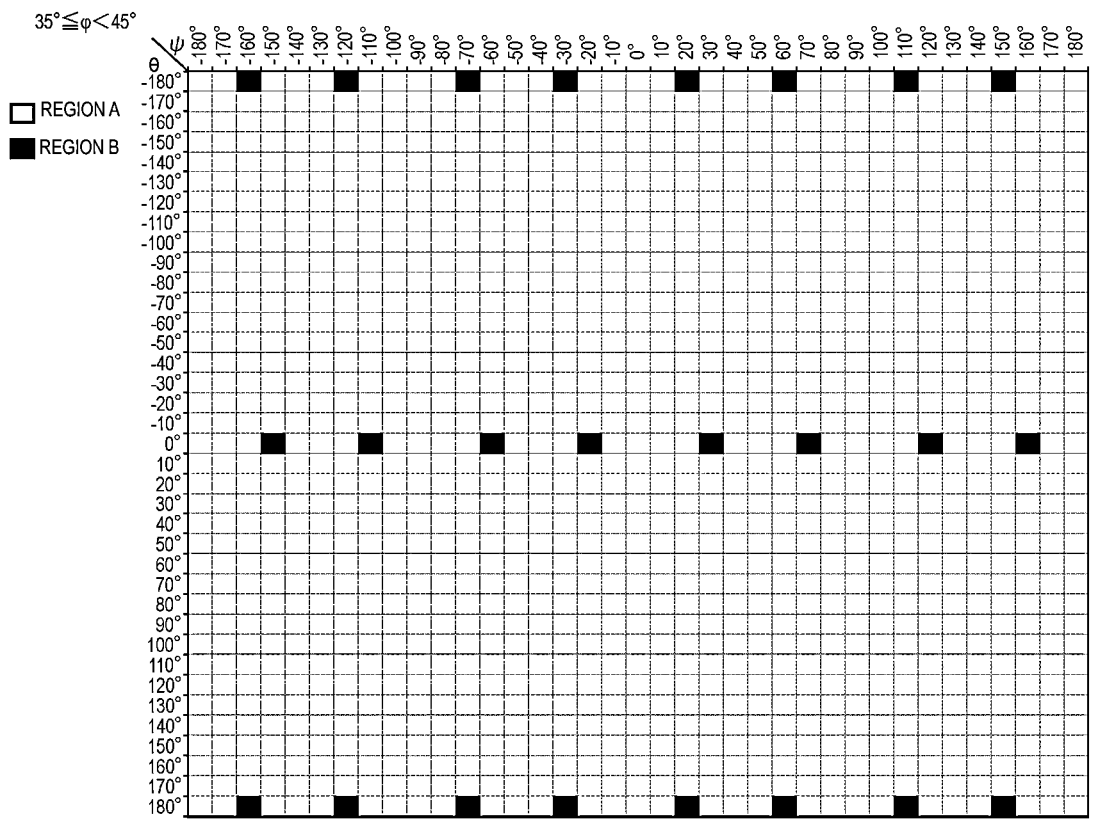
FIG. 27 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 35° or more and less than 45.
Figure 28:
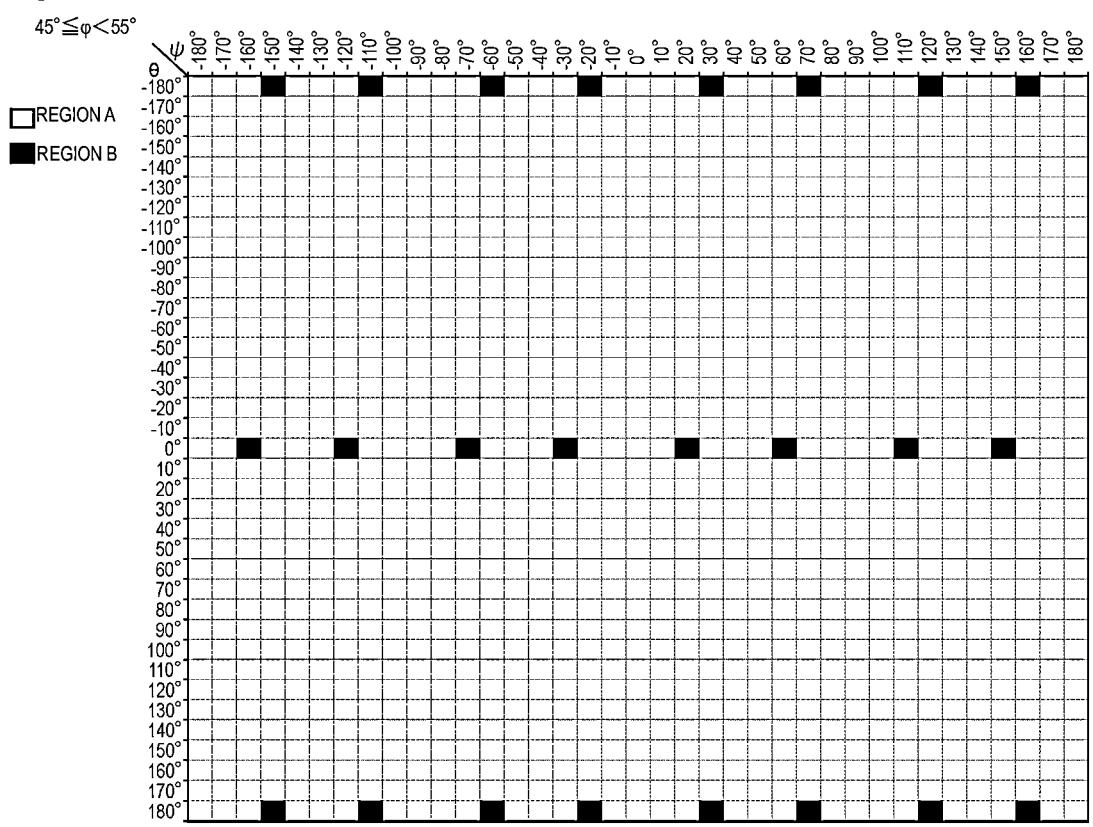
FIG. 28 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 45° or more and less than 55°.
Figure 29:
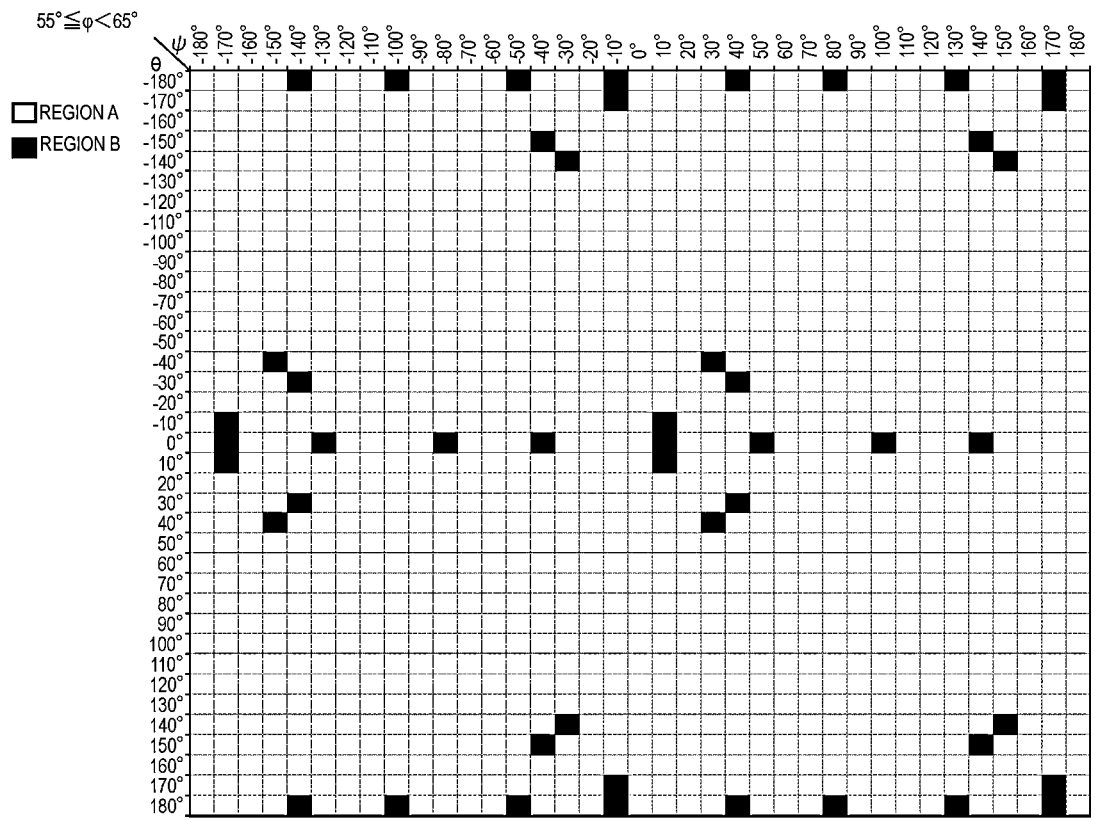
FIG. 29 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 55° or more and less than 65°.
Figure 30:
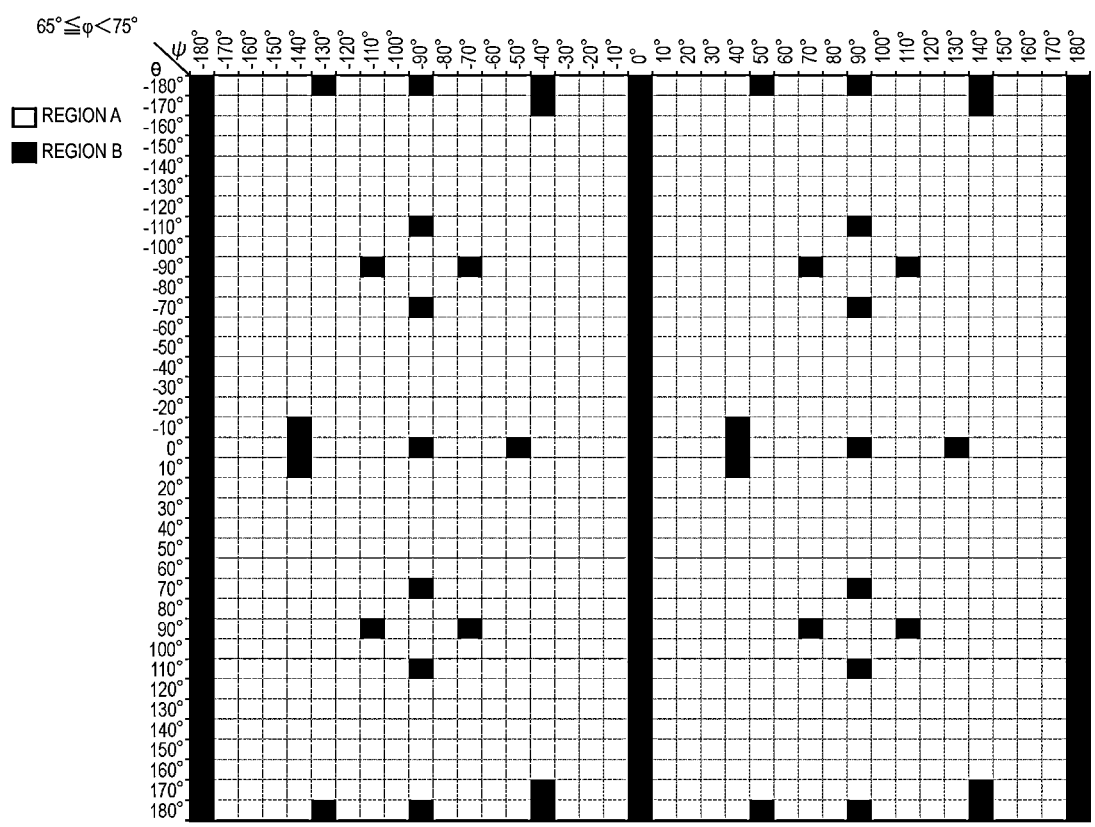
FIG. 30 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 65° or more and less than 75°.
Figure 31:
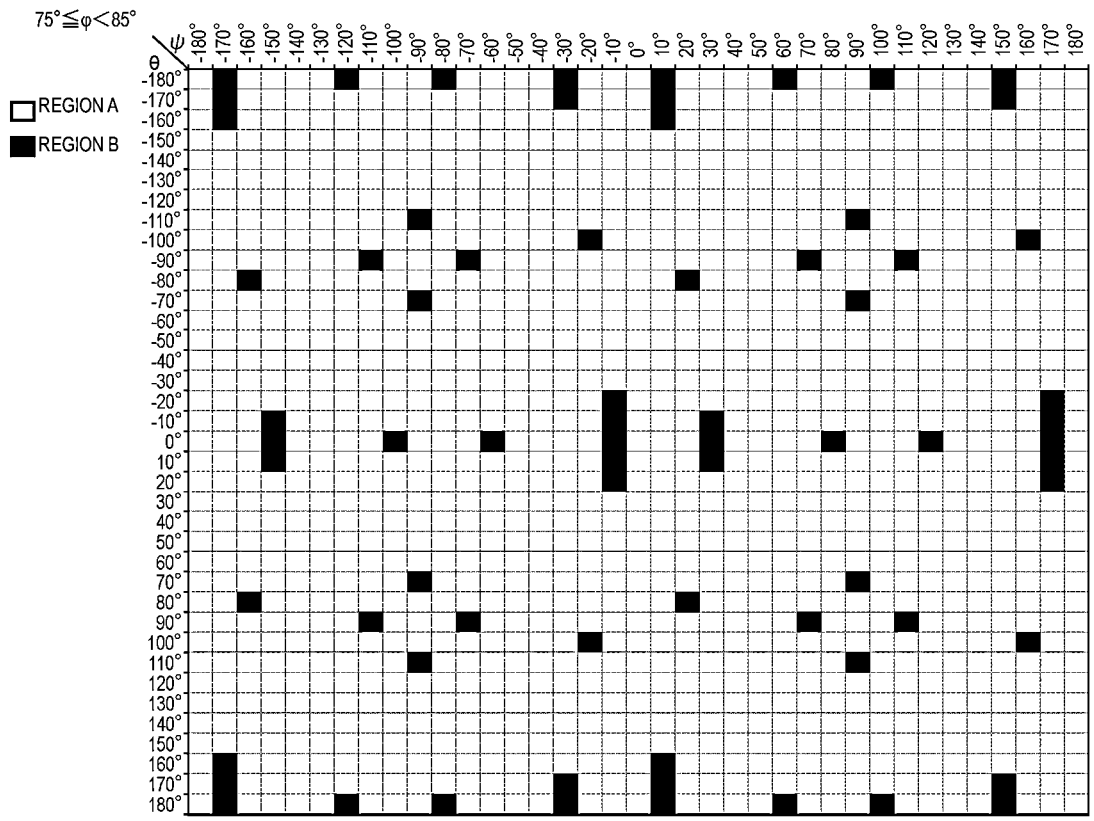
FIG. 31 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 75° or more and less than 85°.
Figure 32:
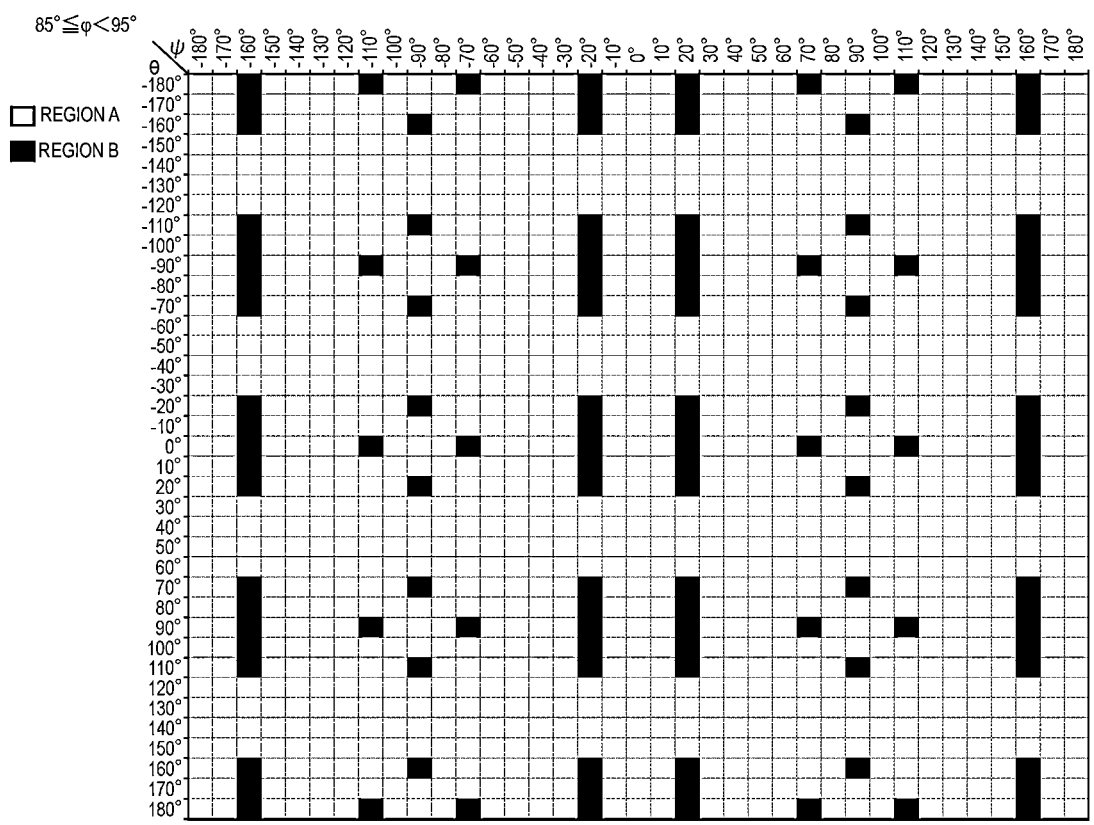
FIG. 32 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 85° or more and less than 95°.
Figure 33:
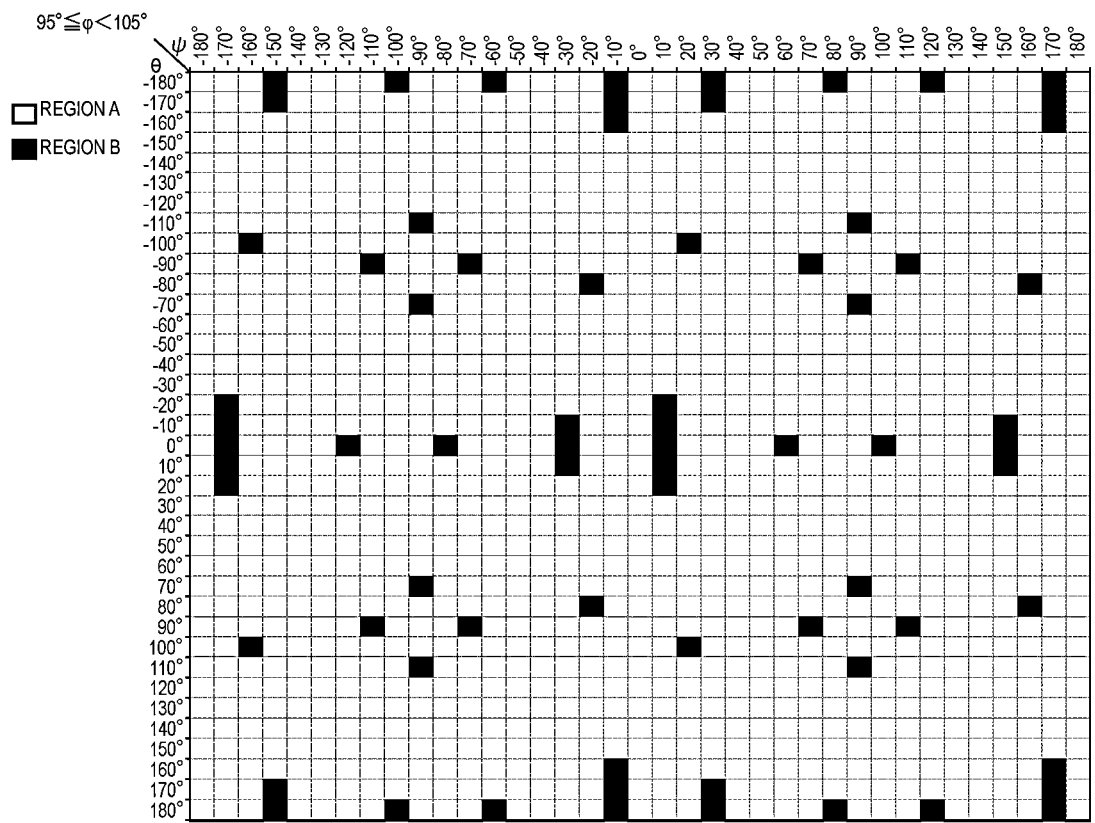
FIG. 33 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 95° or more and less than 105°.
Figure 34:
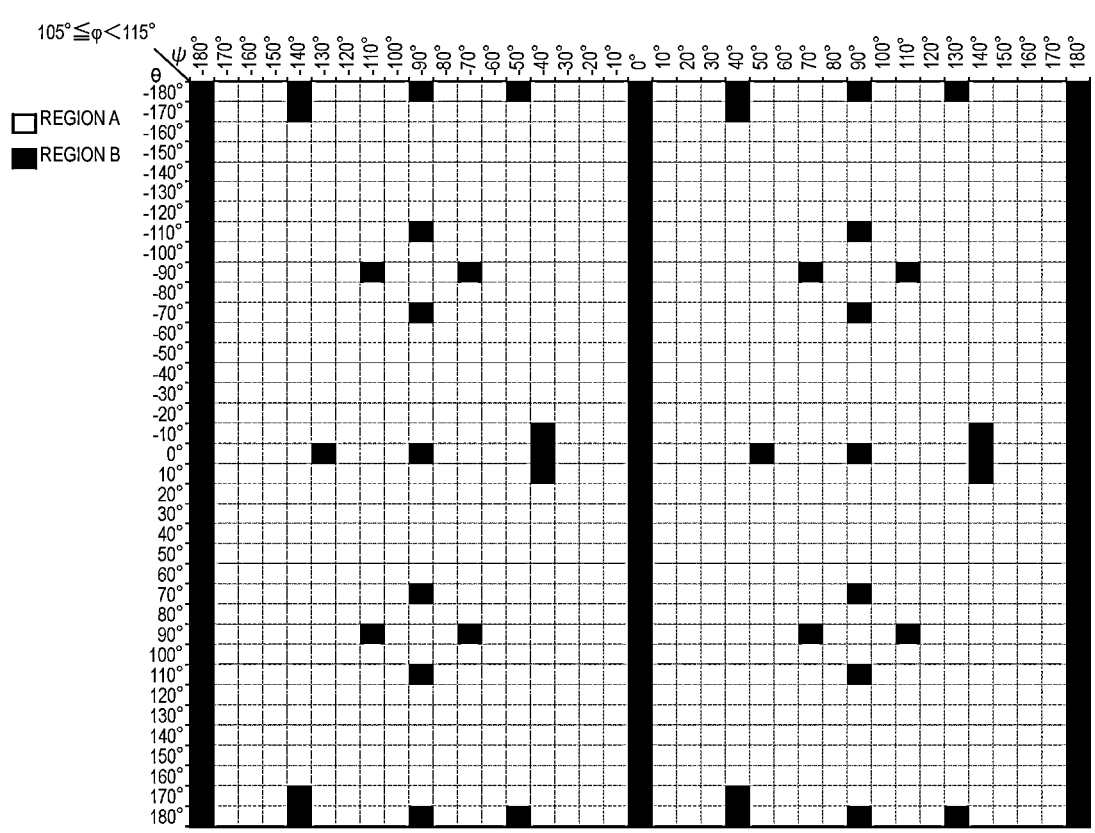
FIG. 34 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 105° or more and less than 115°.
Figure 35:
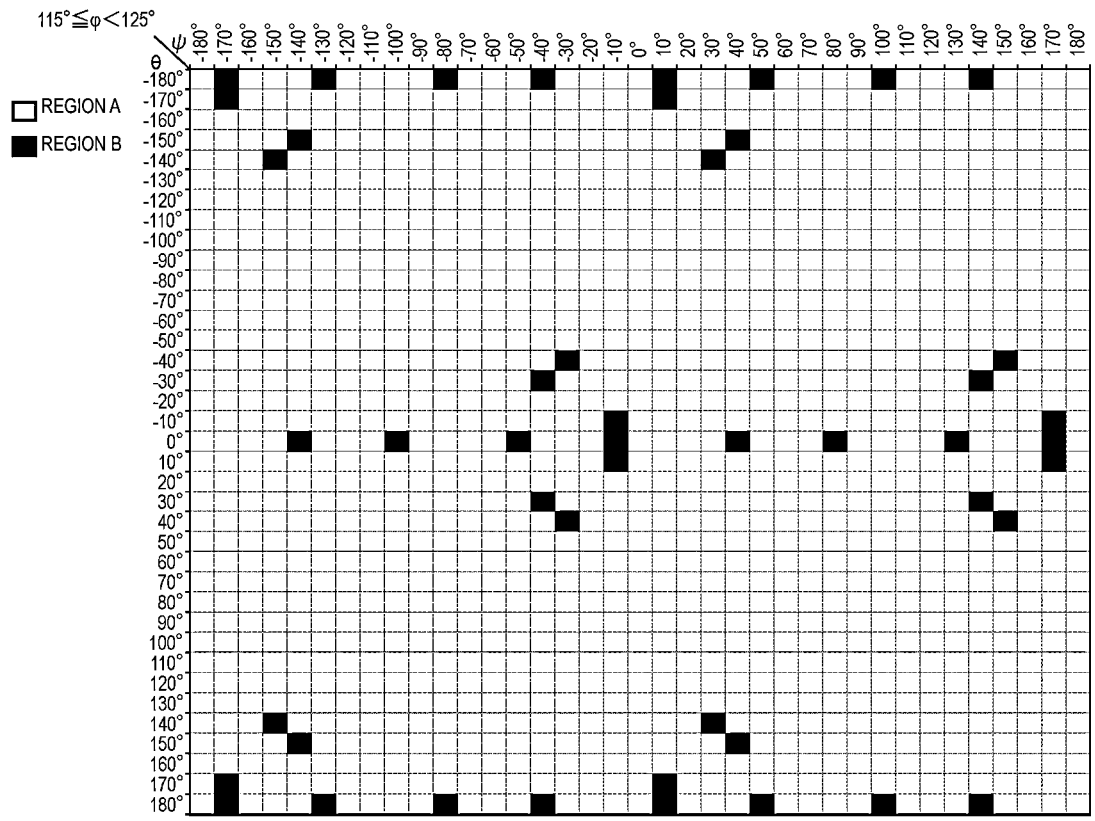
FIG. 35 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 115° or more and less than 125°.
Figure 36:
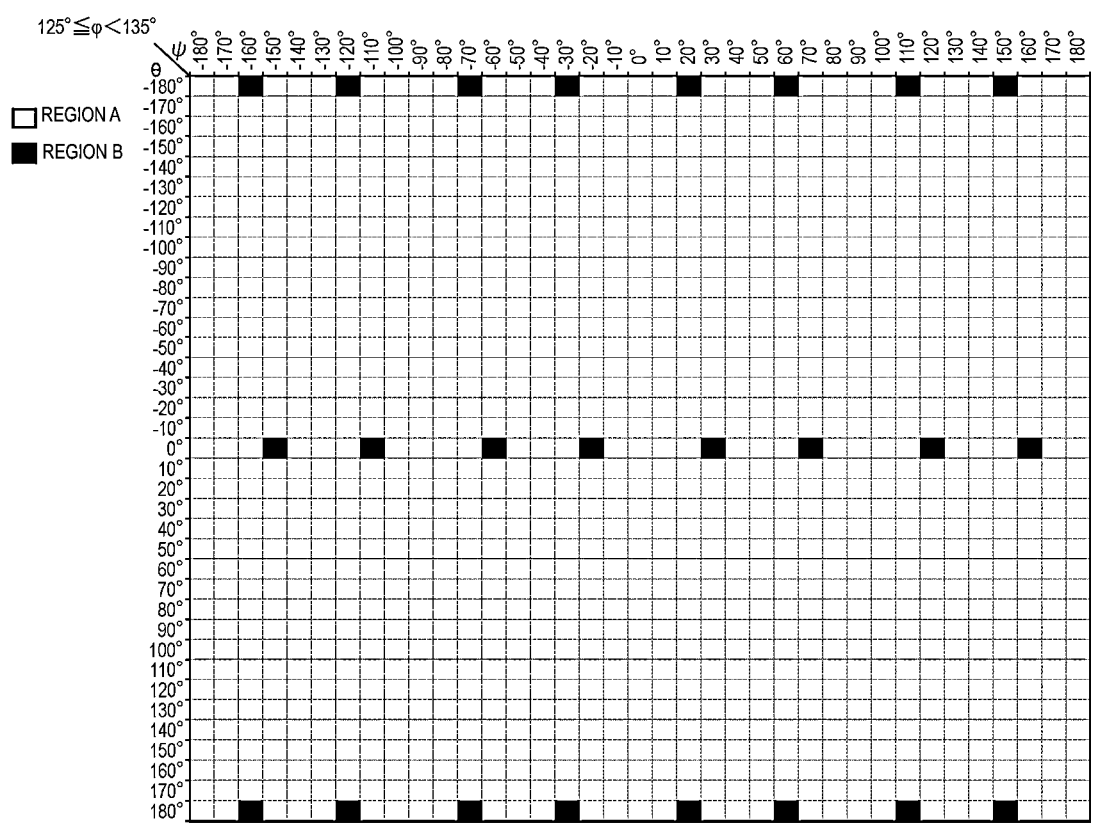
FIG. 36 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 125° or more and less than 135°.
Figure 37:
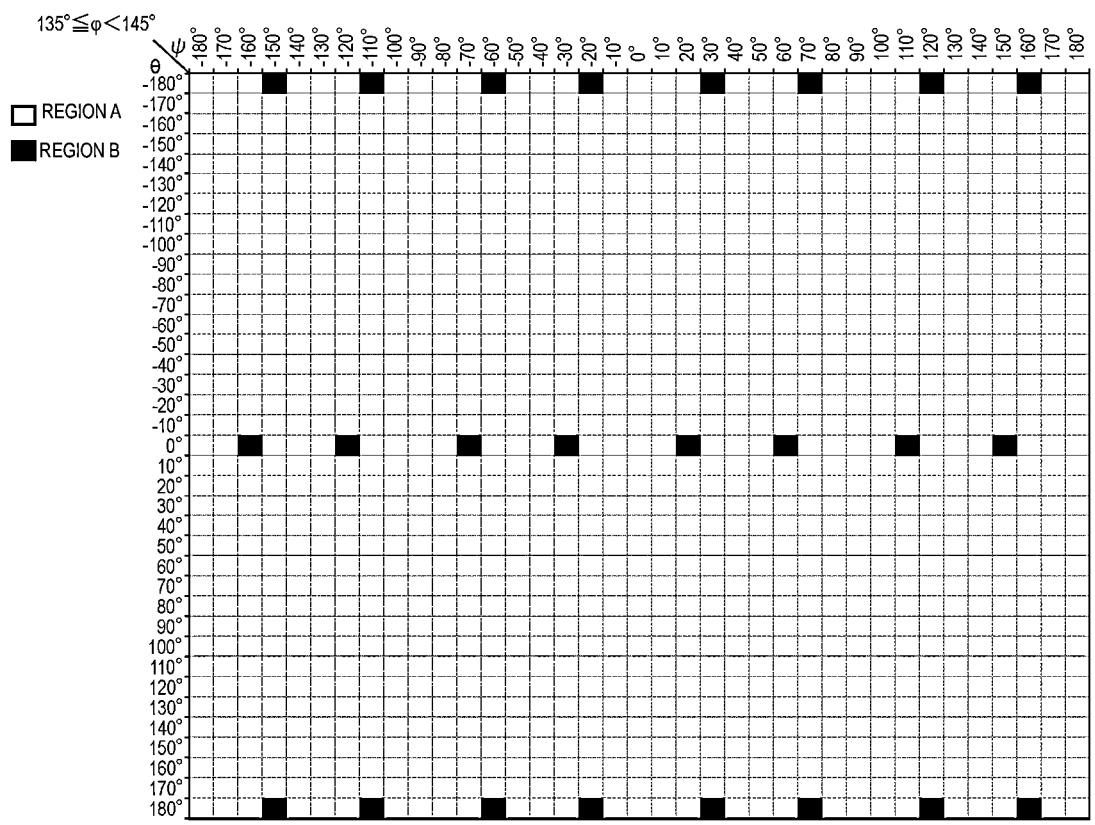
FIG. 37 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 135° or more and less than 145°.
Figure 38:
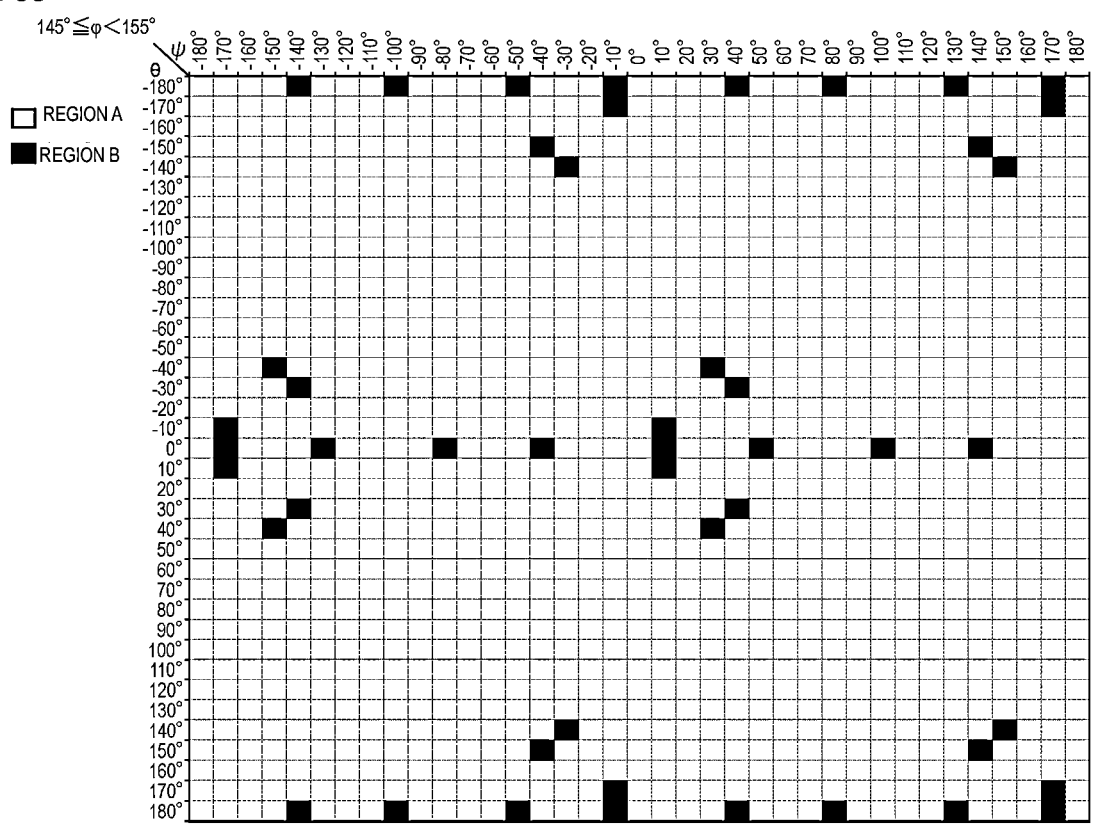
FIG. 38 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 145° or more and less than 155°.
Figure 39:
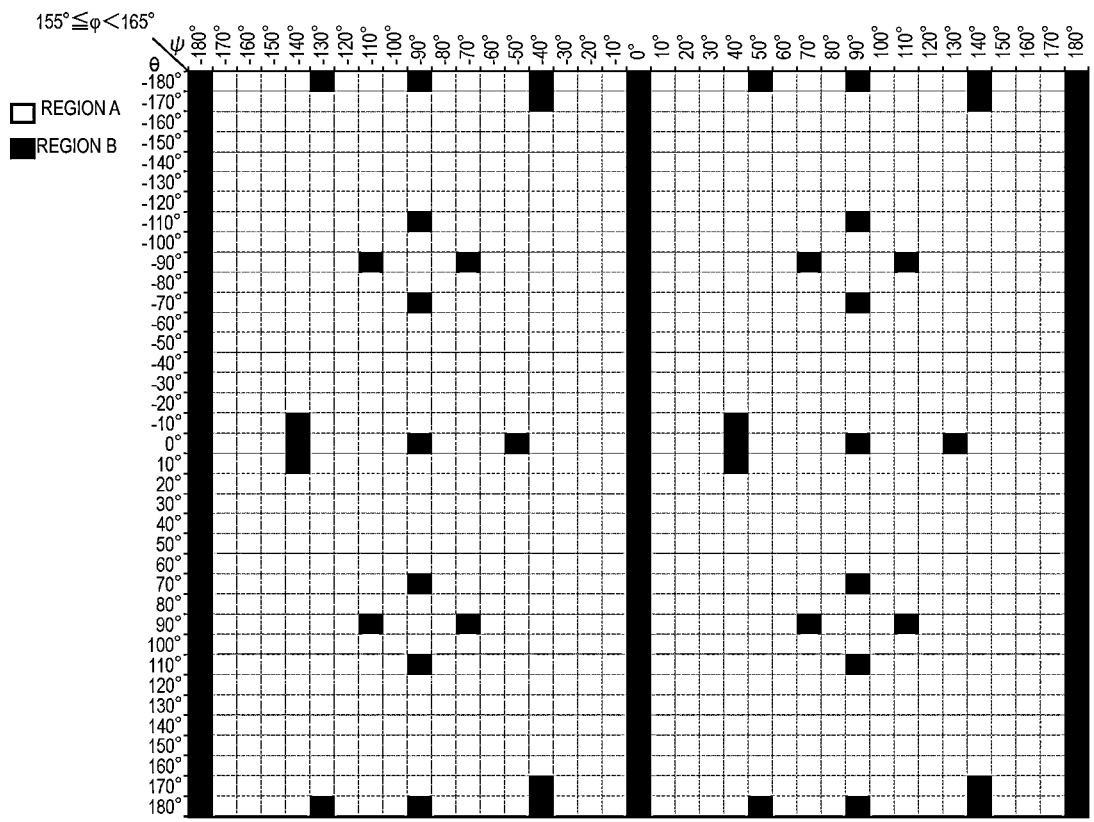
FIG. 39 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 155° or more and less than 165°.
Figure 40:
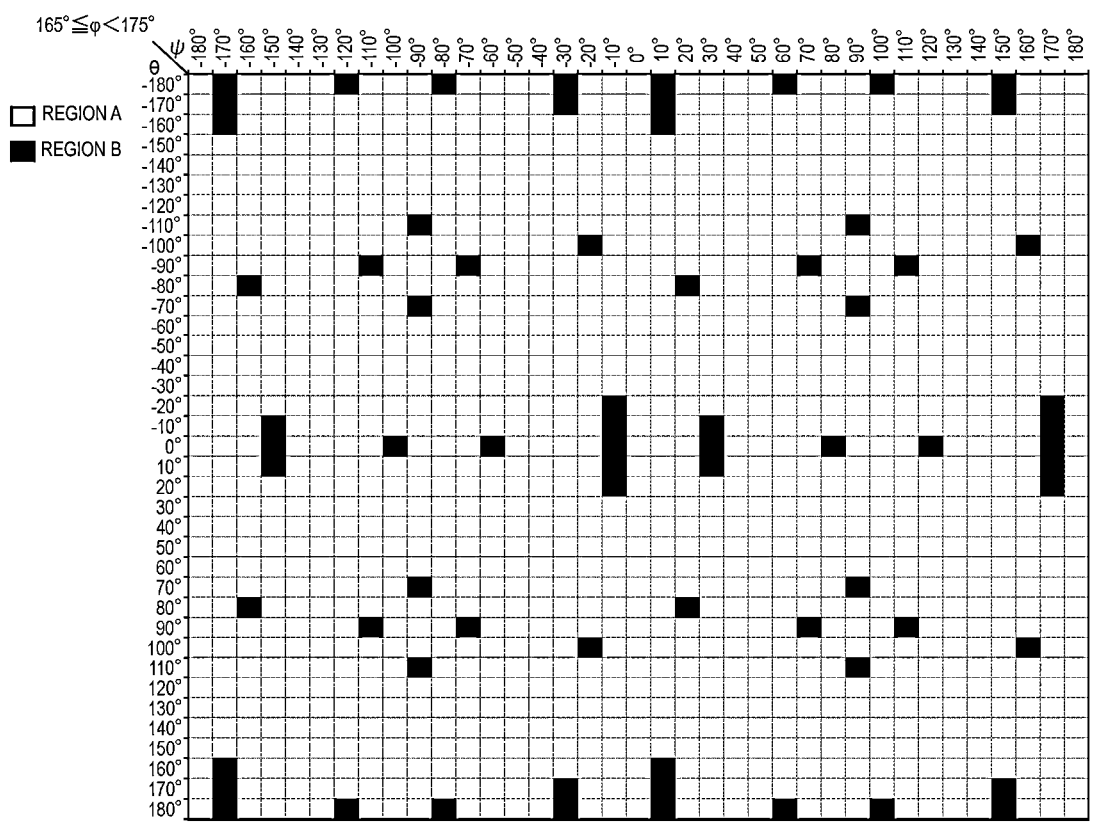
FIG. 40 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 165° or more and less than 175°.

A region A and multiple regions B are illustrated in FIG. 5. The region A is a white region in FIG. 5. The regions B are black regions in FIG. 5. The above points are similarly applied to FIGS. 6 to 41 as well. When $\theta$ and $\psi$ of the Euler angles ($\phi$, $\theta$, $\psi$) are angles within the range of the region A, the acoustic velocity of the transversal wave in the monocrystalline spinel substrate 3 is higher or lower than 5484 m/s. On the other hand, when $\theta$ and $\psi$ are angles within a range of any of the regions B, the acoustic velocity of the transversal wave in the monocrystalline spinel substrate 3 is 5484 m/s. In this preferred embodiment, when $\phi$ is −180° or more and less than −175°, $\theta$ and $\psi$ are to be given as the angles within the range of the region A in FIG. 5.

Figure 41:
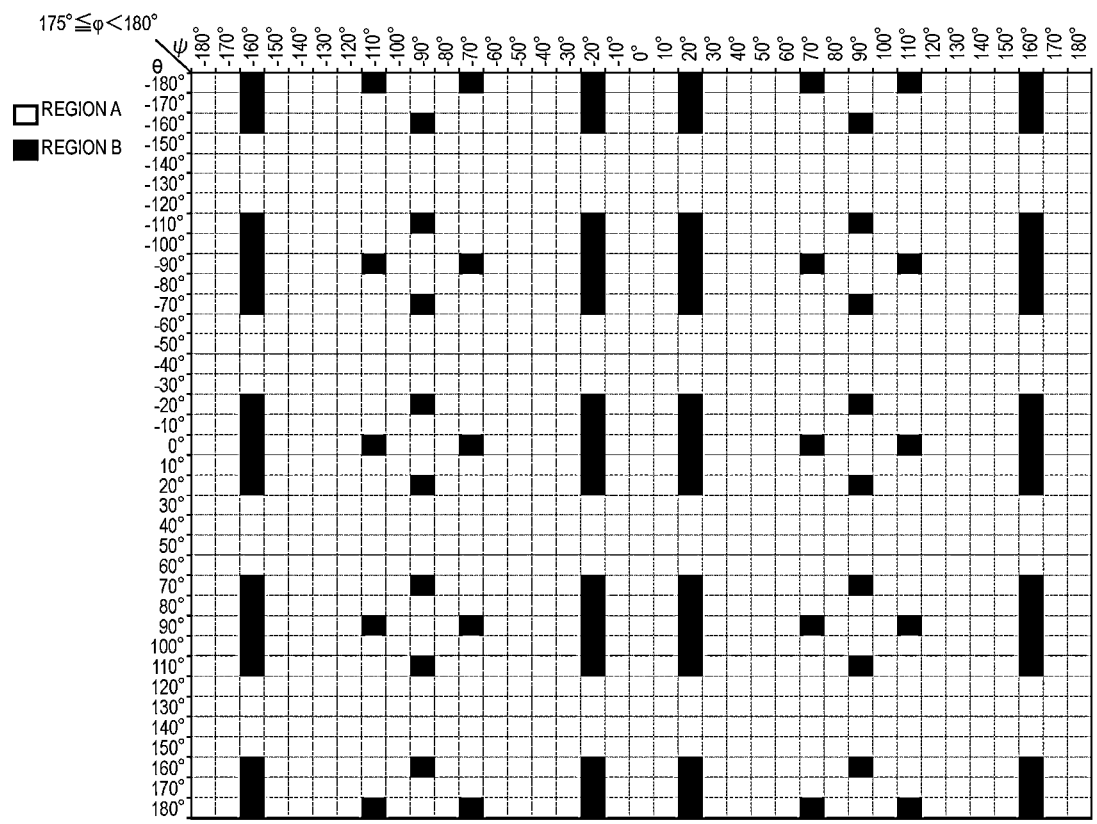
FIG. 41 is a chart illustrating ranges of θ and ψ in which the acoustic velocity of the transversal wave in the monocrystalline spinel substrate is other than 5484 m/s when φ of the Euler angles (φ, θ, ψ) of the magnesium aluminate single crystal is 175° or more and less than 180°.

In FIGS. 6 to 40, the range of $\phi$ is divided in units of 10°, and the region A and the regions B are illustrated for each range of $\phi$. More specifically, in FIGS. 6 to 40, the range of $\phi$ is denoted by a range of −175° or more and less than 175° in units of 10°. Moreover, FIG. 41 illustrates the region A and the regions B when $\phi$ is 175° or more and less than 180°. It can also be said that the region A in each of FIGS. 5 to 41 indicates not only the ranges of $\theta$ and $\psi$, but also the range of $\phi$). For example, when $\phi$ is the angle within the range of the region A in FIG. 5 among FIGS. 5 to 41, $\phi$ is −180° or more and less than −175°.

FIGS. 5 to 41 will be described in more detail below. FIGS. 5 to 41 are each a chart representing, when $\theta$ and $\psi$ are each divided into ranges per 10°, a combination of the individual ranges in a matrix pattern. A representative value for each range of 0$\theta$ per 10° is denoted on a left side in FIGS. 5 to 41. In other words, the representative value is a center value in each range per 10°. A representative value for each range of $\psi$ per 10° is denoted on an upper side in the chart. Furthermore, in the chart, an area where the ranges of $\theta$ and $\psi$ per 10° intersect each other is denoted by a dot-line box. In each of the dot-line boxes, the range of $\theta$ spans from "(the representative value of $\theta$−5°) or more to (the representative value of $\theta$+5°) or less)", and the range of $\psi$ spans from "(the representative value of $\psi$−5°) or more to (the representative value of $\psi$+5°) or less)".

Thus, in each of FIGS. 5 to 41, for example, when a lower limit value of the region A or the region B is positioned at a boundary between the region A and the region B, this indicates that an angle in the region of interest is the lower limit value or more. On the other hand, when an upper limit value of the region A or the region B is positioned at the boundary between the region A and the region B, this indicates that an angle in the region of interest is less than the upper limit value.

In this disclosure, −180° is regarded as being equivalent to +180°. In other words, a range of −185° or more and −180° or less indicates the same range of +175° or more and +180° or less.

Design parameters of the acoustic wave device 1, used in deriving the region A and the regions B in each of FIGS. 5 to 41, are as follows. In the following, a wavelength specified by an electrode finger pitch of the IDT electrode 7 illustrated in FIG. 2 is denoted by $\lambda$. The electrode finger pitch indicates a distance between centers of the first electrode finger 18 and the second electrode finger 19 that are adjacent to each other in the direction orthogonal to the electrode finger extension direction. Assuming that the electrode finger pitch is denoted by p, $\lambda$=2p is held.

Monocrystalline spinel substrate 3; material . . . single crystal of $MgAlO_2$, thickness . . . 10 μm Piezoelectric layer 5; material . . . $LiTaO_3$, thickness . . . 1 μm IDT electrode 7; material . . . Al, thickness . . . 0.1 μm Wavelength $\lambda$; 2 μm Each of φ, θ, and ψ of the Euler angles (φ, θ, ψ) of the magnesium aluminate single crystal of the monocrystalline spinel substrate 3 was changed in units of 10° over a range of −180° or more and less than 180°. The acoustic velocity of the transversal wave propagating in the monocrystalline spinel substrate 3 was measured while each of φ, θ, and ψ was changed as described above. From that measurement, the region A and the regions B in each of FIGS. 5 to 41 were derived. An example of deriving those regions is described below.

Figure 42:
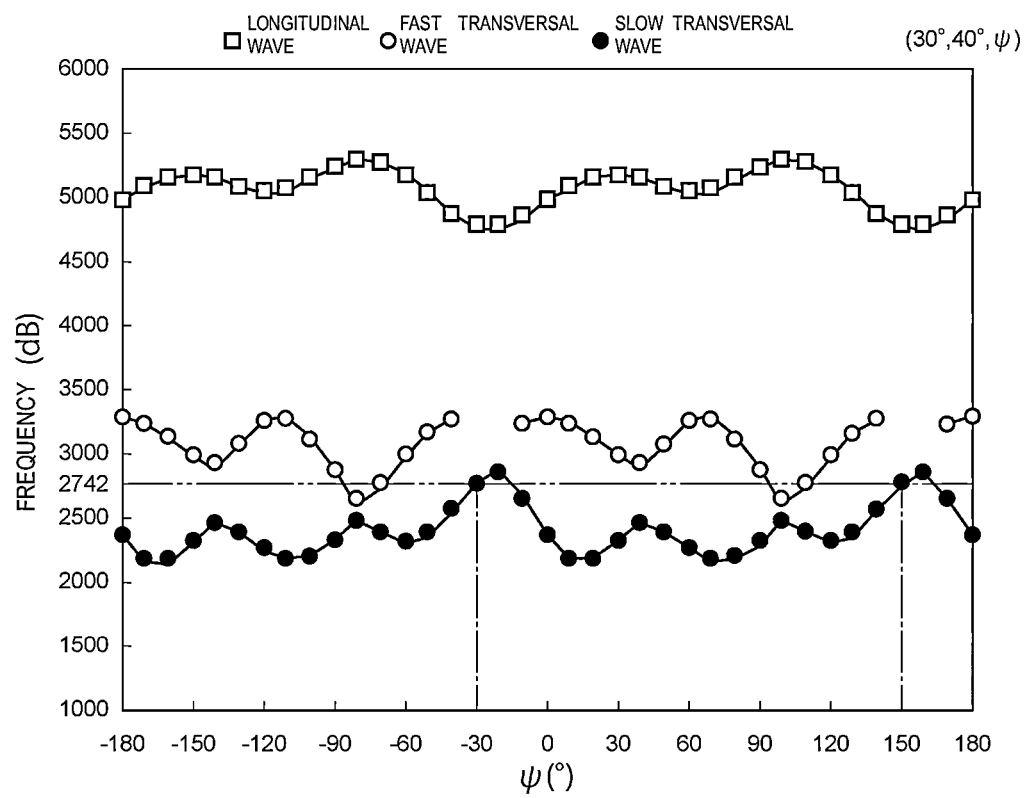
FIG. 42 is a graph illustrating a relationship between ψ of the Euler angles (30°, 40°, ψ) of the magnesium aluminate single crystal and a frequency of each of a longitudinal wave, a fast transversal wave, and a slow transversal wave.

FIG. 42 is a graph illustrating a relationship between ψ of the Euler angles (30°, 40°, ψ) of the magnesium aluminate single crystal and a frequency of each of a longitudinal wave, the fast transversal wave, and the slow transversal wave.

In deriving the relationship of FIG. 42, the wavelength λ is set to 2 μm. Here, assuming that the acoustic velocity is denoted by v and the frequency is denoted by f, f=v/λ is held. Accordingly, when the acoustic velocity is 5484 m/s, this corresponds to the frequency of 2742 MHz. The frequency of the transversal wave becomes 2742 MHz when ψ is −30° and 150°. Thus, when ψ is −35° or more and less than −25° and is 145° or more and less than 155°, the frequency of the transversal wave does not change from 2742 MHz, and the acoustic velocity also does not change from 5484 m/s. On the other hand, when ψ is −180° or more and less than −35°, −25° or more and less than 145°, and 155° or more and less than 180°, the frequency of the transversal wave is different from 2742 MHz, and the acoustic velocity is different from 5484 m/s. A portion of the region A and two of the regions B in FIG. 26 were derived based on the above-mentioned result. By repeating a similar process to that described above, the region A and the regions B in each of FIGS. 5 to 41 were derived.

Depending on cut-angles of a piezoelectric body of the piezoelectric layer 5 and the Euler angles (φ, θ, ψ) of the magnesium aluminate single crystal, the acoustic velocity of the SH transversal wave is different and becomes higher or lower than the acoustic velocity of the SV transversal wave. Therefore, which one of the SH and SV transversal waves is the lower transversal wave is different depending on the conditions, such as the cut-angles of the piezoelectric body and the Euler angles of the magnesium aluminate single crystal.

Advantageous effects of the first preferred embodiment will be described in more detail below. Four kinds of advantageous effects are described with reference to FIGS. 43 to 46. FIGS. 43 to 46 illustrate the results of comparing examples in which the Euler angles (φ, θ, ψ) of the magnesium aluminate single crystal of the monocrystalline spinel substrate 3 and cut-angles of lithium tantalate of the piezoelectric layer 5 are set to be different in the first preferred embodiment with comparative examples. More specifically, the impedance frequency characteristics are compared between the first preferred embodiment and the comparative examples. The comparative examples are different from the first preferred embodiment in that a polycrystalline spinel substrate is used instead of the monocrystalline spinel substrate 3. In the cases illustrated in FIGS. 43 and 44, the slow transversal wave is the SH wave. In the cases illustrated in FIGS. 45 and 46, the slow transversal wave is the SV wave.

Figure 43:
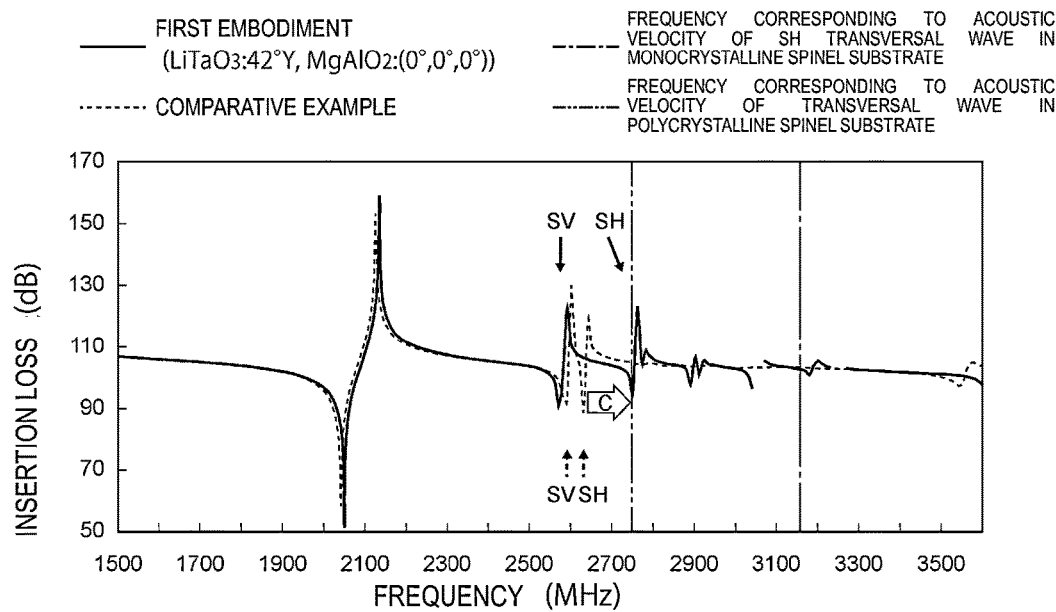
FIG. 43 is a graph illustrating the impedance frequency characteristics in the first preferred embodiment of the present invention when the Euler angles (φ, θ, ψ) of the magnesium aluminate single crystal of the monocrystalline spinel substrate are (0°, 0°, 40°) and cut-angles of lithium tantalate of a piezoelectric layer are expressed by 42° Y and the impedance frequency characteristics in a comparative example.

FIG. 43 is a graph illustrating the impedance frequency characteristics in the first preferred embodiment when the Euler angles (φ, θ, ψ) of the magnesium aluminate single crystal of the monocrystalline spinel substrate are (0°, 0°, 0°) and the cut-angles of the lithium tantalate of the piezoelectric layer are expressed by 42° Y and the impedance frequency characteristics in the comparative example. A one-dot-chain line in FIG. 43 indicates a frequency corresponding to the acoustic velocity of the SH transversal wave in the monocrystalline spinel substrate 3 in the first preferred embodiment. A two-dot-chain line in FIG. 43 indicates a frequency corresponding to the acoustic velocity of the transversal wave in the comparative example. The above points are similarly applied to FIG. 44.

In the first preferred embodiment represented by the case illustrated in FIG. 43, the acoustic velocity of the SH transversal wave in the monocrystalline spinel substrate 3 is higher than 5484 m/s, and the frequency thereof is higher than 2742 MHz. In this case, a frequency at which the SH mode as the higher-order mode generates also becomes higher in the acoustic wave device 1. Accordingly, as indicated by an arrow C, the frequency at which the higher-order mode generates can be made farther away from the frequency of the main mode in the first preferred embodiment than in the comparative example. In other words, the generation of the higher-order mode near the main mode can be effectively suppressed.

Figure 44:
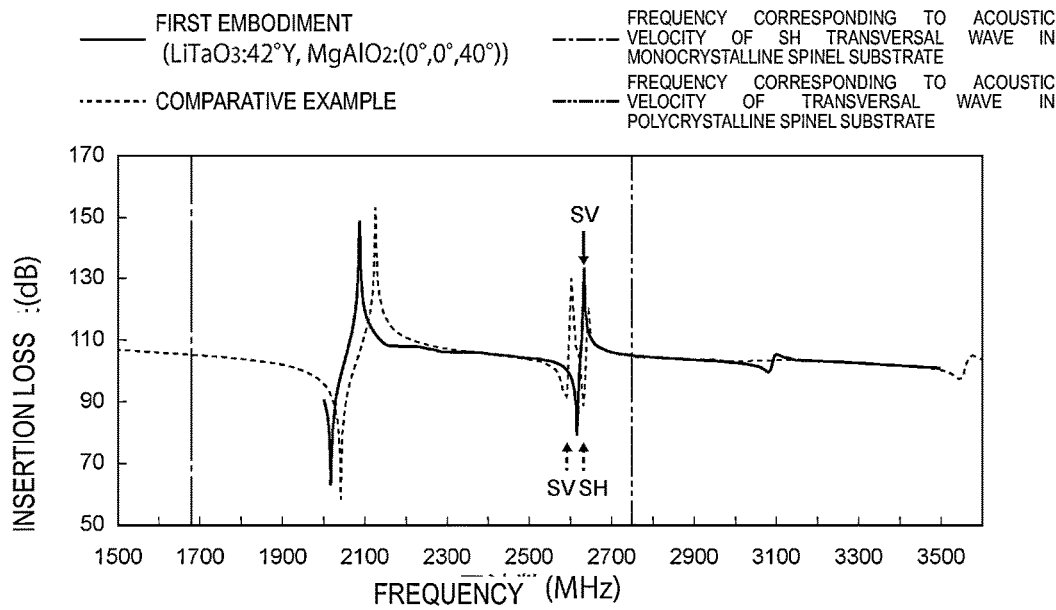
FIG. 44 is a graph illustrating the impedance frequency characteristics in the first preferred embodiment of the present invention when the Euler angles (φ, θ, ψ) of the magnesium aluminate single crystal of the monocrystalline spinel substrate are (0°, 0°, 40°) and the cut-angles of the lithium tantalate of the piezoelectric layer are expressed by 42° Y and the impedance frequency characteristics in a comparative example.

FIG. 44 is a graph illustrating the impedance frequency characteristics in the first preferred embodiment when the Euler angles (φ, θ, ψ) of the magnesium aluminate single crystal of the monocrystalline spinel substrate are (0°, 0°, 4°) and the cut-angles of the lithium tantalate of the piezoelectric layer are expressed by 42° Y and the impedance frequency characteristics in the comparative example.

In the first preferred embodiment represented by the case illustrated in FIG. 44, the acoustic velocity of the SH transversal wave in the monocrystalline spinel substrate 3 is lower than 5484 m/s, and the frequency thereof is lower than 2742 MHz. In this case, a cutoff frequency for the SH mode in the acoustic wave device 1 can be set to be lower than 2742 MHz. Hence the generation of the SH mode as the higher-order mode can be suppressed in the acoustic wave device 1.

Figure 45:
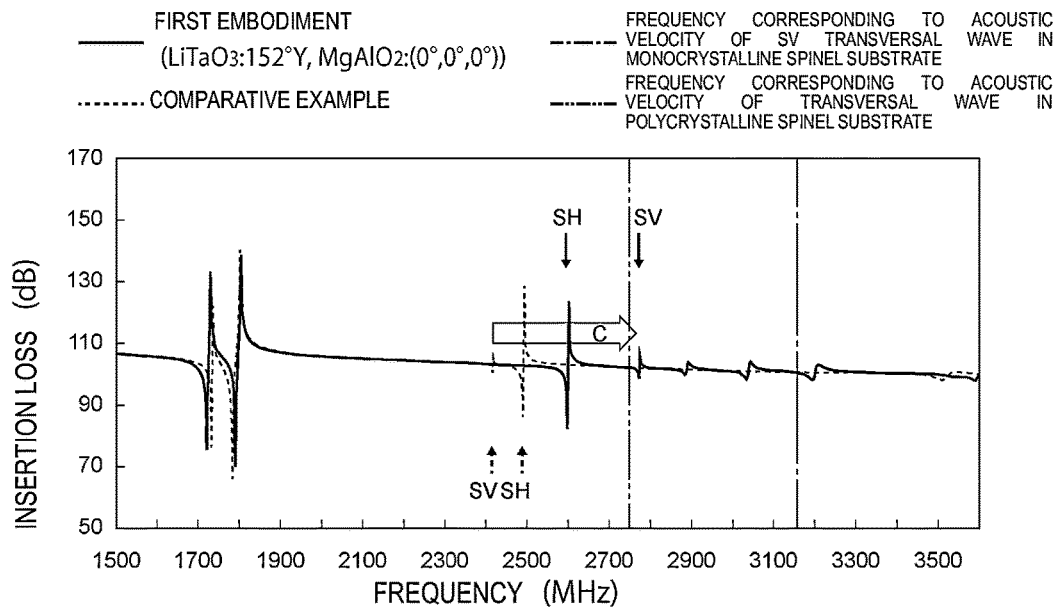
FIG. 45 is a graph illustrating the impedance frequency characteristics in the first preferred embodiment of the present invention when the Euler angles (φ, θ, ψ) of the magnesium aluminate single crystal of the monocrystalline spinel substrate are (0°, 0°, 0°) and the cut-angles of the lithium tantalate of the piezoelectric layer are expressed by 152° Y and the impedance frequency characteristics in a comparative example.

FIG. 45 is a graph illustrating the impedance frequency characteristics in the first preferred embodiment when the Euler angles (φ, θ, ψ) of the magnesium aluminate single crystal of the monocrystalline spinel substrate are (0°, 0°, 0°) and the cut-angles of the lithium tantalate of the piezoelectric layer are expressed by 152° Y and the impedance frequency characteristics in the comparative example. A one-dot-chain line in FIG. 45 indicates a frequency corresponding to the acoustic velocity of the SV transversal wave in the monocrystalline spinel substrate 3 in the first preferred embodiment. A two-dot-chain line in FIG. 45 indicates a frequency corresponding to the acoustic velocity of the transversal wave in the comparative example. The above points are similarly applied to FIG. 46.

In the first preferred embodiment represented by the case illustrated in FIG. 45, the acoustic velocity of the SV transversal wave in the monocrystalline spinel substrate 3 is higher than 5484 m/s, and the frequency thereof is higher than 2742 MHz. In this case, a frequency at which the SV mode as the higher-order mode generates also becomes higher in the acoustic wave device 1. Accordingly, as indicated by an arrow C, the frequency at which the higher-order mode generates can be made farther away from the frequency of the main mode in the first preferred embodiment than in the comparative example. In other words, the generation of the higher-order mode near the main mode can be effectively suppressed.

Figure 46:
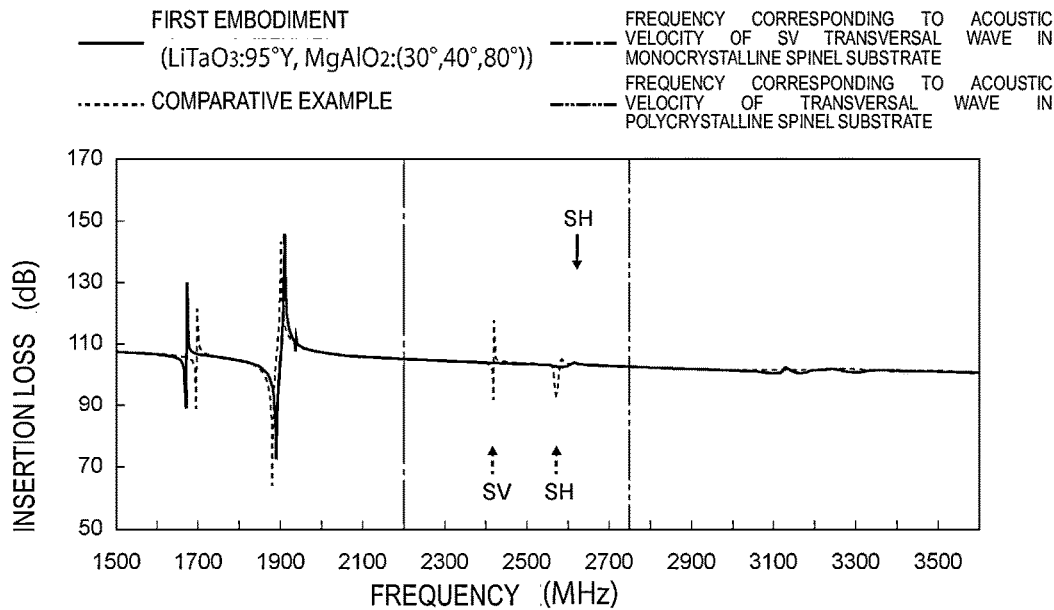
FIG. 46 is a graph illustrating the impedance frequency characteristics in the first preferred embodiment of the present invention when the Euler angles (φ, θ, ψ) of the magnesium aluminate single crystal of the monocrystalline spinel substrate are (30°, 40°, 80°) and the cut-angles of the lithium tantalate of the piezoelectric layer are expressed by 95° Y and the impedance frequency characteristics in a comparative example.

FIG. 46 is a graph illustrating the impedance frequency characteristics in the first preferred embodiment when the Euler angles (φ, θ, ψ) of the magnesium aluminate single crystal of the monocrystalline spinel substrate are (30°, 40°, 80°) and the cut-angles of the lithium tantalate of the piezoelectric layer are expressed by 95° Y and impedance frequency characteristics in the comparative example.

In the first preferred embodiment represented by the case illustrated in FIG. 46, the acoustic velocity of the SV transversal wave in the monocrystalline spinel substrate 3 is lower than 5484 m/s, and the frequency thereof is lower than 2742 MHz. In this case, a cutoff frequency for the SV mode in the acoustic wave device 1 can be set to be lower than 2742 MHz. Hence the generation of the SV mode as the higher-order mode can be suppressed in the acoustic wave device 1. In all the cases of FIGS. 43 to 46, degradation of filter characteristics can be suppressed when the acoustic wave device 1 is used as a filter device.

In the first preferred embodiment, as described above, φ, θ, and ψ of the Euler angles (φ, θ, ψ) of the magnesium aluminate single crystal of the monocrystalline spinel substrate 3 are the angles within the range of any of the regions A in FIGS. 5 to 41. Stated another way, in this preferred embodiment, φ, θ, and ψ of the Euler angles (φ, θ, ψ) of the magnesium aluminate single crystal of the monocrystalline spinel substrate 3 are any of combinations indicated in Tables 1 to 45.

TABLE 1

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −180 | −175 | −180 | −175 | −165 | −155 | −180 | −175 | −5 | 5 | 15 | 25 |
| −180 | −175 | −180 | −175 | −115 | −105 | −180 | −175 | −5 | 5 | 65 | 75 |
| −180 | −175 | −180 | −175 | −75 | −65 | −180 | −175 | −5 | 5 | 105 | 115 |
| −180 | −175 | −180 | −175 | −25 | −15 | −180 | −175 | −5 | 5 | 155 | 165 |
| −180 | −175 | −180 | −175 | 15 | 25 | −180 | −175 | 5 | 15 | −165 | −155 |
| −180 | −175 | −180 | −175 | 65 | 75 | −180 | −175 | 5 | 15 | −25 | −15 |
| −180 | −175 | −180 | −175 | 105 | 115 | −180 | −175 | 5 | 15 | 15 | 25 |
| −180 | −175 | −180 | −175 | 155 | 165 | −180 | −175 | 5 | 15 | 155 | 165 |
| −180 | −175 | −175 | −165 | −165 | −155 | −180 | −175 | 15 | 25 | −165 | −155 |
| −180 | −175 | −175 | −165 | −25 | −15 | −180 | −175 | 15 | 25 | −95 | −85 |
| −180 | −175 | −175 | −165 | 15 | 25 | −180 | −175 | 15 | 25 | −25 | −15 |
| −180 | −175 | −175 | −165 | 155 | 165 | −180 | −175 | 15 | 25 | 15 | 25 |
| −180 | −175 | −165 | −155 | −165 | −155 | −180 | −175 | 15 | 25 | 85 | 95 |
| −180 | −175 | −165 | −155 | −95 | −85 | −180 | −175 | 15 | 25 | 155 | 165 |
| −180 | −175 | −165 | −155 | −25 | −15 | −180 | −175 | 65 | 75 | −165 | −155 |
| −180 | −175 | −165 | −155 | 15 | 25 | −180 | −175 | 65 | 75 | −95 | −85 |
| −180 | −175 | −165 | −155 | 85 | 95 | −180 | −175 | 65 | 75 | −25 | −15 |
| −180 | −175 | −165 | −155 | 155 | 165 | −180 | −175 | 65 | 75 | 15 | 25 |
| −180 | −175 | −115 | −105 | −165 | −155 | −180 | −175 | 65 | 75 | 85 | 95 |
| −180 | −175 | −115 | −105 | −95 | −85 | −180 | −175 | 65 | 75 | 155 | 165 |
| −180 | −175 | −115 | −105 | −25 | −15 | −180 | −175 | 75 | 85 | −165 | −155 |
| −180 | −175 | −115 | −105 | 15 | 25 | −180 | −175 | 75 | 85 | −25 | −15 |
| −180 | −175 | −115 | −105 | 85 | 95 | −180 | −175 | 75 | 85 | 15 | 25 |
| −180 | −175 | −115 | −105 | 155 | 165 | −180 | −175 | 75 | 85 | 155 | 165 |
| −180 | −175 | −105 | −95 | −165 | −155 | −180 | −175 | 85 | 95 | −165 | −155 |
| −180 | −175 | −105 | −95 | −25 | −15 | −180 | −175 | 85 | 95 | −115 | −105 |
| −180 | −175 | −105 | −95 | 15 | 25 | −180 | −175 | 85 | 95 | −75 | −65 |
| −180 | −175 | −105 | −95 | 155 | 165 | −180 | −175 | 85 | 95 | −25 | −15 |
| −180 | −175 | −95 | −85 | −165 | −155 | −180 | −175 | 85 | 95 | 15 | 25 |
| −180 | −175 | −95 | −85 | −115 | −105 | −180 | −175 | 85 | 95 | 65 | 75 |
| −180 | −175 | −95 | −85 | −75 | −65 | −180 | −175 | 85 | 95 | 105 | 115 |
| −180 | −175 | −95 | −85 | −25 | −15 | −180 | −175 | 85 | 95 | 155 | 165 |
| −180 | −175 | −95 | −85 | 15 | 25 | −180 | −175 | 95 | 105 | −165 | −155 |
| −180 | −175 | −95 | −85 | 65 | 75 | −180 | −175 | 95 | 105 | −25 | −15 |
| −180 | −175 | −95 | −85 | 105 | 115 | −180 | −175 | 95 | 105 | 15 | 25 |
| −180 | −175 | −95 | −85 | 155 | 165 | −180 | −175 | 95 | 105 | 155 | 165 |
| −180 | −175 | −85 | −75 | −165 | −155 | −180 | −175 | 105 | 115 | −165 | −155 |
| −180 | −175 | −85 | −75 | −25 | −15 | −180 | −175 | 105 | 115 | −95 | −85 |
| −180 | −175 | −85 | −75 | 15 | 25 | −180 | −175 | 105 | 115 | −25 | −15 |
| −180 | −175 | −85 | −75 | 155 | 165 | −180 | −175 | 105 | 115 | 15 | 25 |
| −180 | −175 | −75 | −65 | −165 | −155 | −180 | −175 | 105 | 115 | 85 | 95 |
| −180 | −175 | −75 | −65 | −95 | −85 | −180 | −175 | 105 | 115 | 155 | 165 |
| −180 | −175 | −75 | −65 | −25 | −15 | −180 | −175 | 155 | 165 | −165 | −155 |
| −180 | −175 | −75 | −65 | 15 | 25 | −180 | −175 | 155 | 165 | −95 | −85 |
| −180 | −175 | −75 | −65 | 85 | 95 | −180 | −175 | 155 | 165 | −25 | −15 |
| −180 | −175 | −75 | −65 | 155 | 165 | −180 | −175 | 155 | 165 | 15 | 25 |
| −180 | −175 | −25 | −15 | −165 | −155 | −180 | −175 | 155 | 165 | 85 | 95 |
| −180 | −175 | −25 | −15 | −95 | −85 | −180 | −175 | 155 | 165 | 155 | 165 |
| −180 | −175 | −25 | −15 | −25 | −15 | −180 | −175 | 165 | 175 | −165 | −155 |
| −180 | −175 | −25 | −15 | 15 | 25 | −180 | −175 | 165 | 175 | −25 | −15 |
| −180 | −175 | −25 | −15 | 85 | 95 | −180 | −175 | 165 | 175 | 15 | 25 |
| −180 | −175 | −25 | −15 | 155 | 165 | −180 | −175 | 165 | 175 | 155 | 165 |
| −180 | −175 | −15 | −5 | −165 | −155 | −180 | −175 | 175 | 180 | −165 | −155 |
| −180 | −175 | −15 | −5 | −25 | −15 | −180 | −175 | 175 | 180 | −115 | −105 |
| −180 | −175 | −15 | −5 | 15 | 25 | −180 | −175 | 175 | 180 | −75 | −65 |
| −180 | −175 | −15 | −5 | 155 | 165 | −180 | −175 | 175 | 180 | −25 | −15 |
| −180 | −175 | −5 | 5 | −165 | −155 | −180 | −175 | 175 | 180 | 15 | 25 |

TABLE 1-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −180 | −175 | −5 | 5 | −115 | −105 | −180 | −175 | 175 | 180 | 65 | 75 |
| −180 | −175 | −5 | 5 | −75 | −65 | −180 | −175 | 175 | 180 | 105 | 115 |
| −180 | −175 | −5 | 5 | −25 | −15 | −180 | −175 | 175 | 180 | 155 | 165 |

TABLE 2

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −175 | −165 | −180 | −175 | −155 | −145 | −175 | −165 | −5 | 5 | 5 | 15 |
| −175 | −165 | −180 | −175 | −105 | −95 | −175 | −165 | −5 | 5 | 55 | 65 |
| −175 | −165 | −180 | −175 | −65 | −55 | −175 | −165 | −5 | 5 | 95 | 105 |
| −175 | −165 | −180 | −175 | −15 | −5 | −175 | −165 | −5 | 5 | 145 | 155 |
| −175 | −165 | −180 | −175 | 25 | 35 | −175 | −165 | 5 | 15 | −175 | −165 |
| −175 | −165 | −180 | −175 | 75 | 85 | −175 | −165 | 5 | 15 | −35 | −25 |
| −175 | −165 | −180 | −175 | 115 | 125 | −175 | −165 | 5 | 15 | 5 | 15 |
| −175 | −165 | −180 | −175 | 165 | 175 | −175 | −165 | 5 | 15 | 145 | 155 |
| −175 | −165 | −175 | −165 | −155 | −145 | −175 | −165 | 15 | 25 | −175 | −165 |
| −175 | −165 | −175 | −165 | −15 | −5 | −175 | −165 | 15 | 25 | 5 | 15 |
| −175 | −165 | −175 | −165 | 25 | 35 | −175 | −165 | 65 | 75 | −95 | −85 |
| −175 | −165 | −175 | −165 | 165 | 175 | −175 | −165 | 65 | 75 | 85 | 95 |
| −175 | −165 | −165 | −155 | −15 | −5 | −175 | −165 | 75 | 85 | −25 | −15 |
| −175 | −165 | −165 | −155 | 165 | 175 | −175 | −165 | 75 | 85 | 155 | 165 |
| −175 | −165 | −115 | −105 | −95 | −85 | −175 | −165 | 85 | 95 | −115 | −105 |
| −175 | −165 | −115 | −105 | 85 | 95 | −175 | −165 | 85 | 95 | −75 | −65 |
| −175 | −165 | −105 | −95 | −165 | −155 | −175 | −165 | 85 | 95 | 65 | 75 |
| −175 | −165 | −105 | −95 | 15 | 25 | −175 | −165 | 85 | 95 | 105 | 115 |
| −175 | −165 | −95 | −85 | −115 | −105 | −175 | −165 | 95 | 105 | −165 | −155 |
| −175 | −165 | −95 | −85 | −75 | −65 | −175 | −165 | 95 | 105 | 15 | 25 |
| −175 | −165 | −95 | −85 | 65 | 75 | −175 | −165 | 105 | 115 | −95 | −85 |
| −175 | −165 | −95 | −85 | 105 | 115 | −175 | −165 | 105 | 115 | 85 | 95 |
| −175 | −165 | −85 | −75 | −25 | −15 | −175 | −165 | 155 | 165 | −15 | −5 |
| −175 | −165 | −85 | −75 | 155 | 165 | −175 | −165 | 155 | 165 | 165 | 175 |
| −175 | −165 | −75 | −65 | −95 | −85 | −175 | −165 | 165 | 175 | −155 | −145 |
| −175 | −165 | −75 | −65 | 85 | 95 | −175 | −165 | 165 | 175 | −15 | −5 |
| −175 | −165 | −25 | −15 | −175 | −165 | −175 | −165 | 165 | 175 | 25 | 35 |
| −175 | −165 | −25 | −15 | 5 | 15 | −175 | −165 | 165 | 175 | 165 | 175 |
| −175 | −165 | −15 | −5 | −175 | −165 | −175 | −165 | 175 | 180 | −155 | −145 |
| −175 | −165 | −15 | −5 | −35 | −25 | −175 | −165 | 175 | 180 | −105 | −95 |
| −175 | −165 | −15 | −5 | 5 | 15 | −175 | −165 | 175 | 180 | −65 | −55 |
| −175 | −165 | −15 | −5 | 145 | 155 | −175 | −165 | 175 | 180 | −15 | −5 |
| −175 | −165 | −5 | 5 | −175 | −165 | −175 | −165 | 175 | 180 | 25 | 35 |
| −175 | −165 | −5 | 5 | −125 | −115 | −175 | −165 | 175 | 180 | 75 | 85 |
| −175 | −165 | −5 | 5 | −85 | −75 | −175 | −165 | 175 | 180 | 115 | 125 |
| −175 | −165 | −5 | 5 | −35 | −25 | −175 | −165 | 175 | 180 | 165 | 175 |

TABLE 3

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −165 | −155 | −180 | −175 | −180 | −175 | −165 | −155 | −45 | −35 | 175 | 180 |
| −165 | −155 | −180 | −175 | −145 | −135 | −165 | −155 | −35 | −25 | −180 | −175 |
| −165 | −155 | −180 | −175 | −95 | −85 | −165 | −155 | −35 | −25 | −5 | 5 |
| −165 | −155 | −180 | −175 | −55 | −45 | −165 | −155 | −35 | −25 | 175 | 180 |
| −165 | −155 | −180 | −175 | −5 | 5 | −165 | −155 | −25 | −15 | −180 | −175 |
| −165 | −155 | −180 | −175 | 35 | 45 | −165 | −155 | −25 | −15 | −5 | 5 |
| −165 | −155 | −180 | −175 | 85 | 95 | −165 | −155 | −25 | −15 | 175 | 180 |
| −165 | −155 | −180 | −175 | 125 | 135 | −165 | −155 | −15 | −5 | −180 | −175 |
| −165 | −155 | −180 | −175 | 175 | 180 | −165 | −155 | −15 | −5 | −45 | −35 |
| −165 | −155 | −175 | −165 | −180 | −175 | −165 | −155 | −15 | −5 | −5 | 5 |
| −165 | −155 | −175 | −165 | −145 | −135 | −165 | −155 | −15 | −5 | 135 | 145 |
| −165 | −155 | −175 | −165 | −5 | 5 | −165 | −155 | −15 | −5 | 175 | 180 |
| −165 | −155 | −175 | −165 | 35 | 45 | −165 | −155 | −5 | 5 | −180 | −175 |

TABLE 3-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −165 | −155 | −175 | −165 | 175 | 180 | −165 | −155 | −5 | 5 | −135 | −125 |
| −165 | −155 | −165 | −155 | −180 | −175 | −165 | −155 | −5 | 5 | −95 | −85 |
| −165 | −155 | −165 | −155 | −5 | 5 | −165 | −155 | −5 | 5 | −45 | −35 |
| −165 | −155 | −165 | −155 | 175 | 180 | −165 | −155 | −5 | 5 | −5 | 5 |
| −165 | −155 | −155 | −145 | −180 | −175 | −165 | −155 | −5 | 5 | 45 | 55 |
| −165 | −155 | −155 | −145 | −5 | 5 | −165 | −155 | −5 | 5 | 85 | 95 |
| −165 | −155 | −155 | −145 | 175 | 180 | −165 | −155 | −5 | 5 | 135 | 145 |
| −165 | −155 | −145 | −135 | −180 | −175 | −165 | −155 | −5 | 5 | 175 | 180 |
| −165 | −155 | −145 | −135 | −5 | 5 | −165 | −155 | 5 | 15 | −180 | −175 |
| −165 | −155 | −145 | −135 | 175 | 180 | −165 | −155 | 5 | 15 | −45 | −35 |
| −165 | −155 | −135 | −125 | −180 | −175 | −165 | −155 | 5 | 15 | −5 | 5 |
| −165 | −155 | −135 | −125 | −5 | 5 | −165 | −155 | 5 | 15 | 135 | 145 |
| −165 | −155 | −135 | −125 | 175 | 180 | −165 | −155 | 5 | 15 | 175 | 180 |
| −165 | −155 | −125 | −115 | −180 | −175 | −165 | −155 | 15 | 25 | −180 | −175 |
| −165 | −155 | −125 | −115 | −5 | 5 | −165 | −155 | 15 | 25 | −5 | 5 |
| −165 | −155 | −125 | −115 | 175 | 180 | −165 | −155 | 15 | 25 | 175 | 180 |
| −165 | −155 | −115 | −105 | −180 | −175 | −165 | −155 | 25 | 35 | −180 | −175 |
| −165 | −155 | −115 | −105 | −95 | −85 | −165 | −155 | 25 | 35 | −5 | 5 |
| −165 | −155 | −115 | −105 | −5 | 5 | −165 | −155 | 25 | 35 | 175 | 180 |
| −165 | −155 | −115 | −105 | 85 | 95 | −165 | −155 | 35 | 45 | −180 | −175 |
| −165 | −155 | −115 | −105 | 175 | 180 | −165 | −155 | 35 | 45 | −5 | 5 |
| −165 | −155 | −105 | −95 | −180 | −175 | −165 | −155 | 35 | 45 | 175 | 180 |
| −165 | −155 | −105 | −95 | −5 | 5 | −165 | −155 | 45 | 55 | −180 | −175 |
| −165 | −155 | −105 | −95 | 175 | 180 | −165 | −155 | 45 | 55 | −5 | 5 |
| −165 | −155 | −95 | −85 | −180 | −175 | −165 | −155 | 45 | 55 | 175 | 180 |
| −165 | −155 | −95 | −85 | −115 | −105 | −165 | −155 | 55 | 65 | −180 | −175 |
| −165 | −155 | −95 | −85 | −75 | −65 | −165 | −155 | 55 | 65 | −5 | 5 |
| −165 | −155 | −95 | −85 | −5 | 5 | −165 | −155 | 55 | 65 | 175 | 180 |
| −165 | −155 | −95 | −85 | 65 | 75 | −165 | −155 | 65 | 75 | −180 | −175 |
| −165 | −155 | −95 | −85 | 105 | 115 | −165 | −155 | 65 | 75 | −95 | −85 |
| −165 | −155 | −95 | −85 | 175 | 180 | −165 | −155 | 65 | 75 | −5 | 5 |
| −165 | −155 | −85 | −75 | −180 | −175 | −165 | −155 | 65 | 75 | 85 | 95 |
| −165 | −155 | −85 | −75 | −5 | 5 | −165 | −155 | 65 | 75 | 175 | 180 |
| −165 | −155 | −85 | −75 | 175 | 180 | −165 | −155 | 75 | 85 | −180 | −175 |
| −165 | −155 | −75 | −65 | −180 | −175 | −165 | −155 | 75 | 85 | −5 | 5 |
| −165 | −155 | −75 | −65 | −95 | −85 | −165 | −155 | 75 | 85 | 175 | 180 |
| −165 | −155 | −75 | −65 | −5 | 5 | −165 | −155 | 85 | 95 | −180 | −175 |
| −165 | −155 | −75 | −65 | 85 | 95 | −165 | −155 | 85 | 95 | −115 | −105 |
| −165 | −155 | −75 | −65 | 175 | 180 | −165 | −155 | 85 | 95 | −75 | −65 |
| −165 | −155 | −65 | −55 | −180 | −175 | −165 | −155 | 85 | 95 | −5 | 5 |
| −165 | −155 | −65 | −55 | −5 | 5 | −165 | −155 | 85 | 95 | 65 | 75 |
| −165 | −155 | −65 | −55 | 175 | 180 | −165 | −155 | 85 | 95 | 105 | 115 |
| −165 | −155 | −55 | −45 | −180 | −175 | −165 | −155 | 85 | 95 | 175 | 180 |
| −165 | −155 | −55 | −45 | −5 | 5 | −165 | −155 | 95 | 105 | −180 | −175 |
| −165 | −155 | −55 | −45 | 175 | 180 | −165 | −155 | 95 | 105 | −5 | 5 |
| −165 | −155 | −45 | −35 | −180 | −175 | −165 | −155 | 95 | 105 | 175 | 180 |
| −165 | −155 | −45 | −35 | −5 | 5 | −165 | −155 | 105 | 115 | −180 | −175 |

TABLE 4

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −165 | −155 | 105 | 115 | −95 | −85 | −165 | −155 | 155 | 165 | −5 | 5 |
| −165 | −155 | 105 | 115 | −5 | 5 | −165 | −155 | 155 | 165 | 175 | 180 |
| −165 | −155 | 105 | 115 | 85 | 95 | −165 | −155 | 165 | 175 | −180 | −175 |
| −165 | −155 | 105 | 115 | 175 | 180 | −165 | −155 | 165 | 175 | −145 | −135 |
| −165 | −155 | 115 | 125 | −180 | −175 | −165 | −155 | 165 | 175 | −5 | 5 |
| −165 | −155 | 115 | 125 | −5 | 5 | −165 | −155 | 165 | 175 | 35 | 45 |
| −165 | −155 | 115 | 125 | 175 | 180 | −165 | −155 | 165 | 175 | 175 | 180 |
| −165 | −155 | 125 | 135 | −180 | −175 | −165 | −155 | 175 | 180 | −180 | −175 |
| −165 | −155 | 125 | 135 | −5 | 5 | −165 | −155 | 175 | 180 | −145 | −135 |
| −165 | −155 | 125 | 135 | 175 | 180 | −165 | −155 | 175 | 180 | −95 | −85 |
| −165 | −155 | 135 | 145 | −180 | −175 | −165 | −155 | 175 | 180 | −55 | −45 |
| −165 | −155 | 135 | 145 | −5 | 5 | −165 | −155 | 175 | 180 | −5 | 5 |
| −165 | −155 | 135 | 145 | 175 | 180 | −165 | −155 | 175 | 180 | 35 | 45 |
| −165 | −155 | 145 | 155 | −180 | −175 | −165 | −155 | 175 | 180 | 85 | 95 |

TABLE 4-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −165 | −155 | 145 | 155 | −5 | 5 | −165 | −155 | 175 | 180 | 125 | 135 |
| −165 | −155 | 145 | 155 | 175 | 180 | −165 | −155 | 175 | 180 | 175 | 180 |
| −165 | −155 | 155 | 165 | −180 | −175 | | | | | | |

TABLE 5

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −155 | −145 | −180 | −175 | −175 | −165 | −155 | −145 | −5 | 5 | 35 | 45 |
| −155 | −145 | −180 | −175 | −135 | −125 | −155 | −145 | −5 | 5 | 75 | 85 |
| −155 | −145 | −180 | −175 | −85 | −75 | −155 | −145 | −5 | 5 | 125 | 135 |
| −155 | −145 | −180 | −175 | −45 | −35 | −155 | −145 | −5 | 5 | 165 | 175 |
| −155 | −145 | −180 | −175 | 5 | 15 | −155 | −145 | 5 | 15 | −15 | −5 |
| −155 | −145 | −180 | −175 | 45 | 55 | −155 | −145 | 5 | 15 | 165 | 175 |
| −155 | −145 | −180 | −175 | 95 | 105 | −155 | −145 | 25 | 35 | −45 | −35 |
| −155 | −145 | −180 | −175 | 135 | 145 | −155 | −145 | 25 | 35 | 135 | 145 |
| −155 | −145 | −175 | −165 | −175 | −165 | −155 | −145 | 35 | 45 | −35 | −25 |
| −155 | −145 | −175 | −165 | 5 | 15 | −155 | −145 | 35 | 45 | 145 | 155 |
| −155 | −145 | −155 | −145 | −145 | −135 | −155 | −145 | 135 | 145 | −155 | −145 |
| −155 | −145 | −155 | −145 | 35 | 45 | −155 | −145 | 135 | 145 | 25 | 35 |
| −155 | −145 | −145 | −135 | −155 | −145 | −155 | −145 | 145 | 155 | −145 | −135 |
| −155 | −145 | −145 | −135 | 25 | 35 | −155 | −145 | 145 | 155 | 35 | 45 |
| −155 | −145 | −45 | −35 | −35 | −25 | −155 | −145 | 165 | 175 | −175 | −165 |
| −155 | −145 | −45 | −35 | 145 | 155 | −155 | −145 | 165 | 175 | 5 | 15 |
| −155 | −145 | −35 | −25 | −45 | −35 | −155 | −145 | 175 | 180 | −175 | −165 |
| −155 | −145 | −35 | −25 | 135 | 145 | −155 | −145 | 175 | 180 | −135 | −125 |
| −155 | −145 | −15 | −5 | −15 | −5 | −155 | −145 | 175 | 180 | −85 | −75 |
| −155 | −145 | −15 | −5 | 165 | 175 | −155 | −145 | 175 | 180 | −45 | −35 |
| −155 | −145 | −5 | 5 | −145 | −135 | −155 | −145 | 175 | 180 | 5 | 15 |
| −155 | −145 | −5 | 5 | −105 | −95 | −155 | −145 | 175 | 180 | 45 | 55 |
| −155 | −145 | −5 | 5 | −55 | −45 | −155 | −145 | 175 | 180 | 95 | 105 |
| −155 | −145 | −5 | 5 | −15 | −5 | −155 | −145 | 175 | 180 | 135 | 145 |

TABLE 6

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −145 | −135 | −180 | −175 | −165 | −155 | −145 | −135 | −5 | 5 | 25 | 35 |
| −145 | −135 | −180 | −175 | −125 | −115 | −145 | −135 | −5 | 5 | 65 | 75 |
| −145 | −135 | −180 | −175 | −75 | −65 | −145 | −135 | −5 | 5 | 115 | 125 |
| −145 | −135 | −180 | −175 | −35 | −25 | −145 | −135 | −5 | 5 | 155 | 165 |
| −145 | −135 | −180 | −175 | 15 | 25 | −145 | −135 | 175 | 180 | −165 | −155 |
| −145 | −135 | −180 | −175 | 55 | 65 | −145 | −135 | 175 | 180 | −125 | −115 |
| −145 | −135 | −180 | −175 | 105 | 115 | −145 | −135 | 175 | 180 | −75 | −65 |
| −145 | −135 | −180 | −175 | 145 | 155 | −145 | −135 | 175 | 180 | −35 | −25 |
| −145 | −135 | −5 | 5 | −155 | −145 | −145 | −135 | 175 | 180 | 15 | 25 |
| −145 | −135 | −5 | 5 | −115 | −105 | −145 | −135 | 175 | 180 | 55 | 65 |
| −145 | −135 | −5 | 5 | −65 | −55 | −145 | −135 | 175 | 180 | 105 | 115 |
| −145 | −135 | −5 | 5 | −25 | −15 | −145 | −135 | 175 | 180 | 145 | 155 |

TABLE 7

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −135 | −125 | −180 | −175 | −155 | −145 | −135 | −125 | −5 | 5 | 15 | 25 |
| −135 | −125 | −180 | −175 | −115 | −105 | −135 | −125 | −5 | 5 | 55 | 65 |
| −135 | −125 | −180 | −175 | −65 | −55 | −135 | −125 | −5 | 5 | 105 | 115 |
| −135 | −125 | −180 | −175 | −25 | −15 | −135 | −125 | −5 | 5 | 145 | 155 |
| −135 | −125 | −180 | −175 | 25 | 35 | −135 | −125 | 175 | 180 | −155 | −145 |
| −135 | −125 | −180 | −175 | 65 | 75 | −135 | −125 | 175 | 180 | −115 | −105 |
| −135 | −125 | −180 | −175 | 115 | 125 | −135 | −125 | 175 | 180 | −65 | −55 |
| −135 | −125 | −180 | −175 | 155 | 165 | −135 | −125 | 175 | 180 | −25 | −15 |
| −135 | −125 | −5 | 5 | −165 | −155 | −135 | −125 | 175 | 180 | 25 | 35 |
| −135 | −125 | −5 | 5 | −125 | −115 | −135 | −125 | 175 | 180 | 65 | 75 |
| −135 | −125 | −5 | 5 | −75 | −65 | −135 | −125 | 175 | 180 | 115 | 125 |
| −135 | −125 | −5 | 5 | −35 | −25 | −135 | −125 | 175 | 180 | 155 | 165 |

TABLE 8

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −125 | −115 | −180 | −175 | −145 | −135 | −125 | −115 | −5 | 5 | 5 | 15 |
| −125 | −115 | −180 | −175 | −105 | −95 | −125 | −115 | −5 | 5 | 45 | 55 |
| −125 | −115 | −180 | −175 | −55 | −45 | −125 | −115 | −5 | 5 | 95 | 105 |
| −125 | −115 | −180 | −175 | −15 | −5 | −125 | −115 | −5 | 5 | 135 | 145 |
| −125 | −115 | −180 | −175 | 35 | 45 | −125 | −115 | 5 | 15 | −175 | −165 |
| −125 | −115 | −180 | −175 | 75 | 85 | −125 | −115 | 5 | 15 | 5 | 15 |
| −125 | −115 | −180 | −175 | 125 | 135 | −125 | −115 | 25 | 35 | −145 | −135 |
| −125 | −115 | −180 | −175 | 165 | 175 | −125 | −115 | 25 | 35 | 35 | 45 |
| −125 | −115 | −175 | −165 | −15 | −5 | −125 | −115 | 35 | 45 | −155 | −145 |
| −125 | −115 | −175 | −165 | 165 | 175 | −125 | −115 | 35 | 45 | 25 | 35 |
| −125 | −115 | −155 | −145 | −45 | −35 | −125 | −115 | 135 | 145 | −35 | −25 |
| −125 | −115 | −155 | −145 | 135 | 145 | −125 | −115 | 135 | 145 | 145 | 155 |
| −125 | −115 | −145 | −135 | −35 | −25 | −125 | −115 | 145 | 155 | −45 | −35 |
| −125 | −115 | −145 | −135 | 145 | 155 | −125 | −115 | 145 | 155 | 135 | 145 |
| −125 | −115 | −45 | −35 | −155 | −145 | −125 | −115 | 165 | 175 | −15 | −5 |
| −125 | −115 | −45 | −35 | 25 | 35 | −125 | −115 | 165 | 175 | 165 | 175 |
| −125 | −115 | −35 | −25 | −145 | −135 | −125 | −115 | 175 | 180 | −145 | −135 |
| −125 | −115 | −35 | −25 | 35 | 45 | −125 | −115 | 175 | 180 | −105 | −95 |
| −125 | −115 | −15 | −5 | −175 | −165 | −125 | −115 | 175 | 180 | −55 | −45 |
| −125 | −115 | −15 | −5 | 5 | 15 | −125 | −115 | 175 | 180 | −15 | −5 |
| −125 | −115 | −5 | 5 | −175 | −165 | −125 | −115 | 175 | 180 | 35 | 45 |
| −125 | −115 | −5 | 5 | −135 | −125 | −125 | −115 | 175 | 180 | 75 | 85 |
| −125 | −115 | −5 | 5 | −85 | −75 | −125 | −115 | 175 | 180 | 125 | 135 |
| −125 | −115 | −5 | 5 | −45 | −35 | −125 | −115 | 175 | 180 | 165 | 175 |

TABLE 9

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −115 | −105 | −180 | −175 | −180 | −175 | −115 | −105 | −45 | −35 | 175 | 180 |
| −115 | −105 | −180 | −175 | −135 | −125 | −115 | −105 | −35 | −25 | −180 | −175 |
| −115 | −105 | −180 | −175 | −95 | −85 | −115 | −105 | −35 | −25 | −5 | 5 |
| −115 | −105 | −180 | −175 | −45 | −35 | −115 | −105 | −35 | −25 | 175 | 180 |
| −115 | −105 | −180 | −175 | −5 | 5 | −115 | −105 | −25 | −15 | −180 | −175 |
| −115 | −105 | −180 | −175 | 45 | 55 | −115 | −105 | −25 | −15 | −5 | 5 |
| −115 | −105 | −180 | −175 | 85 | 95 | −115 | −105 | −25 | −15 | 175 | 180 |
| −115 | −105 | −180 | −175 | 135 | 145 | −115 | −105 | −15 | −5 | −180 | −175 |
| −115 | −105 | −180 | −175 | 175 | 180 | −115 | −105 | −15 | −5 | −145 | −135 |
| −115 | −105 | −175 | −165 | −180 | −175 | −115 | −105 | −15 | −5 | −5 | 5 |
| −115 | −105 | −175 | −165 | −45 | −35 | −115 | −105 | −15 | −5 | 35 | 45 |
| −115 | −105 | −175 | −165 | −5 | 5 | −115 | −105 | −15 | −5 | 175 | 180 |
| −115 | −105 | −175 | −165 | 135 | 145 | −115 | −105 | −5 | 5 | −180 | −175 |
| −115 | −105 | −175 | −165 | 175 | 180 | −115 | −105 | −5 | 5 | −145 | −135 |
| −115 | −105 | −165 | −155 | −180 | −175 | −115 | −105 | −5 | 5 | −95 | −85 |
| −115 | −105 | −165 | −155 | −5 | 5 | −115 | −105 | −5 | 5 | −55 | −45 |

TABLE 9-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −115 | −105 | −165 | −155 | 175 | 180 | −115 | −105 | −5 | 5 | −5 | 5 |
| −115 | −105 | −155 | −145 | −180 | −175 | −115 | −105 | −5 | 5 | 35 | 45 |
| −115 | −105 | −155 | −145 | −5 | 5 | −115 | −105 | −5 | 5 | 85 | 95 |
| −115 | −105 | −155 | −145 | 175 | 180 | −115 | −105 | −5 | 5 | 125 | 135 |
| −115 | −105 | −145 | −135 | −180 | −175 | −115 | −105 | −5 | 5 | 175 | 180 |
| −115 | −105 | −145 | −135 | −5 | 5 | −115 | −105 | 5 | 15 | −180 | −175 |
| −115 | −105 | −145 | −135 | 175 | 180 | −115 | −105 | 5 | 15 | −145 | −135 |
| −115 | −105 | −135 | −125 | −180 | −175 | −115 | −105 | 5 | 15 | −5 | 5 |
| −115 | −105 | −135 | −125 | −5 | 5 | −115 | −105 | 5 | 15 | 35 | 45 |
| −115 | −105 | −135 | −125 | 175 | 180 | −115 | −105 | 5 | 15 | 175 | 180 |
| −115 | −105 | −125 | −115 | −180 | −175 | −115 | −105 | 15 | 25 | −180 | −175 |
| −115 | −105 | −125 | −115 | −5 | 5 | −115 | −105 | 15 | 25 | −5 | 5 |
| −115 | −105 | −125 | −115 | 175 | 180 | −115 | −105 | 15 | 25 | 175 | 180 |
| −115 | −105 | −115 | −105 | −180 | −175 | −115 | −105 | 25 | 35 | −180 | −175 |
| −115 | −105 | −115 | −105 | −95 | −85 | −115 | −105 | 25 | 35 | −5 | 5 |
| −115 | −105 | −115 | −105 | −5 | 5 | −115 | −105 | 25 | 35 | 175 | 180 |
| −115 | −105 | −115 | −105 | 85 | 95 | −115 | −105 | 35 | 45 | −180 | −175 |
| −115 | −105 | −115 | −105 | 175 | 180 | −115 | −105 | 35 | 45 | −5 | 5 |
| −115 | −105 | −105 | −95 | −180 | −175 | −115 | −105 | 35 | 45 | 175 | 180 |
| −115 | −105 | −105 | −95 | −5 | 5 | −115 | −105 | 45 | 55 | −180 | −175 |
| −115 | −105 | −105 | −95 | 175 | 180 | −115 | −105 | 45 | 55 | −5 | 5 |
| −115 | −105 | −95 | −85 | −180 | −175 | −115 | −105 | 45 | 55 | 175 | 180 |
| −115 | −105 | −95 | −85 | −115 | −105 | −115 | −105 | 55 | 65 | −180 | −175 |
| −115 | −105 | −95 | −85 | −75 | −65 | −115 | −105 | 55 | 65 | −5 | 5 |
| −115 | −105 | −95 | −85 | −5 | 5 | −115 | −105 | 55 | 65 | 175 | 180 |
| −115 | −105 | −95 | −85 | 65 | 75 | −115 | −105 | 65 | 75 | −180 | −175 |
| −115 | −105 | −95 | −85 | 105 | 115 | −115 | −105 | 65 | 75 | −95 | −85 |
| −115 | −105 | −95 | −85 | 175 | 180 | −115 | −105 | 65 | 75 | −5 | 5 |
| −115 | −105 | −85 | −75 | −180 | −175 | −115 | −105 | 65 | 75 | 85 | 95 |
| −115 | −105 | −85 | −75 | −5 | 5 | −115 | −105 | 65 | 75 | 175 | 180 |
| −115 | −105 | −85 | −75 | 175 | 180 | −115 | −105 | 75 | 85 | −180 | −175 |
| −115 | −105 | −75 | −65 | −180 | −175 | −115 | −105 | 75 | 85 | −5 | 5 |
| −115 | −105 | −75 | −65 | −95 | −85 | −115 | −105 | 75 | 85 | 175 | 180 |
| −115 | −105 | −75 | −65 | −5 | 5 | −115 | −105 | 85 | 95 | −180 | −175 |
| −115 | −105 | −75 | −65 | 85 | 95 | −115 | −105 | 85 | 95 | −115 | −105 |
| −115 | −105 | −75 | −65 | 175 | 180 | −115 | −105 | 85 | 95 | −75 | −65 |
| −115 | −105 | −65 | −55 | −180 | −175 | −115 | −105 | 85 | 95 | −5 | 5 |
| −115 | −105 | −65 | −55 | −5 | 5 | −115 | −105 | 85 | 95 | 65 | 75 |
| −115 | −105 | −65 | −55 | 175 | 180 | −115 | −105 | 85 | 95 | 105 | 115 |
| −115 | −105 | −55 | −45 | −180 | −175 | −115 | −105 | 85 | 95 | 175 | 180 |
| −115 | −105 | −55 | −45 | −5 | 5 | −115 | −105 | 95 | 105 | −180 | −175 |
| −115 | −105 | −55 | −45 | 175 | 180 | −115 | −105 | 95 | 105 | −5 | 5 |
| −115 | −105 | −45 | −35 | −180 | −175 | −115 | −105 | 95 | 105 | 175 | 180 |
| −115 | −105 | −45 | −35 | −5 | 5 | −115 | −105 | 105 | 115 | −180 | −175 |

TABLE 10

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −115 | −105 | 105 | 115 | −95 | −85 | −115 | −105 | 155 | 165 | −5 | 5 |
| −115 | −105 | 105 | 115 | −5 | 5 | −115 | −105 | 155 | 165 | 175 | 180 |
| −115 | −105 | 105 | 115 | 85 | 95 | −115 | −105 | 165 | 175 | −180 | −175 |
| −115 | −105 | 105 | 115 | 175 | 180 | −115 | −105 | 165 | 175 | −45 | −35 |
| −115 | −105 | 115 | 125 | −180 | −175 | −115 | −105 | 165 | 175 | −5 | 5 |
| −115 | −105 | 115 | 125 | −5 | 5 | −115 | −105 | 165 | 175 | 135 | 145 |
| −115 | −105 | 115 | 125 | 175 | 180 | −115 | −105 | 165 | 175 | 175 | 180 |
| −115 | −105 | 125 | 135 | −180 | −175 | −115 | −105 | 175 | 180 | −180 | −175 |
| −115 | −105 | 125 | 135 | −5 | 5 | −115 | −105 | 175 | 180 | −135 | −125 |
| −115 | −105 | 125 | 135 | 175 | 180 | −115 | −105 | 175 | 180 | −95 | −85 |
| −115 | −105 | 135 | 145 | −180 | −175 | −115 | −105 | 175 | 180 | −45 | −35 |
| −115 | −105 | 135 | 145 | −5 | 5 | −115 | −105 | 175 | 180 | −5 | 5 |
| −115 | −105 | 135 | 145 | 175 | 180 | −115 | −105 | 175 | 180 | 45 | 55 |
| −115 | −105 | 145 | 155 | −180 | −175 | −115 | −105 | 175 | 180 | 85 | 95 |
| −115 | −105 | 145 | 155 | −5 | 5 | −115 | −105 | 175 | 180 | 135 | 145 |
| −115 | −105 | 145 | 155 | 175 | 180 | −115 | −105 | 175 | 180 | 175 | 180 |
| −115 | −105 | 155 | 165 | −180 | −175 | | | | | | |

TABLE 11

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −105 | −95 | −180 | −175 | −175 | −165 | −105 | −95 | −5 | 5 | 25 | 35 |
| −105 | −95 | −180 | −175 | −125 | −115 | −105 | −95 | −5 | 5 | 75 | 85 |
| −105 | −95 | −180 | −175 | −85 | −75 | −105 | −95 | −5 | 5 | 115 | 125 |
| −105 | −95 | −180 | −175 | −35 | −25 | −105 | −95 | −5 | 5 | 165 | 175 |
| −105 | −95 | −180 | −175 | 5 | 15 | −105 | −95 | 5 | 15 | −155 | −145 |
| −105 | −95 | −180 | −175 | 55 | 65 | −105 | −95 | 5 | 15 | −15 | −5 |
| −105 | −95 | −180 | −175 | 95 | 105 | −105 | −95 | 5 | 15 | 25 | 35 |
| −105 | −95 | −180 | −175 | 145 | 155 | −105 | −95 | 5 | 15 | 165 | 175 |
| −105 | −95 | −175 | −165 | −175 | −165 | −105 | −95 | 15 | 25 | −15 | −5 |
| −105 | −95 | −175 | −165 | −35 | −25 | −105 | −95 | 15 | 25 | 165 | 175 |
| −105 | −95 | −175 | −165 | 5 | 15 | −105 | −95 | 65 | 75 | −95 | −85 |
| −105 | −95 | −175 | −165 | 145 | 155 | −105 | −95 | 65 | 75 | 85 | 95 |
| −105 | −95 | −165 | −155 | −175 | −165 | −105 | −95 | 75 | 85 | −165 | −155 |
| −105 | −95 | −165 | −155 | 5 | 15 | −105 | −95 | 75 | 85 | 15 | 25 |
| −105 | −95 | −115 | −105 | −95 | −85 | −105 | −95 | 85 | 95 | −115 | −105 |
| −105 | −95 | −115 | −105 | 85 | 95 | −105 | −95 | 85 | 95 | −75 | −65 |
| −105 | −95 | −105 | −95 | −25 | −15 | −105 | −95 | 85 | 95 | 65 | 75 |
| −105 | −95 | −105 | −95 | 155 | 165 | −105 | −95 | 85 | 95 | 105 | 115 |
| −105 | −95 | −95 | −85 | −115 | −105 | −105 | −95 | 95 | 105 | −25 | −15 |
| −105 | −95 | −95 | −85 | −75 | −65 | −105 | −95 | 95 | 105 | 155 | 165 |
| −105 | −95 | −95 | −85 | 65 | 75 | −105 | −95 | 105 | 115 | −95 | −85 |
| −105 | −95 | −95 | −85 | 105 | 115 | −105 | −95 | 105 | 115 | 85 | 95 |
| −105 | −95 | −85 | −75 | −165 | −155 | −105 | −95 | 155 | 165 | −175 | −165 |
| −105 | −95 | −85 | −75 | 15 | 25 | −105 | −95 | 155 | 165 | 5 | 15 |
| −105 | −95 | −75 | −65 | −95 | −85 | −105 | −95 | 165 | 175 | −175 | −165 |
| −105 | −95 | −75 | −65 | 85 | 95 | −105 | −95 | 165 | 175 | −35 | −25 |
| −105 | −95 | −25 | −15 | −15 | −5 | −105 | −95 | 165 | 175 | 5 | 15 |
| −105 | −95 | −25 | −15 | 165 | 175 | −105 | −95 | 165 | 175 | 145 | 155 |
| −105 | −95 | −15 | −5 | −155 | −145 | −105 | −95 | 175 | 180 | −175 | −165 |
| −105 | −95 | −15 | −5 | −15 | −5 | −105 | −95 | 175 | 180 | −125 | −115 |
| −105 | −95 | −15 | −5 | 25 | 35 | −105 | −95 | 175 | 180 | −85 | −75 |
| −105 | −95 | −15 | −5 | 165 | 175 | −105 | −95 | 175 | 180 | −35 | −25 |
| −105 | −95 | −5 | 5 | −155 | −145 | −105 | −95 | 175 | 180 | 5 | 15 |
| −105 | −95 | −5 | 5 | −105 | −95 | −105 | −95 | 175 | 180 | 55 | 65 |
| −105 | −95 | −5 | 5 | −65 | −55 | −105 | −95 | 175 | 180 | 95 | 105 |
| −105 | −95 | −5 | 5 | −15 | −5 | −105 | −95 | 175 | 180 | 145 | 155 |

TABLE 12

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −95 | −85 | −180 | −175 | −165 | −155 | −95 | −85 | −5 | 5 | 15 | 25 |
| −95 | −85 | −180 | −175 | −115 | −105 | −95 | −85 | −5 | 5 | 65 | 75 |
| −95 | −85 | −180 | −175 | −75 | −65 | −95 | −85 | −5 | 5 | 105 | 115 |
| −95 | −85 | −180 | −175 | −25 | −15 | −95 | −85 | −5 | 5 | 155 | 165 |
| −95 | −85 | −180 | −175 | 15 | 25 | −95 | −85 | 5 | 15 | −165 | −155 |
| −95 | −85 | −180 | −175 | 65 | 75 | −95 | −85 | 5 | 15 | −25 | −15 |
| −95 | −85 | −180 | −175 | 105 | 115 | −95 | −85 | 5 | 15 | 15 | 25 |
| −95 | −85 | −180 | −175 | 155 | 165 | −95 | −85 | 5 | 15 | 155 | 165 |
| −95 | −85 | −175 | −165 | −165 | −155 | −95 | −85 | 15 | 25 | −165 | −155 |
| −95 | −85 | −175 | −165 | −25 | −15 | −95 | −85 | 15 | 25 | −95 | −85 |
| −95 | −85 | −175 | −165 | 15 | 25 | −95 | −85 | 15 | 25 | −25 | −15 |
| −95 | −85 | −175 | −165 | 155 | 165 | −95 | −85 | 15 | 25 | 15 | 25 |
| −95 | −85 | −165 | −155 | −165 | −155 | −95 | −85 | 15 | 25 | 85 | 95 |
| −95 | −85 | −165 | −155 | −95 | −85 | −95 | −85 | 15 | 25 | 155 | 165 |
| −95 | −85 | −165 | −155 | −25 | −15 | −95 | −85 | 65 | 75 | −165 | −155 |
| −95 | −85 | −165 | −155 | 15 | 25 | −95 | −85 | 65 | 75 | −95 | −85 |
| −95 | −85 | −165 | −155 | 85 | 95 | −95 | −85 | 65 | 75 | −25 | −15 |
| −95 | −85 | −165 | −155 | 155 | 165 | −95 | −85 | 65 | 75 | 15 | 25 |
| −95 | −85 | −115 | −105 | −165 | −155 | −95 | −85 | 65 | 75 | 85 | 95 |
| −95 | −85 | −115 | −105 | −95 | −85 | −95 | −85 | 65 | 75 | 155 | 165 |
| −95 | −85 | −115 | −105 | −25 | −15 | −95 | −85 | 75 | 85 | −165 | −155 |
| −95 | −85 | −115 | −105 | 15 | 25 | −95 | −85 | 75 | 85 | −25 | −15 |
| −95 | −85 | −115 | −105 | 85 | 95 | −95 | −85 | 75 | 85 | 15 | 25 |
| −95 | −85 | −115 | −105 | 155 | 165 | −95 | −85 | 75 | 85 | 155 | 165 |
| −95 | −85 | −105 | −95 | −165 | −155 | −95 | −85 | 85 | 95 | −165 | −155 |
| −95 | −85 | −105 | −95 | −25 | −15 | −95 | −85 | 85 | 95 | −115 | −105 |
| −95 | −85 | −105 | −95 | 15 | 25 | −95 | −85 | 85 | 95 | −75 | −65 |
| −95 | −85 | −105 | −95 | 155 | 165 | −95 | −85 | 85 | 95 | −25 | −15 |

TABLE 12-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −95 | −85 | −95 | −85 | −165 | −155 | −95 | −85 | 85 | 95 | 15 | 25 |
| −95 | −85 | −95 | −85 | −115 | −105 | −95 | −85 | 85 | 95 | 65 | 75 |
| −95 | −85 | −95 | −85 | −75 | −65 | −95 | −85 | 85 | 95 | 105 | 115 |
| −95 | −85 | −95 | −85 | −25 | −15 | −95 | −85 | 85 | 95 | 155 | 165 |
| −95 | −85 | −95 | −85 | 15 | 25 | −95 | −85 | 95 | 105 | −165 | −155 |
| −95 | −85 | −95 | −85 | 65 | 75 | −95 | −85 | 95 | 105 | −25 | −15 |
| −95 | −85 | −95 | −85 | 105 | 115 | −95 | −85 | 95 | 105 | 15 | 25 |
| −95 | −85 | −95 | −85 | 155 | 165 | −95 | −85 | 95 | 105 | 155 | 165 |
| −95 | −85 | −85 | −75 | −165 | −155 | −95 | −85 | 105 | 115 | −165 | −155 |
| −95 | −85 | −85 | −75 | −25 | −15 | −95 | −85 | 105 | 115 | −95 | −85 |
| −95 | −85 | −85 | −75 | 15 | 25 | −95 | −85 | 105 | 115 | −25 | −15 |
| −95 | −85 | −85 | −75 | 155 | 165 | −95 | −85 | 105 | 115 | 15 | 25 |
| −95 | −85 | −75 | −65 | −165 | −155 | −95 | −85 | 105 | 115 | 85 | 95 |
| −95 | −85 | −75 | −65 | −95 | −85 | −95 | −85 | 105 | 115 | 155 | 165 |
| −95 | −85 | −75 | −65 | −25 | −15 | −95 | −85 | 155 | 165 | −165 | −155 |
| −95 | −85 | −75 | −65 | 15 | 25 | −95 | −85 | 155 | 165 | −95 | −85 |
| −95 | −85 | −75 | −65 | 85 | 95 | −95 | −85 | 155 | 165 | −25 | −15 |
| −95 | −85 | −75 | −65 | 155 | 165 | −95 | −85 | 155 | 165 | 15 | 25 |
| −95 | −85 | −25 | −15 | −165 | −155 | −95 | −85 | 155 | 165 | 85 | 95 |
| −95 | −85 | −25 | −15 | −95 | −85 | −95 | −85 | 155 | 165 | 155 | 165 |
| −95 | −85 | −25 | −15 | −25 | −15 | −95 | −85 | 165 | 175 | −165 | −155 |
| −95 | −85 | −25 | −15 | 15 | 25 | −95 | −85 | 165 | 175 | −25 | −15 |
| −95 | −85 | −25 | −15 | 85 | 95 | −95 | −85 | 165 | 175 | 15 | 25 |
| −95 | −85 | −25 | −15 | 155 | 165 | −95 | −85 | 165 | 175 | 155 | 165 |
| −95 | −85 | −15 | −5 | −165 | −155 | −95 | −85 | 175 | 180 | −165 | −155 |
| −95 | −85 | −15 | −5 | −25 | −15 | −95 | −85 | 175 | 180 | −115 | −105 |
| −95 | −85 | −15 | −5 | 15 | 25 | −95 | −85 | 175 | 180 | −75 | −65 |
| −95 | −85 | −15 | −5 | 155 | 165 | −95 | −85 | 175 | 180 | −25 | −15 |
| −95 | −85 | −5 | 5 | −165 | −155 | −95 | −85 | 175 | 180 | 15 | 25 |
| −95 | −85 | −5 | 5 | −115 | −105 | −95 | −85 | 175 | 180 | 65 | 75 |
| −95 | −85 | −5 | 5 | −75 | −65 | −95 | −85 | 175 | 180 | 105 | 115 |
| −95 | −85 | −5 | 5 | −25 | −15 | −95 | −85 | 175 | 180 | 155 | 165 |

TABLE 13

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −85 | −75 | −180 | −175 | −155 | −145 | −85 | −75 | −5 | 5 | 5 | 15 |
| −85 | −75 | −180 | −175 | −105 | −95 | −85 | −75 | −5 | 5 | 55 | 65 |
| −85 | −75 | −180 | −175 | −65 | −55 | −85 | −75 | −5 | 5 | 95 | 105 |
| −85 | −75 | −180 | −175 | −15 | −5 | −85 | −75 | −5 | 5 | 145 | 155 |
| −85 | −75 | −180 | −175 | 25 | 35 | −85 | −75 | 5 | 15 | −175 | −165 |
| −85 | −75 | −180 | −175 | 75 | 85 | −85 | −75 | 5 | 15 | −35 | −25 |
| −85 | −75 | −180 | −175 | 115 | 125 | −85 | −75 | 5 | 15 | 5 | 15 |
| −85 | −75 | −180 | −175 | 165 | 175 | −85 | −75 | 5 | 15 | 145 | 155 |
| −85 | −75 | −175 | −165 | −155 | −145 | −85 | −75 | 15 | 25 | −175 | −165 |
| −85 | −75 | −175 | −165 | −15 | −5 | −85 | −75 | 15 | 25 | 5 | 15 |
| −85 | −75 | −175 | −165 | 25 | 35 | −85 | −75 | 65 | 75 | −95 | −85 |
| −85 | −75 | −175 | −165 | 165 | 175 | −85 | −75 | 65 | 75 | 85 | 95 |
| −85 | −75 | −165 | −155 | −15 | −5 | −85 | −75 | 75 | 85 | −25 | −15 |
| −85 | −75 | −165 | −155 | 165 | 175 | −85 | −75 | 75 | 85 | 155 | 165 |
| −85 | −75 | −115 | −105 | −95 | −85 | −85 | −75 | 85 | 95 | −115 | −105 |
| −85 | −75 | −115 | −105 | 85 | 95 | −85 | −75 | 85 | 95 | −75 | −65 |
| −85 | −75 | −105 | −95 | −165 | −155 | −85 | −75 | 85 | 95 | 65 | 75 |
| −85 | −75 | −105 | −95 | 15 | 25 | −85 | −75 | 85 | 95 | 105 | 115 |
| −85 | −75 | −95 | −85 | −115 | −105 | −85 | −75 | 95 | 105 | −165 | −155 |
| −85 | −75 | −95 | −85 | −75 | −65 | −85 | −75 | 95 | 105 | 15 | 25 |
| −85 | −75 | −95 | −85 | 65 | 75 | −85 | −75 | 105 | 115 | −95 | −85 |
| −85 | −75 | −95 | −85 | 105 | 115 | −85 | −75 | 105 | 115 | 85 | 95 |
| −85 | −75 | −85 | −75 | −25 | −15 | −85 | −75 | 155 | 165 | −15 | −5 |
| −85 | −75 | −85 | −75 | 155 | 165 | −85 | −75 | 155 | 165 | 165 | 175 |
| −85 | −75 | −75 | −65 | −95 | −85 | −85 | −75 | 165 | 175 | −155 | −145 |
| −85 | −75 | −75 | −65 | 85 | 95 | −85 | −75 | 165 | 175 | −15 | −5 |
| −85 | −75 | −25 | −15 | −175 | −165 | −85 | −75 | 165 | 175 | 25 | 35 |
| −85 | −75 | −25 | −15 | 5 | 15 | −85 | −75 | 165 | 175 | 165 | 175 |
| −85 | −75 | −15 | −5 | −175 | −165 | −85 | −75 | 175 | 180 | −155 | −145 |
| −85 | −75 | −15 | −5 | −35 | −25 | −85 | −75 | 175 | 180 | −105 | −95 |
| −85 | −75 | −15 | −5 | 5 | 15 | −85 | −75 | 175 | 180 | −65 | −55 |

TABLE 13-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −85 | −75 | −15 | −5 | 145 | 155 | −85 | −75 | 175 | 180 | −15 | −5 |
| −85 | −75 | −5 | 5 | −175 | −165 | −85 | −75 | 175 | 180 | 25 | 35 |
| −85 | −75 | −5 | 5 | −125 | −115 | −85 | −75 | 175 | 180 | 75 | 85 |
| −85 | −75 | −5 | 5 | −85 | −75 | −85 | −75 | 175 | 180 | 115 | 125 |
| −85 | −75 | −5 | 5 | −35 | −25 | −85 | −75 | 175 | 180 | 165 | 175 |

TABLE 14

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −75 | −65 | −180 | −175 | −180 | −175 | −75 | −65 | −45 | −35 | 175 | 180 |
| −75 | −65 | −180 | −175 | −145 | −135 | −75 | −65 | −35 | −25 | −180 | −175 |
| −75 | −65 | −180 | −175 | −95 | −85 | −75 | −65 | −35 | −25 | −5 | 5 |
| −75 | −65 | −180 | −175 | −55 | −45 | −75 | −65 | −35 | −25 | 175 | 180 |
| −75 | −65 | −180 | −175 | −5 | 5 | −75 | −65 | −25 | −15 | −180 | −175 |
| −75 | −65 | −180 | −175 | 35 | 45 | −75 | −65 | −25 | −15 | −5 | 5 |
| −75 | −65 | −180 | −175 | 85 | 95 | −75 | −65 | −25 | −15 | 175 | 180 |
| −75 | −65 | −180 | −175 | 125 | 135 | −75 | −65 | −15 | −5 | −180 | −175 |
| −75 | −65 | −180 | −175 | 175 | 180 | −75 | −65 | −15 | −5 | −45 | −35 |
| −75 | −65 | −175 | −165 | −180 | −175 | −75 | −65 | −15 | −5 | −5 | 5 |
| −75 | −65 | −175 | −165 | −145 | −135 | −75 | −65 | −15 | −5 | 135 | 145 |
| −75 | −65 | −175 | −165 | −5 | 5 | −75 | −65 | −15 | −5 | 175 | 180 |
| −75 | −65 | −175 | −165 | 35 | 45 | −75 | −65 | −5 | 5 | −180 | −175 |
| −75 | −65 | −175 | −165 | 175 | 180 | −75 | −65 | −5 | 5 | −135 | −125 |
| −75 | −65 | −165 | −155 | −180 | −175 | −75 | −65 | −5 | 5 | −95 | −85 |
| −75 | −65 | −165 | −155 | −5 | 5 | −75 | −65 | −5 | 5 | −45 | −35 |
| −75 | −65 | −165 | −155 | 175 | 180 | −75 | −65 | −5 | 5 | −5 | 5 |
| −75 | −65 | −155 | −145 | −180 | −175 | −75 | −65 | −5 | 5 | 45 | 55 |
| −75 | −65 | −155 | −145 | −5 | 5 | −75 | −65 | −5 | 5 | 85 | 95 |
| −75 | −65 | −155 | −145 | 175 | 180 | −75 | −65 | −5 | 5 | 135 | 145 |
| −75 | −65 | −145 | −135 | −180 | −175 | −75 | −65 | −5 | 5 | 175 | 180 |
| −75 | −65 | −145 | −135 | −5 | 5 | −75 | −65 | 5 | 15 | −180 | −175 |
| −75 | −65 | −145 | −135 | 175 | 180 | −75 | −65 | 5 | 15 | −45 | −35 |
| −75 | −65 | −135 | −125 | −180 | −175 | −75 | −65 | 5 | 15 | −5 | 5 |
| −75 | −65 | −135 | −125 | −5 | 5 | −75 | −65 | 5 | 15 | 135 | 145 |
| −75 | −65 | −135 | −125 | 175 | 180 | −75 | −65 | 5 | 15 | 175 | 180 |
| −75 | −65 | −125 | −115 | −180 | −175 | −75 | −65 | 15 | 25 | −180 | −175 |
| −75 | −65 | −125 | −115 | −5 | 5 | −75 | −65 | 15 | 25 | −5 | 5 |
| −75 | −65 | −125 | −115 | 175 | 180 | −75 | −65 | 15 | 25 | 175 | 180 |
| −75 | −65 | −115 | −105 | −180 | −175 | −75 | −65 | 25 | 35 | −180 | −175 |
| −75 | −65 | −115 | −105 | −95 | −85 | −75 | −65 | 25 | 35 | −5 | 5 |
| −75 | −65 | −115 | −105 | −5 | 5 | −75 | −65 | 25 | 35 | 175 | 180 |
| −75 | −65 | −115 | −105 | 85 | 95 | −75 | −65 | 35 | 45 | −180 | −175 |
| −75 | −65 | −115 | −105 | 175 | 180 | −75 | −65 | 35 | 45 | −5 | 5 |
| −75 | −65 | −105 | −95 | −180 | −175 | −75 | −65 | 35 | 45 | 175 | 180 |
| −75 | −65 | −105 | −95 | −5 | 5 | −75 | −65 | 45 | 55 | −180 | −175 |
| −75 | −65 | −105 | −95 | 175 | 180 | −75 | −65 | 45 | 55 | −5 | 5 |
| −75 | −65 | −95 | −85 | −180 | −175 | −75 | −65 | 45 | 55 | 175 | 180 |
| −75 | −65 | −95 | −85 | −115 | −105 | −75 | −65 | 55 | 65 | −180 | −175 |
| −75 | −65 | −95 | −85 | −75 | −65 | −75 | −65 | 55 | 65 | −5 | 5 |
| −75 | −65 | −95 | −85 | −5 | 5 | −75 | −65 | 55 | 65 | 175 | 180 |
| −75 | −65 | −95 | −85 | 65 | 75 | −75 | −65 | 65 | 75 | −180 | −175 |
| −75 | −65 | −95 | −85 | 105 | 115 | −75 | −65 | 65 | 75 | −95 | −85 |
| −75 | −65 | −95 | −85 | 175 | 180 | −75 | −65 | 65 | 75 | −5 | 5 |
| −75 | −65 | −85 | −75 | −180 | −175 | −75 | −65 | 65 | 75 | 85 | 95 |
| −75 | −65 | −85 | −75 | −5 | 5 | −75 | −65 | 65 | 75 | 175 | 180 |
| −75 | −65 | −85 | −75 | 175 | 180 | −75 | −65 | 75 | 85 | −180 | −175 |
| −75 | −65 | −75 | −65 | −180 | −175 | −75 | −65 | 75 | 85 | −5 | 5 |
| −75 | −65 | −75 | −65 | −95 | −85 | −75 | −65 | 75 | 85 | 175 | 180 |
| −75 | −65 | −75 | −65 | −5 | 5 | −75 | −65 | 85 | 95 | −180 | −175 |
| −75 | −65 | −75 | −65 | 85 | 95 | −75 | −65 | 85 | 95 | −115 | −105 |
| −75 | −65 | −75 | −65 | 175 | 180 | −75 | −65 | 85 | 95 | −75 | −65 |
| −75 | −65 | −65 | −55 | −180 | −175 | −75 | −65 | 85 | 95 | −5 | 5 |
| −75 | −65 | −65 | −55 | −5 | 5 | −75 | −65 | 85 | 95 | 65 | 75 |
| −75 | −65 | −65 | −55 | 175 | 180 | −75 | −65 | 85 | 95 | 105 | 115 |
| −75 | −65 | −55 | −45 | −180 | −175 | −75 | −65 | 85 | 95 | 175 | 180 |

TABLE 14-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −75 | −65 | −55 | −45 | −5 | 5 | −75 | −65 | 95 | 105 | −180 | −175 |
| −75 | −65 | −55 | −45 | 175 | 180 | −75 | −65 | 95 | 105 | −5 | 5 |
| −75 | −65 | −45 | −35 | −180 | −175 | −75 | −65 | 95 | 105 | 175 | 180 |
| −75 | −65 | −45 | −35 | −5 | 5 | −75 | −65 | 105 | 115 | −180 | −175 |

TABLE 15

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −75 | −65 | 105 | 115 | −95 | −85 | −75 | −65 | 155 | 165 | −5 | 5 |
| −75 | −65 | 105 | 115 | −5 | 5 | −75 | −65 | 155 | 165 | 175 | 180 |
| −75 | −65 | 105 | 115 | 85 | 95 | −75 | −65 | 165 | 175 | −180 | −175 |
| −75 | −65 | 105 | 115 | 175 | 180 | −75 | −65 | 165 | 175 | −145 | −135 |
| −75 | −65 | 115 | 125 | −180 | −175 | −75 | −65 | 165 | 175 | −5 | 5 |
| −75 | −65 | 115 | 125 | −5 | 5 | −75 | −65 | 165 | 175 | 35 | 45 |
| −75 | −65 | 115 | 125 | 175 | 180 | −75 | −65 | 165 | 175 | 175 | 180 |
| −75 | −65 | 125 | 135 | −180 | −175 | −75 | −65 | 175 | 180 | −180 | −175 |
| −75 | −65 | 125 | 135 | −5 | 5 | −75 | −65 | 175 | 180 | −145 | −135 |
| −75 | −65 | 125 | 135 | 175 | 180 | −75 | −65 | 175 | 180 | −95 | −85 |
| −75 | −65 | 135 | 145 | −180 | −175 | −75 | −65 | 175 | 180 | −55 | −45 |
| −75 | −65 | 135 | 145 | −5 | 5 | −75 | −65 | 175 | 180 | −5 | 5 |
| −75 | −65 | 135 | 145 | 175 | 180 | −75 | −65 | 175 | 180 | 35 | 45 |
| −75 | −65 | 145 | 155 | −180 | −175 | −75 | −65 | 175 | 180 | 85 | 95 |
| −75 | −65 | 145 | 155 | −5 | 5 | −75 | −65 | 175 | 180 | 125 | 135 |
| −75 | −65 | 145 | 155 | 175 | 180 | −75 | −65 | 175 | 180 | 175 | 180 |
| −75 | −65 | 155 | 165 | −180 | −175 | | | | | | |

TABLE 16

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −65 | −55 | −180 | −175 | −175 | −165 | −65 | −55 | −5 | 5 | 35 | 45 |
| −65 | −55 | −180 | −175 | −135 | −125 | −65 | −55 | −5 | 5 | 75 | 85 |
| −65 | −55 | −180 | −175 | −85 | −75 | −65 | −55 | −5 | 5 | 125 | 135 |
| −65 | −55 | −180 | −175 | −45 | −35 | −65 | −55 | −5 | 5 | 165 | 175 |
| −65 | −55 | −180 | −175 | 5 | 15 | −65 | −55 | 5 | 15 | −15 | −5 |
| −65 | −55 | −180 | −175 | 45 | 55 | −65 | −55 | 5 | 15 | 165 | 175 |
| −65 | −55 | −180 | −175 | 95 | 105 | −65 | −55 | 25 | 35 | −45 | −35 |
| −65 | −55 | −180 | −175 | 135 | 145 | −65 | −55 | 25 | 35 | 135 | 145 |
| −65 | −55 | −175 | −165 | −175 | −165 | −65 | −55 | 35 | 45 | −35 | −25 |
| −65 | −55 | −175 | −165 | 5 | 15 | −65 | −55 | 35 | 45 | 145 | 155 |
| −65 | −55 | −155 | −145 | −145 | −135 | −65 | −55 | 135 | 145 | −155 | −145 |
| −65 | −55 | −155 | −145 | 35 | 45 | −65 | −55 | 135 | 145 | 25 | 35 |
| −65 | −55 | −145 | −135 | −155 | −145 | −65 | −55 | 145 | 155 | −145 | −135 |
| −65 | −55 | −145 | −135 | 25 | 35 | −65 | −55 | 145 | 155 | 35 | 45 |
| −65 | −55 | −45 | −35 | −35 | −25 | −65 | −55 | 165 | 175 | −175 | −165 |
| −65 | −55 | −45 | −35 | 145 | 155 | −65 | −55 | 165 | 175 | 5 | 15 |
| −65 | −55 | −35 | −25 | −45 | −35 | −65 | −55 | 175 | 180 | −175 | −165 |
| −65 | −55 | −35 | −25 | 135 | 145 | −65 | −55 | 175 | 180 | −135 | −125 |
| −65 | −55 | −15 | −5 | −15 | −5 | −65 | −55 | 175 | 180 | −85 | −75 |
| −65 | −55 | −15 | −5 | 165 | 175 | −65 | −55 | 175 | 180 | −45 | −35 |
| −65 | −55 | −5 | 5 | −145 | −135 | −65 | −55 | 175 | 180 | 5 | 15 |
| −65 | −55 | −5 | 5 | −105 | −95 | −65 | −55 | 175 | 180 | 45 | 55 |
| −65 | −55 | −5 | 5 | −55 | −45 | −65 | −55 | 175 | 180 | 95 | 105 |
| −65 | −55 | −5 | 5 | −15 | −5 | −65 | −55 | 175 | 180 | 135 | 145 |

TABLE 17

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −55 | −45 | −180 | −175 | −165 | −155 | −55 | −45 | −5 | 5 | 25 | 35 |
| −55 | −45 | −180 | −175 | −125 | −115 | −55 | −45 | −5 | 5 | 65 | 75 |
| −55 | −45 | −180 | −175 | −75 | −65 | −55 | −45 | −5 | 5 | 115 | 125 |
| −55 | −45 | −180 | −175 | −35 | −25 | −55 | −45 | −5 | 5 | 155 | 165 |
| −55 | −45 | −180 | −175 | 15 | 25 | −55 | −45 | 175 | 180 | −165 | −155 |
| −55 | −45 | −180 | −175 | 55 | 65 | −55 | −45 | 175 | 180 | −125 | −115 |
| −55 | −45 | −180 | −175 | 105 | 115 | −55 | −45 | 175 | 180 | −75 | −65 |
| −55 | −45 | −180 | −175 | 145 | 155 | −55 | −45 | 175 | 180 | −35 | −25 |
| −55 | −45 | −5 | 5 | −155 | −145 | −55 | −45 | 175 | 180 | 15 | 25 |
| −55 | −45 | −5 | 5 | −115 | −105 | −55 | −45 | 175 | 180 | 55 | 65 |
| −55 | −45 | −5 | 5 | −65 | −55 | −55 | −45 | 175 | 180 | 105 | 115 |
| −55 | −45 | −5 | 5 | −25 | −15 | −55 | −45 | 175 | 180 | 145 | 155 |

TABLE 18

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −45 | −35 | −180 | −175 | −155 | −145 | −45 | −35 | −5 | 5 | 15 | 25 |
| −45 | −35 | −180 | −175 | −115 | −105 | −45 | −35 | −5 | 5 | 55 | 65 |
| −45 | −35 | −180 | −175 | −65 | −55 | −45 | −35 | −5 | 5 | 105 | 115 |
| −45 | −35 | −180 | −175 | −25 | −15 | −45 | −35 | −5 | 5 | 145 | 155 |
| −45 | −35 | −180 | −175 | 25 | 35 | −45 | −35 | 175 | 180 | −155 | −145 |
| −45 | −35 | −180 | −175 | 65 | 75 | −45 | −35 | 175 | 180 | −115 | −105 |
| −45 | −35 | −180 | −175 | 115 | 125 | −45 | −35 | 175 | 180 | −65 | −55 |
| −45 | −35 | −180 | −175 | 155 | 165 | −45 | −35 | 175 | 180 | −25 | −15 |
| −45 | −35 | −5 | 5 | −165 | −155 | −45 | −35 | 175 | 180 | 25 | 35 |
| −45 | −35 | −5 | 5 | −125 | −115 | −45 | −35 | 175 | 180 | 65 | 75 |
| −45 | −35 | −5 | 5 | −75 | −65 | −45 | −35 | 175 | 180 | 115 | 125 |
| −45 | −35 | −5 | 5 | −35 | −25 | −45 | −35 | 175 | 180 | 155 | 165 |

TABLE 19

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −35 | −25 | −180 | −175 | −145 | −135 | −35 | −25 | −5 | 5 | 5 | 15 |
| −35 | −25 | −180 | −175 | −105 | −95 | −35 | −25 | −5 | 5 | 45 | 55 |
| −35 | −25 | −180 | −175 | −55 | −45 | −35 | −25 | −5 | 5 | 95 | 105 |
| −35 | −25 | −180 | −175 | −15 | −5 | −35 | −25 | −5 | 5 | 135 | 145 |
| −35 | −25 | −180 | −175 | 35 | 45 | −35 | −25 | 5 | 15 | −175 | −165 |
| −35 | −25 | −180 | −175 | 75 | 85 | −35 | −25 | 5 | 15 | 5 | 15 |
| −35 | −25 | −180 | −175 | 125 | 135 | −35 | −25 | 25 | 35 | −145 | −135 |
| −35 | −25 | −180 | −175 | 165 | 175 | −35 | −25 | 25 | 35 | 35 | 45 |
| −35 | −25 | −175 | −165 | −15 | −5 | −35 | −25 | 35 | 45 | −155 | −145 |
| −35 | −25 | −175 | −165 | 165 | 175 | −35 | −25 | 35 | 45 | 25 | 35 |
| −35 | −25 | −155 | −145 | −45 | −35 | −35 | −25 | 135 | 145 | −35 | −25 |
| −35 | −25 | −155 | −145 | 135 | 145 | −35 | −25 | 135 | 145 | 145 | 155 |
| −35 | −25 | −145 | −135 | −35 | −25 | −35 | −25 | 145 | 155 | −45 | −35 |
| −35 | −25 | −145 | −135 | 145 | 155 | −35 | −25 | 145 | 155 | 135 | 145 |
| −35 | −25 | −45 | −35 | −155 | −145 | −35 | −25 | 165 | 175 | −15 | −5 |
| −35 | −25 | −45 | −35 | 25 | 35 | −35 | −25 | 165 | 175 | 165 | 175 |
| −35 | −25 | −35 | −25 | −145 | −135 | −35 | −25 | 175 | 180 | −145 | −135 |
| −35 | −25 | −35 | −25 | 35 | 45 | −35 | −25 | 175 | 180 | −105 | −95 |
| −35 | −25 | −15 | −5 | −175 | −165 | −35 | −25 | 175 | 180 | −55 | −45 |
| −35 | −25 | −15 | −5 | 5 | 15 | −35 | −25 | 175 | 180 | −15 | −5 |
| −35 | −25 | −5 | 5 | −175 | −165 | −35 | −25 | 175 | 180 | 35 | 45 |
| −35 | −25 | −5 | 5 | −135 | −125 | −35 | −25 | 175 | 180 | 75 | 85 |
| −35 | −25 | −5 | 5 | −85 | −75 | −35 | −25 | 175 | 180 | 125 | 135 |
| −35 | −25 | −5 | 5 | −45 | −35 | −35 | −25 | 175 | 180 | 165 | 175 |

TABLE 20

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −25 | −15 | −180 | −175 | −180 | −175 | −25 | −15 | −45 | −35 | 175 | 180 |
| −25 | −15 | −180 | −175 | −135 | −125 | −25 | −15 | −35 | −25 | −180 | −175 |
| −25 | −15 | −180 | −175 | −95 | −85 | −25 | −15 | −35 | −25 | −5 | 5 |
| −25 | −15 | −180 | −175 | −45 | −35 | −25 | −15 | −35 | −25 | 175 | 180 |
| −25 | −15 | −180 | −175 | −5 | 5 | −25 | −15 | −25 | −15 | −180 | −175 |
| −25 | −15 | −180 | −175 | 45 | 55 | −25 | −15 | −25 | −15 | −5 | 5 |
| −25 | −15 | −180 | −175 | 85 | 95 | −25 | −15 | −25 | −15 | 175 | 180 |
| −25 | −15 | −180 | −175 | 135 | 145 | −25 | −15 | −15 | −5 | −180 | −175 |
| −25 | −15 | −180 | −175 | 175 | 180 | −25 | −15 | −15 | −5 | −145 | −135 |
| −25 | −15 | −175 | −165 | −180 | −175 | −25 | −15 | −15 | −5 | −5 | 5 |
| −25 | −15 | −175 | −165 | −45 | −35 | −25 | −15 | −15 | −5 | 35 | 45 |
| −25 | −15 | −175 | −165 | −5 | 5 | −25 | −15 | −15 | −5 | 175 | 180 |
| −25 | −15 | −175 | −165 | 135 | 145 | −25 | −15 | −5 | 5 | −180 | −175 |
| −25 | −15 | −175 | −165 | 175 | 180 | −25 | −15 | −5 | 5 | −145 | −135 |
| −25 | −15 | −165 | −155 | −180 | −175 | −25 | −15 | −5 | 5 | −95 | −85 |
| −25 | −15 | −165 | −155 | −5 | 5 | −25 | −15 | −5 | 5 | −55 | −45 |
| −25 | −15 | −165 | −155 | 175 | 180 | −25 | −15 | −5 | 5 | −5 | 5 |
| −25 | −15 | −155 | −145 | −180 | −175 | −25 | −15 | −5 | 5 | 35 | 45 |
| −25 | −15 | −155 | −145 | −5 | 5 | −25 | −15 | −5 | 5 | 85 | 95 |
| −25 | −15 | −155 | −145 | 175 | 180 | −25 | −15 | −5 | 5 | 125 | 135 |
| −25 | −15 | −145 | −135 | −180 | −175 | −25 | −15 | −5 | 5 | 175 | 180 |
| −25 | −15 | −145 | −135 | −5 | 5 | −25 | −15 | 5 | 15 | −180 | −175 |
| −25 | −15 | −145 | −135 | 175 | 180 | −25 | −15 | 5 | 15 | −145 | −135 |
| −25 | −15 | −135 | −125 | −180 | −175 | −25 | −15 | 5 | 15 | −5 | 5 |
| −25 | −15 | −135 | −125 | −5 | 5 | −25 | −15 | 5 | 15 | 35 | 45 |
| −25 | −15 | −135 | −125 | 175 | 180 | −25 | −15 | 5 | 15 | 175 | 180 |
| −25 | −15 | −125 | −115 | −180 | −175 | −25 | −15 | 15 | 25 | −180 | −175 |
| −25 | −15 | −125 | −115 | −5 | 5 | −25 | −15 | 15 | 25 | −5 | 5 |
| −25 | −15 | −125 | −115 | 175 | 180 | −25 | −15 | 15 | 25 | 175 | 180 |
| −25 | −15 | −115 | −105 | −180 | −175 | −25 | −15 | 25 | 35 | −180 | −175 |
| −25 | −15 | −115 | −105 | −95 | −85 | −25 | −15 | 25 | 35 | −5 | 5 |
| −25 | −15 | −115 | −105 | −5 | 5 | −25 | −15 | 25 | 35 | 175 | 180 |
| −25 | −15 | −115 | −105 | 85 | 95 | −25 | −15 | 35 | 45 | −180 | −175 |
| −25 | −15 | −115 | −105 | 175 | 180 | −25 | −15 | 35 | 45 | −5 | 5 |
| −25 | −15 | −105 | −95 | −180 | −175 | −25 | −15 | 35 | 45 | 175 | 180 |
| −25 | −15 | −105 | −95 | −5 | 5 | −25 | −15 | 45 | 55 | −180 | −175 |
| −25 | −15 | −105 | −95 | 175 | 180 | −25 | −15 | 45 | 55 | −5 | 5 |
| −25 | −15 | −95 | −85 | −180 | −175 | −25 | −15 | 45 | 55 | 175 | 180 |
| −25 | −15 | −95 | −85 | −115 | −105 | −25 | −15 | 55 | 65 | −180 | −175 |
| −25 | −15 | −95 | −85 | −75 | −65 | −25 | −15 | 55 | 65 | −5 | 5 |
| −25 | −15 | −95 | −85 | −5 | 5 | −25 | −15 | 55 | 65 | 175 | 180 |
| −25 | −15 | −95 | −85 | 65 | 75 | −25 | −15 | 65 | 75 | −180 | −175 |
| −25 | −15 | −95 | −85 | 105 | 115 | −25 | −15 | 65 | 75 | −95 | −85 |
| −25 | −15 | −95 | −85 | 175 | 180 | −25 | −15 | 65 | 75 | −5 | 5 |
| −25 | −15 | −85 | −75 | −180 | −175 | −25 | −15 | 65 | 75 | 85 | 95 |
| −25 | −15 | −85 | −75 | −5 | 5 | −25 | −15 | 65 | 75 | 175 | 180 |
| −25 | −15 | −85 | −75 | 175 | 180 | −25 | −15 | 75 | 85 | −180 | −175 |
| −25 | −15 | −75 | −65 | −180 | −175 | −25 | −15 | 75 | 85 | −5 | 5 |
| −25 | −15 | −75 | −65 | −95 | −85 | −25 | −15 | 75 | 85 | 175 | 180 |
| −25 | −15 | −75 | −65 | −5 | 5 | −25 | −15 | 85 | 95 | −180 | −175 |
| −25 | −15 | −75 | −65 | 85 | 95 | −25 | −15 | 85 | 95 | −115 | −105 |
| −25 | −15 | −75 | −65 | 175 | 180 | −25 | −15 | 85 | 95 | −75 | −65 |
| −25 | −15 | −65 | −55 | −180 | −175 | −25 | −15 | 85 | 95 | −5 | 5 |
| −25 | −15 | −65 | −55 | −5 | 5 | −25 | −15 | 85 | 95 | 65 | 75 |
| −25 | −15 | −65 | −55 | 175 | 180 | −25 | −15 | 85 | 95 | 105 | 115 |
| −25 | −15 | −55 | −45 | −180 | −175 | −25 | −15 | 85 | 95 | 175 | 180 |
| −25 | −15 | −55 | −45 | −5 | 5 | −25 | −15 | 95 | 105 | −180 | −175 |
| −25 | −15 | −55 | −45 | 175 | 180 | −25 | −15 | 95 | 105 | −5 | 5 |
| −25 | −15 | −45 | −35 | −180 | −175 | −25 | −15 | 95 | 105 | 175 | 180 |
| −25 | −15 | −45 | −35 | −5 | 5 | −25 | −15 | 105 | 115 | −180 | −175 |

TABLE 21

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −25 | −15 | 105 | 115 | −95 | −85 | −25 | −15 | 155 | 165 | −5 | 5 |
| −25 | −15 | 105 | 115 | −5 | 5 | −25 | −15 | 155 | 165 | 175 | 180 |
| −25 | −15 | 105 | 115 | 85 | 95 | −25 | −15 | 165 | 175 | −180 | −175 |

TABLE 21-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −25 | −15 | 105 | 115 | 175 | 180 | −25 | −15 | 165 | 175 | −45 | −35 |
| −25 | −15 | 115 | 125 | −180 | −175 | −25 | −15 | 165 | 175 | −5 | 5 |
| −25 | −15 | 115 | 125 | −5 | 5 | −25 | −15 | 165 | 175 | 135 | 145 |
| −25 | −15 | 115 | 125 | 175 | 180 | −25 | −15 | 165 | 175 | 175 | 180 |
| −25 | −15 | 125 | 135 | −180 | −175 | −25 | −15 | 175 | 180 | −180 | −175 |
| −25 | −15 | 125 | 135 | −5 | 5 | −25 | −15 | 175 | 180 | −135 | −125 |
| −25 | −15 | 125 | 135 | 175 | 180 | −25 | −15 | 175 | 180 | −95 | −85 |
| −25 | −15 | 135 | 145 | −180 | −175 | −25 | −15 | 175 | 180 | −45 | −35 |
| −25 | −15 | 135 | 145 | −5 | 5 | −25 | −15 | 175 | 180 | −5 | 5 |
| −25 | −15 | 135 | 145 | 175 | 180 | −25 | −15 | 175 | 180 | 45 | 55 |
| −25 | −15 | 145 | 155 | −180 | −175 | −25 | −15 | 175 | 180 | 85 | 95 |
| −25 | −15 | 145 | 155 | −5 | 5 | −25 | −15 | 175 | 180 | 135 | 145 |
| −25 | −15 | 145 | 155 | 175 | 180 | −25 | −15 | 175 | 180 | 175 | 180 |
| −25 | −15 | 155 | 165 | −180 | −175 | | | | | | |

TABLE 22

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −15 | −5 | −180 | −175 | −175 | −165 | −15 | −5 | −5 | 5 | 25 | 35 |
| −15 | −5 | −180 | −175 | −125 | −115 | −15 | −5 | −5 | 5 | 75 | 85 |
| −15 | −5 | −180 | −175 | −85 | −75 | −15 | −5 | −5 | 5 | 115 | 125 |
| −15 | −5 | −180 | −175 | −35 | −25 | −15 | −5 | −5 | 5 | 165 | 175 |
| −15 | −5 | −180 | −175 | 5 | 15 | −15 | −5 | 5 | 15 | −155 | −145 |
| −15 | −5 | −180 | −175 | 55 | 65 | −15 | −5 | 5 | 15 | −15 | −5 |
| −15 | −5 | −180 | −175 | 95 | 105 | −15 | −5 | 5 | 15 | 25 | 35 |
| −15 | −5 | −180 | −175 | 145 | 155 | −15 | −5 | 5 | 15 | 165 | 175 |
| −15 | −5 | −175 | −165 | −175 | −165 | −15 | −5 | 15 | 25 | −15 | −5 |
| −15 | −5 | −175 | −165 | −35 | −25 | −15 | −5 | 15 | 25 | 165 | 175 |
| −15 | −5 | −175 | −165 | 5 | 15 | −15 | −5 | 65 | 75 | −95 | −85 |
| −15 | −5 | −175 | −165 | 145 | 155 | −15 | −5 | 65 | 75 | 85 | 95 |
| −15 | −5 | −165 | −155 | −175 | −165 | −15 | −5 | 75 | 85 | −165 | −155 |
| −15 | −5 | −165 | −155 | 5 | 15 | −15 | −5 | 75 | 85 | 15 | 25 |
| −15 | −5 | −115 | −105 | −95 | −85 | −15 | −5 | 85 | 95 | −115 | −105 |
| −15 | −5 | −115 | −105 | 85 | 95 | −15 | −5 | 85 | 95 | −75 | −65 |
| −15 | −5 | −105 | −95 | −25 | −15 | −15 | −5 | 85 | 95 | 65 | 75 |
| −15 | −5 | −105 | −95 | 155 | 165 | −15 | −5 | 85 | 95 | 105 | 115 |
| −15 | −5 | −95 | −85 | −115 | −105 | −15 | −5 | 95 | 105 | −25 | −15 |
| −15 | −5 | −95 | −85 | −75 | −65 | −15 | −5 | 95 | 105 | 155 | 165 |
| −15 | −5 | −95 | −85 | 65 | 75 | −15 | −5 | 105 | 115 | −95 | −85 |
| −15 | −5 | −95 | −85 | 105 | 115 | −15 | −5 | 105 | 115 | 85 | 95 |
| −15 | −5 | −85 | −75 | −165 | −155 | −15 | −5 | 155 | 165 | −175 | −165 |
| −15 | −5 | −85 | −75 | 15 | 25 | −15 | −5 | 155 | 165 | 5 | 15 |
| −15 | −5 | −75 | −65 | −95 | −85 | −15 | −5 | 165 | 175 | −175 | −165 |
| −15 | −5 | −75 | −65 | 85 | 95 | −15 | −5 | 165 | 175 | −35 | −25 |
| −15 | −5 | −25 | −15 | −15 | −5 | −15 | −5 | 165 | 175 | 5 | 15 |
| −15 | −5 | −25 | −15 | 165 | 175 | −15 | −5 | 165 | 175 | 145 | 155 |
| −15 | −5 | −15 | −5 | −155 | −145 | −15 | −5 | 175 | 180 | −175 | −165 |
| −15 | −5 | −15 | −5 | −15 | −5 | −15 | −5 | 175 | 180 | −125 | −115 |
| −15 | −5 | −15 | −5 | 25 | 35 | −15 | −5 | 175 | 180 | −85 | −75 |
| −15 | −5 | −15 | −5 | 165 | 175 | −15 | −5 | 175 | 180 | −35 | −25 |
| −15 | −5 | −5 | 5 | −155 | −145 | −15 | −5 | 175 | 180 | 5 | 15 |
| −15 | −5 | −5 | 5 | −105 | −95 | −15 | −5 | 175 | 180 | 55 | 65 |
| −15 | −5 | −5 | 5 | −65 | −55 | −15 | −5 | 175 | 180 | 95 | 105 |
| −15 | −5 | −5 | 5 | −15 | −5 | −15 | −5 | 175 | 180 | 145 | 155 |

TABLE 23

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −5 | 5 | −180 | −175 | −165 | −155 | −5 | 5 | −5 | 5 | 15 | 25 |
| −5 | 5 | −180 | −175 | −115 | −105 | −5 | 5 | −5 | 5 | 65 | 75 |

TABLE 23-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| −5 | 5 | −180 | −175 | −75 | −65 | −5 | 5 | −5 | 5 | 105 | 115 |
| −5 | 5 | −180 | −175 | −25 | −15 | −5 | 5 | −5 | 5 | 155 | 165 |
| −5 | 5 | −180 | −175 | 15 | 25 | −5 | 5 | 5 | 15 | −165 | −155 |
| −5 | 5 | −180 | −175 | 65 | 75 | −5 | 5 | 5 | 15 | −25 | −15 |
| −5 | 5 | −180 | −175 | 105 | 115 | −5 | 5 | 5 | 15 | 15 | 25 |
| −5 | 5 | −180 | −175 | 155 | 165 | −5 | 5 | 5 | 15 | 155 | 165 |
| −5 | 5 | −175 | −165 | −165 | −155 | −5 | 5 | 15 | 25 | −165 | −155 |
| −5 | 5 | −175 | −165 | −25 | −15 | −5 | 5 | 15 | 25 | −95 | −85 |
| −5 | 5 | −175 | −165 | 15 | 25 | −5 | 5 | 15 | 25 | −25 | −15 |
| −5 | 5 | −175 | −165 | 155 | 165 | −5 | 5 | 15 | 25 | 15 | 25 |
| −5 | 5 | −165 | −155 | −165 | −155 | −5 | 5 | 15 | 25 | 85 | 95 |
| −5 | 5 | −165 | −155 | −95 | −85 | −5 | 5 | 15 | 25 | 155 | 165 |
| −5 | 5 | −165 | −155 | −25 | −15 | −5 | 5 | 65 | 75 | −165 | −155 |
| −5 | 5 | −165 | −155 | 15 | 25 | −5 | 5 | 65 | 75 | −95 | −85 |
| −5 | 5 | −165 | −155 | 85 | 95 | −5 | 5 | 65 | 75 | −25 | −15 |
| −5 | 5 | −165 | −155 | 155 | 165 | −5 | 5 | 65 | 75 | 15 | 25 |
| −5 | 5 | −115 | −105 | −165 | −155 | −5 | 5 | 65 | 75 | 85 | 95 |
| −5 | 5 | −115 | −105 | −95 | −85 | −5 | 5 | 65 | 75 | 155 | 165 |
| −5 | 5 | −115 | −105 | −25 | −15 | −5 | 5 | 75 | 85 | −165 | −155 |
| −5 | 5 | −115 | −105 | 15 | 25 | −5 | 5 | 75 | 85 | −25 | −15 |
| −5 | 5 | −115 | −105 | 85 | 95 | −5 | 5 | 75 | 85 | 15 | 25 |
| −5 | 5 | −115 | −105 | 155 | 165 | −5 | 5 | 75 | 85 | 155 | 165 |
| −5 | 5 | −105 | −95 | −165 | −155 | −5 | 5 | 85 | 95 | −165 | −155 |
| −5 | 5 | −105 | −95 | −25 | −15 | −5 | 5 | 85 | 95 | −115 | −105 |
| −5 | 5 | −105 | −95 | 15 | 25 | −5 | 5 | 85 | 95 | −75 | −65 |
| −5 | 5 | −105 | −95 | 155 | 165 | −5 | 5 | 85 | 95 | −25 | −15 |
| −5 | 5 | −95 | −85 | −165 | −155 | −5 | 5 | 85 | 95 | 15 | 25 |
| −5 | 5 | −95 | −85 | −115 | −105 | −5 | 5 | 85 | 95 | 65 | 75 |
| −5 | 5 | −95 | −85 | −75 | −65 | −5 | 5 | 85 | 95 | 105 | 115 |
| −5 | 5 | −95 | −85 | −25 | −15 | −5 | 5 | 85 | 95 | 155 | 165 |
| −5 | 5 | −95 | −85 | 15 | 25 | −5 | 5 | 95 | 105 | −165 | −155 |
| −5 | 5 | −95 | −85 | 65 | 75 | −5 | 5 | 95 | 105 | −25 | −15 |
| −5 | 5 | −95 | −85 | 105 | 115 | −5 | 5 | 95 | 105 | 15 | 25 |
| −5 | 5 | −95 | −85 | 155 | 165 | −5 | 5 | 95 | 105 | 155 | 165 |
| −5 | 5 | −85 | −75 | −165 | −155 | −5 | 5 | 105 | 115 | −165 | −155 |
| −5 | 5 | −85 | −75 | −25 | −15 | −5 | 5 | 105 | 115 | −95 | −85 |
| −5 | 5 | −85 | −75 | 15 | 25 | −5 | 5 | 105 | 115 | −25 | −15 |
| −5 | 5 | −85 | −75 | 155 | 165 | −5 | 5 | 105 | 115 | 15 | 25 |
| −5 | 5 | −75 | −65 | −165 | −155 | −5 | 5 | 105 | 115 | 85 | 95 |
| −5 | 5 | −75 | −65 | −95 | −85 | −5 | 5 | 105 | 115 | 155 | 165 |
| −5 | 5 | −75 | −65 | −25 | −15 | −5 | 5 | 155 | 165 | −165 | −155 |
| −5 | 5 | −75 | −65 | 15 | 25 | −5 | 5 | 155 | 165 | −95 | −85 |
| −5 | 5 | −75 | −65 | 85 | 95 | −5 | 5 | 155 | 165 | −25 | −15 |
| −5 | 5 | −75 | −65 | 155 | 165 | −5 | 5 | 155 | 165 | 15 | 25 |
| −5 | 5 | −25 | −15 | −165 | −155 | −5 | 5 | 155 | 165 | 85 | 95 |
| −5 | 5 | −25 | −15 | −95 | −85 | −5 | 5 | 155 | 165 | 155 | 165 |
| −5 | 5 | −25 | −15 | −25 | −15 | −5 | 5 | 165 | 175 | −165 | −155 |
| −5 | 5 | −25 | −15 | 15 | 25 | −5 | 5 | 165 | 175 | −25 | −15 |
| −5 | 5 | −25 | −15 | 85 | 95 | −5 | 5 | 165 | 175 | 15 | 25 |
| −5 | 5 | −25 | −15 | 155 | 165 | −5 | 5 | 165 | 175 | 155 | 165 |
| −5 | 5 | −15 | −5 | −165 | −155 | −5 | 5 | 175 | 180 | −165 | −155 |
| −5 | 5 | −15 | −5 | −25 | −15 | −5 | 5 | 175 | 180 | −115 | −105 |
| −5 | 5 | −15 | −5 | 15 | 25 | −5 | 5 | 175 | 180 | −75 | −65 |
| −5 | 5 | −15 | −5 | 155 | 165 | −5 | 5 | 175 | 180 | −25 | −15 |
| −5 | 5 | −5 | 5 | −165 | −155 | −5 | 5 | 175 | 180 | 15 | 25 |
| −5 | 5 | −5 | 5 | −115 | −105 | −5 | 5 | 175 | 180 | 65 | 75 |
| −5 | 5 | −5 | 5 | −75 | −65 | −5 | 5 | 175 | 180 | 105 | 115 |
| −5 | 5 | −5 | 5 | −25 | −15 | −5 | 5 | 175 | 180 | 155 | 165 |

TABLE 24

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 5 | 15 | −180 | −175 | −155 | −145 | 5 | 15 | −5 | 5 | 5 | 15 |
| 5 | 15 | −180 | −175 | −105 | −95 | 5 | 15 | −5 | 5 | 55 | 65 |
| 5 | 15 | −180 | −175 | −65 | −55 | 5 | 15 | −5 | 5 | 95 | 105 |
| 5 | 15 | −180 | −175 | −15 | −5 | 5 | 15 | −5 | 5 | 145 | 155 |
| 5 | 15 | −180 | −175 | 25 | 35 | 5 | 15 | 5 | 15 | −175 | −165 |

TABLE 24-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 5 | 15 | −180 | −175 | 75 | 85 | 5 | 15 | 5 | 15 | −35 | −25 |
| 5 | 15 | −180 | −175 | 115 | 125 | 5 | 15 | 5 | 15 | 5 | 15 |
| 5 | 15 | −180 | −175 | 165 | 175 | 5 | 15 | 5 | 15 | 145 | 155 |
| 5 | 15 | −175 | −165 | −155 | −145 | 5 | 15 | 15 | 25 | −175 | −165 |
| 5 | 15 | −175 | −165 | −15 | −5 | 5 | 15 | 15 | 25 | 5 | 15 |
| 5 | 15 | −175 | −165 | 25 | 35 | 5 | 15 | 65 | 75 | −95 | −85 |
| 5 | 15 | −175 | −165 | 165 | 175 | 5 | 15 | 65 | 75 | 85 | 95 |
| 5 | 15 | −165 | −155 | −15 | −5 | 5 | 15 | 75 | 85 | −25 | −15 |
| 5 | 15 | −165 | −155 | 165 | 175 | 5 | 15 | 75 | 85 | 155 | 165 |
| 5 | 15 | −115 | −105 | −95 | −85 | 5 | 15 | 85 | 95 | −115 | −105 |
| 5 | 15 | −115 | −105 | 85 | 95 | 5 | 15 | 85 | 95 | −75 | −65 |
| 5 | 15 | −105 | −95 | −165 | −155 | 5 | 15 | 85 | 95 | 65 | 75 |
| 5 | 15 | −105 | −95 | 15 | 25 | 5 | 15 | 85 | 95 | 105 | 115 |
| 5 | 15 | −95 | −85 | −115 | −105 | 5 | 15 | 95 | 105 | −165 | −155 |
| 5 | 15 | −95 | −85 | −75 | −65 | 5 | 15 | 95 | 105 | 15 | 25 |
| 5 | 15 | −95 | −85 | 65 | 75 | 5 | 15 | 105 | 115 | −95 | −85 |
| 5 | 15 | −95 | −85 | 105 | 115 | 5 | 15 | 105 | 115 | 85 | 95 |
| 5 | 15 | −85 | −75 | −25 | −15 | 5 | 15 | 155 | 165 | −15 | −5 |
| 5 | 15 | −85 | −75 | 155 | 165 | 5 | 15 | 155 | 165 | 165 | 175 |
| 5 | 15 | −75 | −65 | −95 | −85 | 5 | 15 | 165 | 175 | −155 | −145 |
| 5 | 15 | −75 | −65 | 85 | 95 | 5 | 15 | 165 | 175 | −15 | −5 |
| 5 | 15 | −25 | −15 | −175 | −165 | 5 | 15 | 165 | 175 | 25 | 35 |
| 5 | 15 | −25 | −15 | 5 | 15 | 5 | 15 | 165 | 175 | 165 | 175 |
| 5 | 15 | −15 | −5 | −175 | −165 | 5 | 15 | 175 | 180 | −155 | −145 |
| 5 | 15 | −15 | −5 | −35 | −25 | 5 | 15 | 175 | 180 | −105 | −95 |
| 5 | 15 | −15 | −5 | 5 | 15 | 5 | 15 | 175 | 180 | −65 | −55 |
| 5 | 15 | −15 | −5 | 145 | 155 | 5 | 15 | 175 | 180 | −15 | −5 |
| 5 | 15 | −5 | 5 | −175 | −165 | 5 | 15 | 175 | 180 | 25 | 35 |
| 5 | 15 | −5 | 5 | −125 | −115 | 5 | 15 | 175 | 180 | 75 | 85 |
| 5 | 15 | −5 | 5 | −85 | −75 | 5 | 15 | 175 | 180 | 115 | 125 |
| 5 | 15 | −5 | 5 | −35 | −25 | 5 | 15 | 175 | 180 | 165 | 175 |

TABLE 25

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 15 | 25 | −180 | −175 | −180 | −175 | 15 | 25 | −45 | −35 | 175 | 180 |
| 15 | 25 | −180 | −175 | −145 | −135 | 15 | 25 | −35 | −25 | −180 | −175 |
| 15 | 25 | −180 | −175 | −95 | −85 | 15 | 25 | −35 | −25 | −5 | 5 |
| 15 | 25 | −180 | −175 | −55 | −45 | 15 | 25 | −35 | −25 | 175 | 180 |
| 15 | 25 | −180 | −175 | −5 | 5 | 15 | 25 | −25 | −15 | −180 | −175 |
| 15 | 25 | −180 | −175 | 35 | 45 | 15 | 25 | −25 | −15 | −5 | 5 |
| 15 | 25 | −180 | −175 | 85 | 95 | 15 | 25 | −25 | −15 | 175 | 180 |
| 15 | 25 | −180 | −175 | 125 | 135 | 15 | 25 | −15 | −5 | −180 | −175 |
| 15 | 25 | −180 | −175 | 175 | 180 | 15 | 25 | −15 | −5 | −45 | −35 |
| 15 | 25 | −175 | −165 | −180 | −175 | 15 | 25 | −15 | −5 | −5 | 5 |
| 15 | 25 | −175 | −165 | −145 | −135 | 15 | 25 | −15 | −5 | 135 | 145 |
| 15 | 25 | −175 | −165 | −5 | 5 | 15 | 25 | −15 | −5 | 175 | 180 |
| 15 | 25 | −175 | −165 | 35 | 45 | 15 | 25 | −5 | 5 | −180 | −175 |
| 15 | 25 | −175 | −165 | 175 | 180 | 15 | 25 | −5 | 5 | −135 | −125 |
| 15 | 25 | −165 | −155 | −180 | −175 | 15 | 25 | −5 | 5 | −95 | −85 |
| 15 | 25 | −165 | −155 | −5 | 5 | 15 | 25 | −5 | 5 | −45 | −35 |
| 15 | 25 | −165 | −155 | 175 | 180 | 15 | 25 | −5 | 5 | −5 | 5 |
| 15 | 25 | −155 | −145 | −180 | −175 | 15 | 25 | −5 | 5 | 45 | 55 |
| 15 | 25 | −155 | −145 | −5 | 5 | 15 | 25 | −5 | 5 | 85 | 95 |
| 15 | 25 | −155 | −145 | 175 | 180 | 15 | 25 | −5 | 5 | 135 | 145 |
| 15 | 25 | −145 | −135 | −180 | −175 | 15 | 25 | −5 | 5 | 175 | 180 |
| 15 | 25 | −145 | −135 | −5 | 5 | 15 | 25 | 5 | 15 | −180 | −175 |
| 15 | 25 | −145 | −135 | 175 | 180 | 15 | 25 | 5 | 15 | −45 | −35 |
| 15 | 25 | −135 | −125 | −180 | −175 | 15 | 25 | 5 | 15 | −5 | 5 |
| 15 | 25 | −135 | −125 | −5 | 5 | 15 | 25 | 5 | 15 | 135 | 145 |
| 15 | 25 | −135 | −125 | 175 | 180 | 15 | 25 | 5 | 15 | 175 | 180 |
| 15 | 25 | −125 | −115 | −180 | −175 | 15 | 25 | 15 | 25 | −180 | −175 |
| 15 | 25 | −125 | −115 | −5 | 5 | 15 | 25 | 15 | 25 | −5 | 5 |
| 15 | 25 | −125 | −115 | 175 | 180 | 15 | 25 | 15 | 25 | 175 | 180 |
| 15 | 25 | −115 | −105 | −180 | −175 | 15 | 25 | 25 | 35 | −180 | −175 |
| 15 | 25 | −115 | −105 | −95 | −85 | 15 | 25 | 25 | 35 | −5 | 5 |
| 15 | 25 | −115 | −105 | −5 | 5 | 15 | 25 | 25 | 35 | 175 | 180 |
| 15 | 25 | −115 | −105 | 85 | 95 | 15 | 25 | 35 | 45 | −180 | −175 |

TABLE 25-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 15 | 25 | −115 | −105 | 175 | 180 | 15 | 25 | 35 | 45 | −5 | 5 |
| 15 | 25 | −105 | −95 | −180 | −175 | 15 | 25 | 35 | 45 | 175 | 180 |
| 15 | 25 | −105 | −95 | −5 | 5 | 15 | 25 | 45 | 55 | −180 | −175 |
| 15 | 25 | −105 | −95 | 175 | 180 | 15 | 25 | 45 | 55 | −5 | 5 |
| 15 | 25 | −95 | −85 | −180 | −175 | 15 | 25 | 45 | 55 | 175 | 180 |
| 15 | 25 | −95 | −85 | −115 | −105 | 15 | 25 | 55 | 65 | −180 | −175 |
| 15 | 25 | −95 | −85 | −75 | −65 | 15 | 25 | 55 | 65 | −5 | 5 |
| 15 | 25 | −95 | −85 | −5 | 5 | 15 | 25 | 55 | 65 | 175 | 180 |
| 15 | 25 | −95 | −85 | 65 | 75 | 15 | 25 | 65 | 75 | −180 | −175 |
| 15 | 25 | −95 | −85 | 105 | 115 | 15 | 25 | 65 | 75 | −95 | −85 |
| 15 | 25 | −95 | −85 | 175 | 180 | 15 | 25 | 65 | 75 | −5 | 5 |
| 15 | 25 | −85 | −75 | −180 | −175 | 15 | 25 | 65 | 75 | 85 | 95 |
| 15 | 25 | −85 | −75 | −5 | 5 | 15 | 25 | 65 | 75 | 175 | 180 |
| 15 | 25 | −85 | −75 | 175 | 180 | 15 | 25 | 75 | 85 | −180 | −175 |
| 15 | 25 | −75 | −65 | −180 | −175 | 15 | 25 | 75 | 85 | −5 | 5 |
| 15 | 25 | −75 | −65 | −95 | −85 | 15 | 25 | 75 | 85 | 175 | 180 |
| 15 | 25 | −75 | −65 | −5 | 5 | 15 | 25 | 85 | 95 | −180 | −175 |
| 15 | 25 | −75 | −65 | 85 | 95 | 15 | 25 | 85 | 95 | −115 | −105 |
| 15 | 25 | −75 | −65 | 175 | 180 | 15 | 25 | 85 | 95 | −75 | −65 |
| 15 | 25 | −65 | −55 | −180 | −175 | 15 | 25 | 85 | 95 | −5 | 5 |
| 15 | 25 | −65 | −55 | −5 | 5 | 15 | 25 | 85 | 95 | 65 | 75 |
| 15 | 25 | −65 | −55 | 175 | 180 | 15 | 25 | 85 | 95 | 105 | 115 |
| 15 | 25 | −55 | −45 | −180 | −175 | 15 | 25 | 85 | 95 | 175 | 180 |
| 15 | 25 | −55 | −45 | −5 | 5 | 15 | 25 | 95 | 105 | −180 | −175 |
| 15 | 25 | −55 | −45 | 175 | 180 | 15 | 25 | 95 | 105 | −5 | 5 |
| 15 | 25 | −45 | −35 | −180 | −175 | 15 | 25 | 95 | 105 | 175 | 180 |
| 15 | 25 | −45 | −35 | −5 | 5 | 15 | 25 | 105 | 115 | −180 | −175 |

TABLE 26

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 15 | 25 | 105 | 115 | −95 | −85 | 15 | 25 | 155 | 165 | −5 | 5 |
| 15 | 25 | 105 | 115 | −5 | 5 | 15 | 25 | 155 | 165 | 175 | 180 |
| 15 | 25 | 105 | 115 | 85 | 95 | 15 | 25 | 165 | 175 | −180 | −175 |
| 15 | 25 | 105 | 115 | 175 | 180 | 15 | 25 | 165 | 175 | −145 | −135 |
| 15 | 25 | 115 | 125 | −180 | −175 | 15 | 25 | 165 | 175 | −5 | 5 |
| 15 | 25 | 115 | 125 | −5 | 5 | 15 | 25 | 165 | 175 | 35 | 45 |
| 15 | 25 | 115 | 125 | 175 | 180 | 15 | 25 | 165 | 175 | 175 | 180 |
| 15 | 25 | 125 | 135 | −180 | −175 | 15 | 25 | 175 | 180 | −180 | −175 |
| 15 | 25 | 125 | 135 | −5 | 5 | 15 | 25 | 175 | 180 | −145 | −135 |
| 15 | 25 | 125 | 135 | 175 | 180 | 15 | 25 | 175 | 180 | −95 | −85 |
| 15 | 25 | 135 | 145 | −180 | −175 | 15 | 25 | 175 | 180 | −55 | −45 |
| 15 | 25 | 135 | 145 | −5 | 5 | 15 | 25 | 175 | 180 | −5 | 5 |
| 15 | 25 | 135 | 145 | 175 | 180 | 15 | 25 | 175 | 180 | 35 | 45 |
| 15 | 25 | 145 | 155 | −180 | −175 | 15 | 25 | 175 | 180 | 85 | 95 |
| 15 | 25 | 145 | 155 | −5 | 5 | 15 | 25 | 175 | 180 | 125 | 135 |
| 15 | 25 | 145 | 155 | 175 | 180 | 15 | 25 | 175 | 180 | 175 | 180 |
| 15 | 25 | 155 | 165 | −180 | −175 | | | | | | |

TABLE 27

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 25 | 35 | −180 | −175 | −175 | −165 | 25 | 35 | −5 | 5 | 35 | 45 |
| 25 | 35 | −180 | −175 | −135 | −125 | 25 | 35 | −5 | 5 | 75 | 85 |
| 25 | 35 | −180 | −175 | −85 | −75 | 25 | 35 | −5 | 5 | 125 | 135 |
| 25 | 35 | −180 | −175 | −45 | −35 | 25 | 35 | −5 | 5 | 165 | 175 |
| 25 | 35 | −180 | −175 | 5 | 15 | 25 | 35 | 5 | 15 | −15 | −5 |
| 25 | 35 | −180 | −175 | 45 | 55 | 25 | 35 | 5 | 15 | 165 | 175 |

TABLE 27-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 25 | 35 | −180 | −175 | 95 | 105 | 25 | 35 | 25 | 35 | −45 | −35 |
| 25 | 35 | −180 | −175 | 135 | 145 | 25 | 35 | 25 | 35 | 135 | 145 |
| 25 | 35 | −175 | −165 | −175 | −165 | 25 | 35 | 35 | 45 | −35 | −25 |
| 25 | 35 | −175 | −165 | 5 | 15 | 25 | 35 | 35 | 45 | 145 | 155 |
| 25 | 35 | −155 | −145 | −145 | −135 | 25 | 35 | 135 | 145 | −155 | −145 |
| 25 | 35 | −155 | −145 | 35 | 45 | 25 | 35 | 135 | 145 | 25 | 35 |
| 25 | 35 | −145 | −135 | −155 | −145 | 25 | 35 | 145 | 155 | −145 | −135 |
| 25 | 35 | −145 | −135 | 25 | 35 | 25 | 35 | 145 | 155 | 35 | 45 |
| 25 | 35 | −45 | −35 | −35 | −25 | 25 | 35 | 165 | 175 | −175 | −165 |
| 25 | 35 | −45 | −35 | 145 | 155 | 25 | 35 | 165 | 175 | 5 | 15 |
| 25 | 35 | −35 | −25 | −45 | −35 | 25 | 35 | 175 | 180 | −175 | −165 |
| 25 | 35 | −35 | −25 | 135 | 145 | 25 | 35 | 175 | 180 | −135 | −125 |
| 25 | 35 | −15 | −5 | −15 | −5 | 25 | 35 | 175 | 180 | −85 | −75 |
| 25 | 35 | −15 | −5 | 165 | 175 | 25 | 35 | 175 | 180 | −45 | −35 |
| 25 | 35 | −5 | 5 | −145 | −135 | 25 | 35 | 175 | 180 | 5 | 15 |
| 25 | 35 | −5 | 5 | −105 | −95 | 25 | 35 | 175 | 180 | 45 | 55 |
| 25 | 35 | −5 | 5 | −55 | −45 | 25 | 35 | 175 | 180 | 95 | 105 |
| 25 | 35 | −5 | 5 | −15 | −5 | 25 | 35 | 175 | 180 | 135 | 145 |

TABLE 28

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 35 | 45 | −180 | −175 | −165 | −155 | 35 | 45 | −5 | 5 | 25 | 35 |
| 35 | 45 | −180 | −175 | −125 | −115 | 35 | 45 | −5 | 5 | 65 | 75 |
| 35 | 45 | −180 | −175 | −75 | −65 | 35 | 45 | −5 | 5 | 115 | 125 |
| 35 | 45 | −180 | −175 | −35 | −25 | 35 | 45 | −5 | 5 | 155 | 165 |
| 35 | 45 | −180 | −175 | 15 | 25 | 35 | 45 | 175 | 180 | −165 | −155 |
| 35 | 45 | −180 | −175 | 55 | 65 | 35 | 45 | 175 | 180 | −125 | −115 |
| 35 | 45 | −180 | −175 | 105 | 115 | 35 | 45 | 175 | 180 | −75 | −65 |
| 35 | 45 | −180 | −175 | 145 | 155 | 35 | 45 | 175 | 180 | −35 | −25 |
| 35 | 45 | −5 | 5 | −155 | −145 | 35 | 45 | 175 | 180 | 15 | 25 |
| 35 | 45 | −5 | 5 | −115 | −105 | 35 | 45 | 175 | 180 | 55 | 65 |
| 35 | 45 | −5 | 5 | −65 | −55 | 35 | 45 | 175 | 180 | 105 | 115 |
| 35 | 45 | −5 | 5 | −25 | −15 | 35 | 45 | 175 | 180 | 145 | 155 |

TABLE 29

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 45 | 55 | −180 | −175 | −155 | −145 | 45 | 55 | −5 | 5 | 15 | 25 |
| 45 | 55 | −180 | −175 | −115 | −105 | 45 | 55 | −5 | 5 | 55 | 65 |
| 45 | 55 | −180 | −175 | −65 | −55 | 45 | 55 | −5 | 5 | 105 | 115 |
| 45 | 55 | −180 | −175 | −25 | −15 | 45 | 55 | −5 | 5 | 145 | 155 |
| 45 | 55 | −180 | −175 | 25 | 35 | 45 | 55 | 175 | 180 | −155 | −145 |
| 45 | 55 | −180 | −175 | 65 | 75 | 45 | 55 | 175 | 180 | −115 | −105 |
| 45 | 55 | −180 | −175 | 115 | 125 | 45 | 55 | 175 | 180 | −65 | −55 |
| 45 | 55 | −180 | −175 | 155 | 165 | 45 | 55 | 175 | 180 | −25 | −15 |
| 45 | 55 | −5 | 5 | −165 | −155 | 45 | 55 | 175 | 180 | 25 | 35 |
| 45 | 55 | −5 | 5 | −125 | −115 | 45 | 55 | 175 | 180 | 65 | 75 |
| 45 | 55 | −5 | 5 | −75 | −65 | 45 | 55 | 175 | 180 | 115 | 125 |
| 45 | 55 | −5 | 5 | −35 | −25 | 45 | 55 | 175 | 180 | 155 | 165 |

TABLE 30

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 55 | 65 | −180 | −175 | −145 | −135 | 55 | 65 | −5 | 5 | 5 | 15 |
| 55 | 65 | −180 | −175 | −105 | −95 | 55 | 65 | −5 | 5 | 45 | 55 |
| 55 | 65 | −180 | −175 | −55 | −45 | 55 | 65 | −5 | 5 | 95 | 105 |
| 55 | 65 | −180 | −175 | −15 | −5 | 55 | 65 | −5 | 5 | 135 | 145 |
| 55 | 65 | −180 | −175 | 35 | 45 | 55 | 65 | 5 | 15 | −175 | −165 |
| 55 | 65 | −180 | −175 | 75 | 85 | 55 | 65 | 5 | 15 | 5 | 15 |
| 55 | 65 | −180 | −175 | 125 | 135 | 55 | 65 | 25 | 35 | −145 | −135 |
| 55 | 65 | −180 | −175 | 165 | 175 | 55 | 65 | 25 | 35 | 35 | 45 |
| 55 | 65 | −175 | −165 | −15 | −5 | 55 | 65 | 35 | 45 | −155 | −145 |
| 55 | 65 | −175 | −165 | 165 | 175 | 55 | 65 | 35 | 45 | 25 | 35 |
| 55 | 65 | −155 | −145 | −45 | −35 | 55 | 65 | 135 | 145 | −35 | −25 |
| 55 | 65 | −155 | −145 | 135 | 145 | 55 | 65 | 135 | 145 | 145 | 155 |
| 55 | 65 | −145 | −135 | −35 | −25 | 55 | 65 | 145 | 155 | −45 | −35 |
| 55 | 65 | −145 | −135 | 145 | 155 | 55 | 65 | 145 | 155 | 135 | 145 |
| 55 | 65 | −45 | −35 | −155 | −145 | 55 | 65 | 165 | 175 | −15 | −5 |
| 55 | 65 | −45 | −35 | 25 | 35 | 55 | 65 | 165 | 175 | 165 | 175 |
| 55 | 65 | −35 | −25 | −145 | −135 | 55 | 65 | 175 | 180 | −145 | −135 |
| 55 | 65 | −35 | −25 | 35 | 45 | 55 | 65 | 175 | 180 | −105 | −95 |
| 55 | 65 | −15 | −5 | −175 | −165 | 55 | 65 | 175 | 180 | −55 | −45 |
| 55 | 65 | −15 | −5 | 5 | 15 | 55 | 65 | 175 | 180 | −15 | −5 |
| 55 | 65 | −5 | 5 | −175 | −165 | 55 | 65 | 175 | 180 | 35 | 45 |
| 55 | 65 | −5 | 5 | −135 | −125 | 55 | 65 | 175 | 180 | 75 | 85 |
| 55 | 65 | −5 | 5 | −85 | −75 | 55 | 65 | 175 | 180 | 125 | 135 |
| 55 | 65 | −5 | 5 | −45 | −35 | 55 | 65 | 175 | 180 | 165 | 175 |

TABLE 31

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 65 | 75 | −180 | −175 | −180 | −175 | 65 | 75 | −45 | −35 | 175 | 180 |
| 65 | 75 | −180 | −175 | −135 | −125 | 65 | 75 | −35 | −25 | −180 | −175 |
| 65 | 75 | −180 | −175 | −95 | −85 | 65 | 75 | −35 | −25 | −5 | 5 |
| 65 | 75 | −180 | −175 | −45 | −35 | 65 | 75 | −35 | −25 | 175 | 180 |
| 65 | 75 | −180 | −175 | −5 | 5 | 65 | 75 | −25 | −15 | −180 | −175 |
| 65 | 75 | −180 | −175 | 45 | 55 | 65 | 75 | −25 | −15 | −5 | 5 |
| 65 | 75 | −180 | −175 | 85 | 95 | 65 | 75 | −25 | −15 | 175 | 180 |
| 65 | 75 | −180 | −175 | 135 | 145 | 65 | 75 | −15 | −5 | −180 | −175 |
| 65 | 75 | −180 | −175 | 175 | 180 | 65 | 75 | −15 | −5 | −145 | −135 |
| 65 | 75 | −175 | −165 | −180 | −175 | 65 | 75 | −15 | −5 | −5 | 5 |
| 65 | 75 | −175 | −165 | −45 | −35 | 65 | 75 | −15 | −5 | 35 | 45 |
| 65 | 75 | −175 | −165 | −5 | 5 | 65 | 75 | −15 | −5 | 175 | 180 |
| 65 | 75 | −175 | −165 | 135 | 145 | 65 | 75 | −5 | 5 | −180 | −175 |
| 65 | 75 | −175 | −165 | 175 | 180 | 65 | 75 | −5 | 5 | −145 | −135 |
| 65 | 75 | −165 | −155 | −180 | −175 | 65 | 75 | −5 | 5 | −95 | −85 |
| 65 | 75 | −165 | −155 | −5 | 5 | 65 | 75 | −5 | 5 | −55 | −45 |
| 65 | 75 | −165 | −155 | 175 | 180 | 65 | 75 | −5 | 5 | −5 | 5 |
| 65 | 75 | −155 | −145 | −180 | −175 | 65 | 75 | −5 | 5 | 35 | 45 |
| 65 | 75 | −155 | −145 | −5 | 5 | 65 | 75 | −5 | 5 | 85 | 95 |
| 65 | 75 | −155 | −145 | 175 | 180 | 65 | 75 | −5 | 5 | 125 | 135 |
| 65 | 75 | −145 | −135 | −180 | −175 | 65 | 75 | −5 | 5 | 175 | 180 |
| 65 | 75 | −145 | −135 | −5 | 5 | 65 | 75 | 5 | 15 | −180 | −175 |
| 65 | 75 | −145 | −135 | 175 | 180 | 65 | 75 | 5 | 15 | −145 | −135 |
| 65 | 75 | −135 | −125 | −180 | −175 | 65 | 75 | 5 | 15 | −5 | 5 |
| 65 | 75 | −135 | −125 | −5 | 5 | 65 | 75 | 5 | 15 | 35 | 45 |
| 65 | 75 | −135 | −125 | 175 | 180 | 65 | 75 | 5 | 15 | 175 | 180 |
| 65 | 75 | −125 | −115 | −180 | −175 | 65 | 75 | 15 | 25 | −180 | −175 |
| 65 | 75 | −125 | −115 | −5 | 5 | 65 | 75 | 15 | 25 | −5 | 5 |
| 65 | 75 | −125 | −115 | 175 | 180 | 65 | 75 | 15 | 25 | 175 | 180 |
| 65 | 75 | −115 | −105 | −180 | −175 | 65 | 75 | 25 | 35 | −180 | −175 |
| 65 | 75 | −115 | −105 | −95 | −85 | 65 | 75 | 25 | 35 | −5 | 5 |
| 65 | 75 | −115 | −105 | −5 | 5 | 65 | 75 | 25 | 35 | 175 | 180 |
| 65 | 75 | −115 | −105 | 85 | 95 | 65 | 75 | 35 | 45 | −180 | −175 |
| 65 | 75 | −115 | −105 | 175 | 180 | 65 | 75 | 35 | 45 | −5 | 5 |
| 65 | 75 | −105 | −95 | −180 | −175 | 65 | 75 | 35 | 45 | 175 | 180 |
| 65 | 75 | −105 | −95 | −5 | 5 | 65 | 75 | 45 | 55 | −180 | −175 |
| 65 | 75 | −105 | −95 | 175 | 180 | 65 | 75 | 45 | 55 | −5 | 5 |
| 65 | 75 | −95 | −85 | −180 | −175 | 65 | 75 | 45 | 55 | 175 | 180 |
| 65 | 75 | −95 | −85 | −115 | −105 | 65 | 75 | 55 | 65 | −180 | −175 |
| 65 | 75 | −95 | −85 | −75 | −65 | 65 | 75 | 55 | 65 | −5 | 5 |

TABLE 31-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 65 | 75 | −95 | −85 | −5 | 5 | 65 | 75 | 55 | 65 | 175 | 180 |
| 65 | 75 | −95 | −85 | 65 | 75 | 65 | 75 | 65 | 75 | −180 | −175 |
| 65 | 75 | −95 | −85 | 105 | 115 | 65 | 75 | 65 | 75 | −95 | −85 |
| 65 | 75 | −95 | −85 | 175 | 180 | 65 | 75 | 65 | 75 | −5 | 5 |
| 65 | 75 | −85 | −75 | −180 | −175 | 65 | 75 | 65 | 75 | 85 | 95 |
| 65 | 75 | −85 | −75 | −5 | 5 | 65 | 75 | 65 | 75 | 175 | 180 |
| 65 | 75 | −85 | −75 | 175 | 180 | 65 | 75 | 75 | 85 | −180 | −175 |
| 65 | 75 | −75 | −65 | −180 | −175 | 65 | 75 | 75 | 85 | −5 | 5 |
| 65 | 75 | −75 | −65 | −95 | −85 | 65 | 75 | 75 | 85 | 175 | 180 |
| 65 | 75 | −75 | −65 | −5 | 5 | 65 | 75 | 85 | 95 | −180 | −175 |
| 65 | 75 | −75 | −65 | 85 | 95 | 65 | 75 | 85 | 95 | −115 | −105 |
| 65 | 75 | −75 | −65 | 175 | 180 | 65 | 75 | 85 | 95 | −75 | −65 |
| 65 | 75 | −65 | −55 | −180 | −175 | 65 | 75 | 85 | 95 | −5 | 5 |
| 65 | 75 | −65 | −55 | −5 | 5 | 65 | 75 | 85 | 95 | 65 | 75 |
| 65 | 75 | −65 | −55 | 175 | 180 | 65 | 75 | 85 | 95 | 105 | 115 |
| 65 | 75 | −55 | −45 | −180 | −175 | 65 | 75 | 85 | 95 | 175 | 180 |
| 65 | 75 | −55 | −45 | −5 | 5 | 65 | 75 | 95 | 105 | −180 | −175 |
| 65 | 75 | −55 | −45 | 175 | 180 | 65 | 75 | 95 | 105 | −5 | 5 |
| 65 | 75 | −45 | −35 | −180 | −175 | 65 | 75 | 95 | 105 | 175 | 180 |
| 65 | 75 | −45 | −35 | −5 | 5 | 65 | 75 | 105 | 115 | −180 | −175 |

TABLE 32

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 65 | 75 | 105 | 115 | −95 | −85 | 65 | 75 | 155 | 165 | −5 | 5 |
| 65 | 75 | 105 | 115 | −5 | 5 | 65 | 75 | 155 | 165 | 175 | 180 |
| 65 | 75 | 105 | 115 | 85 | 95 | 65 | 75 | 165 | 175 | −180 | −175 |
| 65 | 75 | 105 | 115 | 175 | 180 | 65 | 75 | 165 | 175 | −45 | −35 |
| 65 | 75 | 115 | 125 | −180 | −175 | 65 | 75 | 165 | 175 | −5 | 5 |
| 65 | 75 | 115 | 125 | −5 | 5 | 65 | 75 | 165 | 175 | 135 | 145 |
| 65 | 75 | 115 | 125 | 175 | 180 | 65 | 75 | 165 | 175 | 175 | 180 |
| 65 | 75 | 125 | 135 | −180 | −175 | 65 | 75 | 175 | 180 | −180 | −175 |
| 65 | 75 | 125 | 135 | −5 | 5 | 65 | 75 | 175 | 180 | −135 | −125 |
| 65 | 75 | 125 | 135 | 175 | 180 | 65 | 75 | 175 | 180 | −95 | −85 |
| 65 | 75 | 135 | 145 | −180 | −175 | 65 | 75 | 175 | 180 | −45 | −35 |
| 65 | 75 | 135 | 145 | −5 | 5 | 65 | 75 | 175 | 180 | −5 | 5 |
| 65 | 75 | 135 | 145 | 175 | 180 | 65 | 75 | 175 | 180 | 45 | 55 |
| 65 | 75 | 145 | 155 | −180 | −175 | 65 | 75 | 175 | 180 | 85 | 95 |
| 65 | 75 | 145 | 155 | −5 | 5 | 65 | 75 | 175 | 180 | 135 | 145 |
| 65 | 75 | 145 | 155 | 175 | 180 | 65 | 75 | 175 | 180 | 175 | 180 |
| 65 | 75 | 155 | 165 | −180 | −175 | | | | | | |

TABLE 33

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 75 | 85 | −180 | −175 | −175 | −165 | 75 | 85 | −5 | 5 | 25 | 35 |
| 75 | 85 | −180 | −175 | −125 | −115 | 75 | 85 | −5 | 5 | 75 | 85 |
| 75 | 85 | −180 | −175 | −85 | −75 | 75 | 85 | −5 | 5 | 115 | 125 |
| 75 | 85 | −180 | −175 | −35 | −25 | 75 | 85 | −5 | 5 | 165 | 175 |
| 75 | 85 | −180 | −175 | 5 | 15 | 75 | 85 | 5 | 15 | −155 | −145 |
| 75 | 85 | −180 | −175 | 55 | 65 | 75 | 85 | 5 | 15 | −15 | −5 |
| 75 | 85 | −180 | −175 | 95 | 105 | 75 | 85 | 5 | 15 | 25 | 35 |
| 75 | 85 | −180 | −175 | 145 | 155 | 75 | 85 | 5 | 15 | 165 | 175 |
| 75 | 85 | −175 | −165 | −175 | −165 | 75 | 85 | 15 | 25 | −15 | −5 |
| 75 | 85 | −175 | −165 | −35 | −25 | 75 | 85 | 15 | 25 | 165 | 175 |
| 75 | 85 | −175 | −165 | 5 | 15 | 75 | 85 | 65 | 75 | −95 | −85 |
| 75 | 85 | −175 | −165 | 145 | 155 | 75 | 85 | 65 | 75 | 85 | 95 |
| 75 | 85 | −165 | −155 | −175 | −165 | 75 | 85 | 75 | 85 | −165 | −155 |

TABLE 33-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 75 | 85 | −165 | −155 | 5 | 15 | 75 | 85 | 75 | 85 | 15 | 25 |
| 75 | 85 | −115 | −105 | −95 | −85 | 75 | 85 | 85 | 95 | −115 | −105 |
| 75 | 85 | −115 | −105 | 85 | 95 | 75 | 85 | 85 | 95 | −75 | −65 |
| 75 | 85 | −105 | −95 | −25 | −15 | 75 | 85 | 85 | 95 | 65 | 75 |
| 75 | 85 | −105 | −95 | 155 | 165 | 75 | 85 | 85 | 95 | 105 | 115 |
| 75 | 85 | −95 | −85 | −115 | −105 | 75 | 85 | 95 | 105 | −25 | −15 |
| 75 | 85 | −95 | −85 | −75 | −65 | 75 | 85 | 95 | 105 | 155 | 165 |
| 75 | 85 | −95 | −85 | 65 | 75 | 75 | 85 | 105 | 115 | −95 | −85 |
| 75 | 85 | −95 | −85 | 105 | 115 | 75 | 85 | 105 | 115 | 85 | 95 |
| 75 | 85 | −85 | −75 | −165 | −155 | 75 | 85 | 155 | 165 | −175 | −165 |
| 75 | 85 | −85 | −75 | 15 | 25 | 75 | 85 | 155 | 165 | 5 | 15 |
| 75 | 85 | −75 | −65 | −95 | −85 | 75 | 85 | 165 | 175 | −175 | −165 |
| 75 | 85 | −75 | −65 | 85 | 95 | 75 | 85 | 165 | 175 | −35 | −25 |
| 75 | 85 | −25 | −15 | −15 | −5 | 75 | 85 | 165 | 175 | 5 | 15 |
| 75 | 85 | −25 | −15 | 165 | 175 | 75 | 85 | 165 | 175 | 145 | 155 |
| 75 | 85 | −15 | −5 | −155 | −145 | 75 | 85 | 175 | 180 | −175 | −165 |
| 75 | 85 | −15 | −5 | −15 | −5 | 75 | 85 | 175 | 180 | −125 | −115 |
| 75 | 85 | −15 | −5 | 25 | 35 | 75 | 85 | 175 | 180 | −85 | −75 |
| 75 | 85 | −15 | −5 | 165 | 175 | 75 | 85 | 175 | 180 | −35 | −25 |
| 75 | 85 | −5 | 5 | −155 | −145 | 75 | 85 | 175 | 180 | 5 | 15 |
| 75 | 85 | −5 | 5 | −105 | −95 | 75 | 85 | 175 | 180 | 55 | 65 |
| 75 | 85 | −5 | 5 | −65 | −55 | 75 | 85 | 175 | 180 | 95 | 105 |
| 75 | 85 | −5 | 5 | −15 | −5 | 75 | 85 | 175 | 180 | 145 | 155 |

TABLE 34

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 85 | 95 | −180 | −175 | −165 | −155 | 85 | 95 | −5 | 5 | 15 | 25 |
| 85 | 95 | −180 | −175 | −115 | −105 | 85 | 95 | −5 | 5 | 65 | 75 |
| 85 | 95 | −180 | −175 | −75 | −65 | 85 | 95 | −5 | 5 | 105 | 115 |
| 85 | 95 | −180 | −175 | −25 | −15 | 85 | 95 | −5 | 5 | 155 | 165 |
| 85 | 95 | −180 | −175 | 15 | 25 | 85 | 95 | 5 | 15 | −165 | −155 |
| 85 | 95 | −180 | −175 | 65 | 75 | 85 | 95 | 5 | 15 | −25 | −15 |
| 85 | 95 | −180 | −175 | 105 | 115 | 85 | 95 | 5 | 15 | 15 | 25 |
| 85 | 95 | −180 | −175 | 155 | 165 | 85 | 95 | 5 | 15 | 155 | 165 |
| 85 | 95 | −175 | −165 | −165 | −155 | 85 | 95 | 15 | 25 | −165 | −155 |
| 85 | 95 | −175 | −165 | −25 | −15 | 85 | 95 | 15 | 25 | −95 | −85 |
| 85 | 95 | −175 | −165 | 15 | 25 | 85 | 95 | 15 | 25 | −25 | −15 |
| 85 | 95 | −175 | −165 | 155 | 165 | 85 | 95 | 15 | 25 | 15 | 25 |
| 85 | 95 | −165 | −155 | −165 | −155 | 85 | 95 | 15 | 25 | 85 | 95 |
| 85 | 95 | −165 | −155 | −95 | −85 | 85 | 95 | 15 | 25 | 155 | 165 |
| 85 | 95 | −165 | −155 | −25 | −15 | 85 | 95 | 65 | 75 | −165 | −155 |
| 85 | 95 | −165 | −155 | 15 | 25 | 85 | 95 | 65 | 75 | −95 | −85 |
| 85 | 95 | −165 | −155 | 85 | 95 | 85 | 95 | 65 | 75 | −25 | −15 |
| 85 | 95 | −165 | −155 | 155 | 165 | 85 | 95 | 65 | 75 | 15 | 25 |
| 85 | 95 | −115 | −105 | −165 | −155 | 85 | 95 | 65 | 75 | 85 | 95 |
| 85 | 95 | −115 | −105 | −95 | −85 | 85 | 95 | 65 | 75 | 155 | 165 |
| 85 | 95 | −115 | −105 | −25 | −15 | 85 | 95 | 75 | 85 | −165 | −155 |
| 85 | 95 | −115 | −105 | 15 | 25 | 85 | 95 | 75 | 85 | −25 | −15 |
| 85 | 95 | −115 | −105 | 85 | 95 | 85 | 95 | 75 | 85 | 15 | 25 |
| 85 | 95 | −115 | −105 | 155 | 165 | 85 | 95 | 75 | 85 | 155 | 165 |
| 85 | 95 | −105 | −95 | −165 | −155 | 85 | 95 | 85 | 95 | −165 | −155 |
| 85 | 95 | −105 | −95 | −25 | −15 | 85 | 95 | 85 | 95 | −115 | −105 |
| 85 | 95 | −105 | −95 | 15 | 25 | 85 | 95 | 85 | 95 | −75 | −65 |
| 85 | 95 | −105 | −95 | 155 | 165 | 85 | 95 | 85 | 95 | −25 | −15 |
| 85 | 95 | −95 | −85 | −165 | −155 | 85 | 95 | 85 | 95 | 15 | 25 |
| 85 | 95 | −95 | −85 | −115 | −105 | 85 | 95 | 85 | 95 | 65 | 75 |
| 85 | 95 | −95 | −85 | −75 | −65 | 85 | 95 | 85 | 95 | 105 | 115 |
| 85 | 95 | −95 | −85 | −25 | −15 | 85 | 95 | 85 | 95 | 155 | 165 |
| 85 | 95 | −95 | −85 | 15 | 25 | 85 | 95 | 95 | 105 | −165 | −155 |
| 85 | 95 | −95 | −85 | 65 | 75 | 85 | 95 | 95 | 105 | −25 | −15 |
| 85 | 95 | −95 | −85 | 105 | 115 | 85 | 95 | 95 | 105 | 15 | 25 |
| 85 | 95 | −95 | −85 | 155 | 165 | 85 | 95 | 95 | 105 | 155 | 165 |
| 85 | 95 | −85 | −75 | −165 | −155 | 85 | 95 | 105 | 115 | −165 | −155 |
| 85 | 95 | −85 | −75 | −25 | −15 | 85 | 95 | 105 | 115 | −95 | −85 |
| 85 | 95 | −85 | −75 | 15 | 25 | 85 | 95 | 105 | 115 | −25 | −15 |
| 85 | 95 | −85 | −75 | 155 | 165 | 85 | 95 | 105 | 115 | 15 | 25 |
| 85 | 95 | −75 | −65 | −165 | −155 | 85 | 95 | 105 | 115 | 85 | 95 |

TABLE 34-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 85 | 95 | −75 | −65 | −95 | −85 | 85 | 95 | 105 | 115 | 155 | 165 |
| 85 | 95 | −75 | −65 | −25 | −15 | 85 | 95 | 155 | 165 | −165 | −155 |
| 85 | 95 | −75 | −65 | 15 | 25 | 85 | 95 | 155 | 165 | −95 | −85 |
| 85 | 95 | −75 | −65 | 85 | 95 | 85 | 95 | 155 | 165 | −25 | −15 |
| 85 | 95 | −75 | −65 | 155 | 165 | 85 | 95 | 155 | 165 | 15 | 25 |
| 85 | 95 | −25 | −15 | −165 | −155 | 85 | 95 | 155 | 165 | 85 | 95 |
| 85 | 95 | −25 | −15 | −95 | −85 | 85 | 95 | 155 | 165 | 155 | 165 |
| 85 | 95 | −25 | −15 | −25 | −15 | 85 | 95 | 165 | 175 | −165 | −155 |
| 85 | 95 | −25 | −15 | 15 | 25 | 85 | 95 | 165 | 175 | −25 | −15 |
| 85 | 95 | −25 | −15 | 85 | 95 | 85 | 95 | 165 | 175 | 15 | 25 |
| 85 | 95 | −25 | −15 | 155 | 165 | 85 | 95 | 165 | 175 | 155 | 165 |
| 85 | 95 | −15 | −5 | −165 | −155 | 85 | 95 | 175 | 180 | −165 | −155 |
| 85 | 95 | −15 | −5 | −25 | −15 | 85 | 95 | 175 | 180 | −115 | −105 |
| 85 | 95 | −15 | −5 | 15 | 25 | 85 | 95 | 175 | 180 | −75 | −65 |
| 85 | 95 | −15 | −5 | 155 | 165 | 85 | 95 | 175 | 180 | −25 | −15 |
| 85 | 95 | −5 | 5 | −165 | −155 | 85 | 95 | 175 | 180 | 15 | 25 |
| 85 | 95 | −5 | 5 | −115 | −105 | 85 | 95 | 175 | 180 | 65 | 75 |
| 85 | 95 | −5 | 5 | −75 | −65 | 85 | 95 | 175 | 180 | 105 | 115 |
| 85 | 95 | −5 | 5 | −25 | −15 | 85 | 95 | 175 | 180 | 155 | 165 |

TABLE 35

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 95 | 105 | −180 | −175 | −155 | −145 | 95 | 105 | −5 | 5 | 5 | 15 |
| 95 | 105 | −180 | −175 | −105 | −95 | 95 | 105 | −5 | 5 | 55 | 65 |
| 95 | 105 | −180 | −175 | −65 | −55 | 95 | 105 | −5 | 5 | 95 | 105 |
| 95 | 105 | −180 | −175 | −15 | −5 | 95 | 105 | −5 | 5 | 145 | 155 |
| 95 | 105 | −180 | −175 | 25 | 35 | 95 | 105 | 5 | 15 | −175 | −165 |
| 95 | 105 | −180 | −175 | 75 | 85 | 95 | 105 | 5 | 15 | −35 | −25 |
| 95 | 105 | −180 | −175 | 115 | 125 | 95 | 105 | 5 | 15 | 5 | 15 |
| 95 | 105 | −180 | −175 | 165 | 175 | 95 | 105 | 5 | 15 | 145 | 155 |
| 95 | 105 | −175 | −165 | −155 | −145 | 95 | 105 | 15 | 25 | −175 | −165 |
| 95 | 105 | −175 | −165 | −15 | −5 | 95 | 105 | 15 | 25 | 5 | 15 |
| 95 | 105 | −175 | −165 | 25 | 35 | 95 | 105 | 65 | 75 | −95 | −85 |
| 95 | 105 | −175 | −165 | 165 | 175 | 95 | 105 | 65 | 75 | 85 | 95 |
| 95 | 105 | −165 | −155 | −15 | −5 | 95 | 105 | 75 | 85 | −25 | −15 |
| 95 | 105 | −165 | −155 | 165 | 175 | 95 | 105 | 75 | 85 | 155 | 165 |
| 95 | 105 | −115 | −105 | −95 | −85 | 95 | 105 | 85 | 95 | −115 | −105 |
| 95 | 105 | −115 | −105 | 85 | 95 | 95 | 105 | 85 | 95 | −75 | −65 |
| 95 | 105 | −105 | −95 | −165 | −155 | 95 | 105 | 85 | 95 | 65 | 75 |
| 95 | 105 | −105 | −95 | 15 | 25 | 95 | 105 | 85 | 95 | 105 | 115 |
| 95 | 105 | −95 | −85 | −115 | −105 | 95 | 105 | 95 | 105 | −165 | −155 |
| 95 | 105 | −95 | −85 | −75 | −65 | 95 | 105 | 95 | 105 | 15 | 25 |
| 95 | 105 | −95 | −85 | 65 | 75 | 95 | 105 | 105 | 115 | −95 | −85 |
| 95 | 105 | −95 | −85 | 105 | 115 | 95 | 105 | 105 | 115 | 85 | 95 |
| 95 | 105 | −85 | −75 | −25 | −15 | 95 | 105 | 155 | 165 | −15 | −5 |
| 95 | 105 | −85 | −75 | 155 | 165 | 95 | 105 | 155 | 165 | 165 | 175 |
| 95 | 105 | −75 | −65 | −95 | −85 | 95 | 105 | 165 | 175 | −155 | −145 |
| 95 | 105 | −75 | −65 | 85 | 95 | 95 | 105 | 165 | 175 | −15 | −5 |
| 95 | 105 | −25 | −15 | −175 | −165 | 95 | 105 | 165 | 175 | 25 | 35 |
| 95 | 105 | −25 | −15 | 5 | 15 | 95 | 105 | 165 | 175 | 165 | 175 |
| 95 | 105 | −15 | −5 | −175 | −165 | 95 | 105 | 175 | 180 | −155 | −145 |
| 95 | 105 | −15 | −5 | −35 | −25 | 95 | 105 | 175 | 180 | −105 | −95 |
| 95 | 105 | −15 | −5 | 5 | 15 | 95 | 105 | 175 | 180 | −65 | −55 |
| 95 | 105 | −15 | −5 | 145 | 155 | 95 | 105 | 175 | 180 | −15 | −5 |
| 95 | 105 | −5 | 5 | −175 | −165 | 95 | 105 | 175 | 180 | 25 | 35 |
| 95 | 105 | −5 | 5 | −125 | −115 | 95 | 105 | 175 | 180 | 75 | 85 |
| 95 | 105 | −5 | 5 | −85 | −75 | 95 | 105 | 175 | 180 | 115 | 125 |
| 95 | 105 | −5 | 5 | −35 | −25 | 95 | 105 | 175 | 180 | 165 | 175 |

TABLE 36

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 105 | 115 | −180 | −175 | −180 | −175 | 105 | 115 | −45 | −35 | 175 | 180 |
| 105 | 115 | −180 | −175 | −145 | −135 | 105 | 115 | −35 | −25 | −180 | −175 |
| 105 | 115 | −180 | −175 | −95 | −85 | 105 | 115 | −35 | −25 | −5 | 5 |
| 105 | 115 | −180 | −175 | −55 | −45 | 105 | 115 | −35 | −25 | 175 | 180 |
| 105 | 115 | −180 | −175 | −5 | 5 | 105 | 115 | −25 | −15 | −180 | −175 |
| 105 | 115 | −180 | −175 | 35 | 45 | 105 | 115 | −25 | −15 | −5 | 5 |
| 105 | 115 | −180 | −175 | 85 | 95 | 105 | 115 | −25 | −15 | 175 | 180 |
| 105 | 115 | −180 | −175 | 125 | 135 | 105 | 115 | −15 | −5 | −180 | −175 |
| 105 | 115 | −180 | −175 | 175 | 180 | 105 | 115 | −15 | −5 | −45 | −35 |
| 105 | 115 | −175 | −165 | −180 | −175 | 105 | 115 | −15 | −5 | −5 | 5 |
| 105 | 115 | −175 | −165 | −145 | −135 | 105 | 115 | −15 | −5 | 135 | 145 |
| 105 | 115 | −175 | −165 | −5 | 5 | 105 | 115 | −15 | −5 | 175 | 180 |
| 105 | 115 | −175 | −165 | 35 | 45 | 105 | 115 | −5 | 5 | −180 | −175 |
| 105 | 115 | −175 | −165 | 175 | 180 | 105 | 115 | −5 | 5 | −135 | −125 |
| 105 | 115 | −165 | −155 | −180 | −175 | 105 | 115 | −5 | 5 | −95 | −85 |
| 105 | 115 | −165 | −155 | −5 | 5 | 105 | 115 | −5 | 5 | −45 | −35 |
| 105 | 115 | −165 | −155 | 175 | 180 | 105 | 115 | −5 | 5 | −5 | 5 |
| 105 | 115 | −155 | −145 | −180 | −175 | 105 | 115 | −5 | 5 | 45 | 55 |
| 105 | 115 | −155 | −145 | −5 | 5 | 105 | 115 | −5 | 5 | 85 | 95 |
| 105 | 115 | −155 | −145 | 175 | 180 | 105 | 115 | −5 | 5 | 135 | 145 |
| 105 | 115 | −145 | −135 | −180 | −175 | 105 | 115 | −5 | 5 | 175 | 180 |
| 105 | 115 | −145 | −135 | −5 | 5 | 105 | 115 | 5 | 15 | −180 | −175 |
| 105 | 115 | −145 | −135 | 175 | 180 | 105 | 115 | 5 | 15 | −45 | −35 |
| 105 | 115 | −135 | −125 | −180 | −175 | 105 | 115 | 5 | 15 | −5 | 5 |
| 105 | 115 | −135 | −125 | −5 | 5 | 105 | 115 | 5 | 15 | 135 | 145 |
| 105 | 115 | −135 | −125 | 175 | 180 | 105 | 115 | 5 | 15 | 175 | 180 |
| 105 | 115 | −125 | −115 | −180 | −175 | 105 | 115 | 15 | 25 | −180 | −175 |
| 105 | 115 | −125 | −115 | −5 | 5 | 105 | 115 | 15 | 25 | −5 | 5 |
| 105 | 115 | −125 | −115 | 175 | 180 | 105 | 115 | 15 | 25 | 175 | 180 |
| 105 | 115 | −115 | −105 | −180 | −175 | 105 | 115 | 25 | 35 | −180 | −175 |
| 105 | 115 | −115 | −105 | −95 | −85 | 105 | 115 | 25 | 35 | −5 | 5 |
| 105 | 115 | −115 | −105 | −5 | 5 | 105 | 115 | 25 | 35 | 175 | 180 |
| 105 | 115 | −115 | −105 | 85 | 95 | 105 | 115 | 35 | 45 | −180 | −175 |
| 105 | 115 | −115 | −105 | 175 | 180 | 105 | 115 | 35 | 45 | −5 | 5 |
| 105 | 115 | −105 | −95 | −180 | −175 | 105 | 115 | 35 | 45 | 175 | 180 |
| 105 | 115 | −105 | −95 | −5 | 5 | 105 | 115 | 45 | 55 | −180 | −175 |
| 105 | 115 | −105 | −95 | 175 | 180 | 105 | 115 | 45 | 55 | −5 | 5 |
| 105 | 115 | −95 | −85 | −180 | −175 | 105 | 115 | 45 | 55 | 175 | 180 |
| 105 | 115 | −95 | −85 | −115 | −105 | 105 | 115 | 55 | 65 | −180 | −175 |
| 105 | 115 | −95 | −85 | −75 | −65 | 105 | 115 | 55 | 65 | −5 | 5 |
| 105 | 115 | −95 | −85 | −5 | 5 | 105 | 115 | 55 | 65 | 175 | 180 |
| 105 | 115 | −95 | −85 | 65 | 75 | 105 | 115 | 65 | 75 | −180 | −175 |
| 105 | 115 | −95 | −85 | 105 | 115 | 105 | 115 | 65 | 75 | −95 | −85 |
| 105 | 115 | −95 | −85 | 175 | 180 | 105 | 115 | 65 | 75 | −5 | 5 |
| 105 | 115 | −85 | −75 | −180 | −175 | 105 | 115 | 65 | 75 | 85 | 95 |
| 105 | 115 | −85 | −75 | −5 | 5 | 105 | 115 | 65 | 75 | 175 | 180 |
| 105 | 115 | −85 | −75 | 175 | 180 | 105 | 115 | 75 | 85 | −180 | −175 |
| 105 | 115 | −75 | −65 | −180 | −175 | 105 | 115 | 75 | 85 | −5 | 5 |
| 105 | 115 | −75 | −65 | −95 | −85 | 105 | 115 | 75 | 85 | 175 | 180 |
| 105 | 115 | −75 | −65 | −5 | 5 | 105 | 115 | 85 | 95 | −180 | −175 |
| 105 | 115 | −75 | −65 | 85 | 95 | 105 | 115 | 85 | 95 | −115 | −105 |
| 105 | 115 | −75 | −65 | 175 | 180 | 105 | 115 | 85 | 95 | −75 | −65 |
| 105 | 115 | −65 | −55 | −180 | −175 | 105 | 115 | 85 | 95 | −5 | 5 |
| 105 | 115 | −65 | −55 | −5 | 5 | 105 | 115 | 85 | 95 | 65 | 75 |
| 105 | 115 | −65 | −55 | 175 | 180 | 105 | 115 | 85 | 95 | 105 | 115 |
| 105 | 115 | −55 | −45 | −180 | −175 | 105 | 115 | 85 | 95 | 175 | 180 |
| 105 | 115 | −55 | −45 | −5 | 5 | 105 | 115 | 95 | 105 | −180 | −175 |
| 105 | 115 | −55 | −45 | 175 | 180 | 105 | 115 | 95 | 105 | −5 | 5 |
| 105 | 115 | −45 | −35 | −180 | −175 | 105 | 115 | 95 | 105 | 175 | 180 |
| 105 | 115 | −45 | −35 | −5 | 5 | 105 | 115 | 105 | 115 | −180 | −175 |

TABLE 37

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 105 | 115 | 105 | 115 | −95 | −85 | 105 | 115 | 155 | 165 | −5 | 5 |
| 105 | 115 | 105 | 115 | −5 | 5 | 105 | 115 | 155 | 165 | 175 | 180 |
| 105 | 115 | 105 | 115 | 85 | 95 | 105 | 115 | 165 | 175 | −180 | −175 |

TABLE 37-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 105 | 115 | 105 | 115 | 175 | 180 | 105 | 115 | 165 | 175 | −145 | −135 |
| 105 | 115 | 115 | 125 | −180 | −175 | 105 | 115 | 165 | 175 | −5 | 5 |
| 105 | 115 | 115 | 125 | −5 | 5 | 105 | 115 | 165 | 175 | 35 | 45 |
| 105 | 115 | 115 | 125 | 175 | 180 | 105 | 115 | 165 | 175 | 175 | 180 |
| 105 | 115 | 125 | 135 | −180 | −175 | 105 | 115 | 175 | 180 | −180 | −175 |
| 105 | 115 | 125 | 135 | −5 | 5 | 105 | 115 | 175 | 180 | −145 | −135 |
| 105 | 115 | 125 | 135 | 175 | 180 | 105 | 115 | 175 | 180 | −95 | −85 |
| 105 | 115 | 135 | 145 | −180 | −175 | 105 | 115 | 175 | 180 | −55 | −45 |
| 105 | 115 | 135 | 145 | −5 | 5 | 105 | 115 | 175 | 180 | −5 | 5 |
| 105 | 115 | 135 | 145 | 175 | 180 | 105 | 115 | 175 | 180 | 35 | 45 |
| 105 | 115 | 145 | 155 | −180 | −175 | 105 | 115 | 175 | 180 | 85 | 95 |
| 105 | 115 | 145 | 155 | −5 | 5 | 105 | 115 | 175 | 180 | 125 | 135 |
| 105 | 115 | 145 | 155 | 175 | 180 | 105 | 115 | 175 | 180 | 175 | 180 |
| 105 | 115 | 155 | 165 | −180 | −175 | | | | | | |

TABLE 38

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 115 | 125 | −180 | −175 | −175 | −165 | 115 | 125 | −5 | 5 | 35 | 45 |
| 115 | 125 | −180 | −175 | −135 | −125 | 115 | 125 | −5 | 5 | 75 | 85 |
| 115 | 125 | −180 | −175 | −85 | −75 | 115 | 125 | −5 | 5 | 125 | 135 |
| 115 | 125 | −180 | −175 | −45 | −35 | 115 | 125 | −5 | 5 | 165 | 175 |
| 115 | 125 | −180 | −175 | 5 | 15 | 115 | 125 | 5 | 15 | −15 | −5 |
| 115 | 125 | −180 | −175 | 45 | 55 | 115 | 125 | 5 | 15 | 165 | 175 |
| 115 | 125 | −180 | −175 | 95 | 105 | 115 | 125 | 25 | 35 | −45 | −35 |
| 115 | 125 | −180 | −175 | 135 | 145 | 115 | 125 | 25 | 35 | 135 | 145 |
| 115 | 125 | −175 | −165 | −175 | −165 | 115 | 125 | 35 | 45 | −35 | −25 |
| 115 | 125 | −175 | −165 | 5 | 15 | 115 | 125 | 35 | 45 | 145 | 155 |
| 115 | 125 | −155 | −145 | −145 | −135 | 115 | 125 | 135 | 145 | −155 | −145 |
| 115 | 125 | −155 | −145 | 35 | 45 | 115 | 125 | 135 | 145 | 25 | 35 |
| 115 | 125 | −145 | −135 | −155 | −145 | 115 | 125 | 145 | 155 | −135 | −125 |
| 115 | 125 | −145 | −135 | 25 | 35 | 115 | 125 | 145 | 155 | 35 | 45 |
| 115 | 125 | −45 | −35 | −35 | −25 | 115 | 125 | 165 | 175 | −175 | −165 |
| 115 | 125 | −45 | −35 | 145 | 155 | 115 | 125 | 165 | 175 | 5 | 15 |
| 115 | 125 | −35 | −25 | −45 | −35 | 115 | 125 | 175 | 180 | −175 | −165 |
| 115 | 125 | −35 | −25 | 135 | 145 | 115 | 125 | 175 | 180 | −135 | −125 |
| 115 | 125 | −15 | −5 | −15 | −5 | 115 | 125 | 175 | 180 | −85 | −75 |
| 115 | 125 | −15 | −5 | 165 | 175 | 115 | 125 | 175 | 180 | −45 | −35 |
| 115 | 125 | −5 | 5 | −145 | −135 | 115 | 125 | 175 | 180 | 5 | 15 |
| 115 | 125 | −5 | 5 | −105 | −95 | 115 | 125 | 175 | 180 | 45 | 55 |
| 115 | 125 | −5 | 5 | −55 | −45 | 115 | 125 | 175 | 180 | 95 | 105 |
| 115 | 125 | −5 | 5 | −15 | −5 | 115 | 125 | 175 | 180 | 135 | 145 |

TABLE 39

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 125 | 135 | −180 | −175 | −165 | −155 | 125 | 135 | −5 | 5 | 25 | 35 |
| 125 | 135 | −180 | −175 | −125 | −115 | 125 | 135 | −5 | 5 | 65 | 75 |
| 125 | 135 | −180 | −175 | −75 | −65 | 125 | 135 | −5 | 5 | 115 | 125 |
| 125 | 135 | −180 | −175 | −35 | −25 | 125 | 135 | −5 | 5 | 155 | 165 |
| 125 | 135 | −180 | −175 | 15 | 25 | 125 | 135 | 175 | 180 | −165 | −155 |
| 125 | 135 | −180 | −175 | 55 | 65 | 125 | 135 | 175 | 180 | −125 | −115 |
| 125 | 135 | −180 | −175 | 105 | 115 | 125 | 135 | 175 | 180 | −75 | −65 |
| 125 | 135 | −180 | −175 | 145 | 155 | 125 | 135 | 175 | 180 | −35 | −25 |
| 125 | 135 | −5 | 5 | −155 | −145 | 125 | 135 | 175 | 180 | 15 | 25 |
| 125 | 135 | −5 | 5 | −115 | −105 | 125 | 135 | 175 | 180 | 55 | 65 |
| 125 | 135 | −5 | 5 | −65 | −55 | 125 | 135 | 175 | 180 | 105 | 115 |
| 125 | 135 | −5 | 5 | −25 | −15 | 125 | 135 | 175 | 180 | 145 | 155 |

TABLE 40

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 135 | 145 | −180 | −175 | −155 | −145 | 135 | 145 | −5 | 5 | 15 | 25 |
| 135 | 145 | −180 | −175 | −115 | −105 | 135 | 145 | −5 | 5 | 55 | 65 |
| 135 | 145 | −180 | −175 | −65 | −55 | 135 | 145 | −5 | 5 | 105 | 115 |
| 135 | 145 | −180 | −175 | −25 | −15 | 135 | 145 | −5 | 5 | 145 | 155 |
| 135 | 145 | −180 | −175 | 25 | 35 | 135 | 145 | 175 | 180 | −155 | −145 |
| 135 | 145 | −180 | −175 | 65 | 75 | 135 | 145 | 175 | 180 | −115 | −105 |
| 135 | 145 | −180 | −175 | 115 | 125 | 135 | 145 | 175 | 180 | −65 | −55 |
| 135 | 145 | −180 | −175 | 155 | 165 | 135 | 145 | 175 | 180 | −25 | −15 |
| 135 | 145 | −5 | 5 | −165 | −155 | 135 | 145 | 175 | 180 | 25 | 35 |
| 135 | 145 | −5 | 5 | −125 | −115 | 135 | 145 | 175 | 180 | 65 | 75 |
| 135 | 145 | −5 | 5 | −75 | −65 | 135 | 145 | 175 | 180 | 115 | 125 |
| 135 | 145 | −5 | 5 | −35 | −25 | 135 | 145 | 175 | 180 | 155 | 165 |

TABLE 41

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 145 | 155 | −180 | −175 | −145 | −135 | 145 | 155 | −5 | 5 | 5 | 15 |
| 145 | 155 | −180 | −175 | −105 | −95 | 145 | 155 | −5 | 5 | 45 | 55 |
| 145 | 155 | −180 | −175 | −55 | −45 | 145 | 155 | −5 | 5 | 95 | 105 |
| 145 | 155 | −180 | −175 | −15 | −5 | 145 | 155 | −5 | 5 | 135 | 145 |
| 145 | 155 | −180 | −175 | 35 | 45 | 145 | 155 | 5 | 15 | −175 | −165 |
| 145 | 155 | −180 | −175 | 75 | 85 | 145 | 155 | 5 | 15 | 5 | 15 |
| 145 | 155 | −180 | −175 | 125 | 135 | 145 | 155 | 25 | 35 | −145 | −135 |
| 145 | 155 | −180 | −175 | 165 | 175 | 145 | 155 | 25 | 35 | 35 | 45 |
| 145 | 155 | −175 | −165 | −15 | −5 | 145 | 155 | 35 | 45 | −155 | −145 |
| 145 | 155 | −175 | −165 | 165 | 175 | 145 | 155 | 35 | 45 | 25 | 35 |
| 145 | 155 | −155 | −145 | −45 | −35 | 145 | 155 | 135 | 145 | −35 | −25 |
| 145 | 155 | −155 | −145 | 135 | 145 | 145 | 155 | 135 | 145 | 145 | 155 |
| 145 | 155 | −145 | −135 | −35 | −25 | 145 | 155 | 145 | 155 | −45 | −35 |
| 145 | 155 | −145 | −135 | 145 | 155 | 145 | 155 | 145 | 155 | 135 | 145 |
| 145 | 155 | −45 | −35 | −155 | −145 | 145 | 155 | 165 | 175 | −15 | −5 |
| 145 | 155 | −45 | −35 | 25 | 35 | 145 | 155 | 165 | 175 | 165 | 175 |
| 145 | 155 | −35 | −25 | −145 | −135 | 145 | 155 | 175 | 180 | −145 | −135 |
| 145 | 155 | −35 | −25 | 35 | 45 | 145 | 155 | 175 | 180 | −105 | −95 |
| 145 | 155 | −15 | −5 | −175 | −165 | 145 | 155 | 175 | 180 | −55 | −45 |
| 145 | 155 | −15 | −5 | 5 | 15 | 145 | 155 | 175 | 180 | −15 | −5 |
| 145 | 155 | −5 | 5 | −175 | −165 | 145 | 155 | 175 | 180 | 35 | 45 |
| 145 | 155 | −5 | 5 | −135 | −125 | 145 | 155 | 175 | 180 | 75 | 85 |
| 145 | 155 | −5 | 5 | −85 | −75 | 145 | 155 | 175 | 180 | 125 | 135 |
| 145 | 155 | −5 | 5 | −45 | −35 | 145 | 155 | 175 | 180 | 165 | 175 |

TABLE 42

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 155 | 165 | −180 | −175 | −180 | −175 | 155 | 165 | −45 | −35 | 175 | 180 |
| 155 | 165 | −180 | −175 | −135 | −125 | 155 | 165 | −35 | −25 | −180 | −175 |
| 155 | 165 | −180 | −175 | −95 | −85 | 155 | 165 | −35 | −25 | −5 | 5 |
| 155 | 165 | −180 | −175 | −45 | −35 | 155 | 165 | −35 | −25 | 175 | 180 |
| 155 | 165 | −180 | −175 | −5 | 5 | 155 | 165 | −25 | −15 | −180 | −175 |
| 155 | 165 | −180 | −175 | 45 | 55 | 155 | 165 | −25 | −15 | −5 | 5 |
| 155 | 165 | −180 | −175 | 85 | 95 | 155 | 165 | −25 | −15 | 175 | 180 |
| 155 | 165 | −180 | −175 | 135 | 145 | 155 | 165 | −15 | −5 | −180 | −175 |
| 155 | 165 | −180 | −175 | 175 | 180 | 155 | 165 | −15 | −5 | −145 | −135 |
| 155 | 165 | −175 | −165 | −180 | −175 | 155 | 165 | −15 | −5 | −5 | 5 |
| 155 | 165 | −175 | −165 | −45 | −35 | 155 | 165 | −15 | −5 | 35 | 45 |
| 155 | 165 | −175 | −165 | −5 | 5 | 155 | 165 | −15 | −5 | 175 | 180 |
| 155 | 165 | −175 | −165 | 135 | 145 | 155 | 165 | −5 | 5 | −180 | −175 |
| 155 | 165 | −175 | −165 | 175 | 180 | 155 | 165 | −5 | 5 | −145 | −135 |
| 155 | 165 | −165 | −155 | −180 | −175 | 155 | 165 | −5 | 5 | −95 | −85 |
| 155 | 165 | −165 | −155 | −5 | 5 | 155 | 165 | −5 | 5 | −55 | −45 |

TABLE 42-continued

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 155 | 165 | −165 | −155 | 175 | 180 | 155 | 165 | −5 | 5 | −5 | 5 |
| 155 | 165 | −155 | −145 | −180 | −175 | 155 | 165 | −5 | 5 | 35 | 45 |
| 155 | 165 | −155 | −145 | −5 | 5 | 155 | 165 | −5 | 5 | 85 | 95 |
| 155 | 165 | −155 | −145 | 175 | 180 | 155 | 165 | −5 | 5 | 125 | 135 |
| 155 | 165 | −145 | −135 | −180 | −175 | 155 | 165 | −5 | 5 | 175 | 180 |
| 155 | 165 | −145 | −135 | −5 | 5 | 155 | 165 | 5 | 15 | −180 | −175 |
| 155 | 165 | −145 | −135 | 175 | 180 | 155 | 165 | 5 | 15 | −145 | −135 |
| 155 | 165 | −135 | −125 | −180 | −175 | 155 | 165 | 5 | 15 | −5 | 5 |
| 155 | 165 | −135 | −125 | −5 | 5 | 155 | 165 | 5 | 15 | 35 | 45 |
| 155 | 165 | −135 | −125 | 175 | 180 | 155 | 165 | 5 | 15 | 175 | 180 |
| 155 | 165 | −125 | −115 | −180 | −175 | 155 | 165 | 15 | 25 | −180 | −175 |
| 155 | 165 | −125 | −115 | −5 | 5 | 155 | 165 | 15 | 25 | −5 | 5 |
| 155 | 165 | −125 | −115 | 175 | 180 | 155 | 165 | 15 | 25 | 175 | 180 |
| 155 | 165 | −115 | −105 | −180 | −175 | 155 | 165 | 25 | 35 | −180 | −175 |
| 155 | 165 | −115 | −105 | −95 | −85 | 155 | 165 | 25 | 35 | −5 | 5 |
| 155 | 165 | −115 | −105 | −5 | 5 | 155 | 165 | 25 | 35 | 175 | 180 |
| 155 | 165 | −115 | −105 | 85 | 95 | 155 | 165 | 35 | 45 | −180 | −175 |
| 155 | 165 | −115 | −105 | 175 | 180 | 155 | 165 | 35 | 45 | −5 | 5 |
| 155 | 165 | −105 | −95 | −180 | −175 | 155 | 165 | 35 | 45 | 175 | 180 |
| 155 | 165 | −105 | −95 | −5 | 5 | 155 | 165 | 45 | 55 | −180 | −175 |
| 155 | 165 | −105 | −95 | 175 | 180 | 155 | 165 | 45 | 55 | −5 | 5 |
| 155 | 165 | −95 | −85 | −180 | −175 | 155 | 165 | 45 | 55 | 175 | 180 |
| 155 | 165 | −95 | −85 | −115 | −105 | 155 | 165 | 55 | 65 | −180 | −175 |
| 155 | 165 | −95 | −85 | −75 | −65 | 155 | 165 | 55 | 65 | −5 | 5 |
| 155 | 165 | −95 | −85 | −5 | 5 | 155 | 165 | 55 | 65 | 175 | 180 |
| 155 | 165 | −95 | −85 | 65 | 75 | 155 | 165 | 65 | 75 | −180 | −175 |
| 155 | 165 | −95 | −85 | 105 | 115 | 155 | 165 | 65 | 75 | −95 | −85 |
| 155 | 165 | −95 | −85 | 175 | 180 | 155 | 165 | 65 | 75 | −5 | 5 |
| 155 | 165 | −85 | −75 | −180 | −175 | 155 | 165 | 65 | 75 | 85 | 95 |
| 155 | 165 | −85 | −75 | −5 | 5 | 155 | 165 | 65 | 75 | 175 | 180 |
| 155 | 165 | −85 | −75 | 175 | 180 | 155 | 165 | 75 | 85 | −180 | −175 |
| 155 | 165 | −75 | −65 | −180 | −175 | 155 | 165 | 75 | 85 | −5 | 5 |
| 155 | 165 | −75 | −65 | −95 | −85 | 155 | 165 | 75 | 85 | 175 | 180 |
| 155 | 165 | −75 | −65 | −5 | 5 | 155 | 165 | 85 | 95 | −180 | −175 |
| 155 | 165 | −75 | −65 | 85 | 95 | 155 | 165 | 85 | 95 | −115 | −105 |
| 155 | 165 | −75 | −65 | 175 | 180 | 155 | 165 | 85 | 95 | −75 | −65 |
| 155 | 165 | −65 | −55 | −180 | −175 | 155 | 165 | 85 | 95 | −5 | 5 |
| 155 | 165 | −65 | −55 | −5 | 5 | 155 | 165 | 85 | 95 | 65 | 75 |
| 155 | 165 | −65 | −55 | 175 | 180 | 155 | 165 | 85 | 95 | 105 | 115 |
| 155 | 165 | −55 | −45 | −180 | −175 | 155 | 165 | 85 | 95 | 175 | 180 |
| 155 | 165 | −55 | −45 | −5 | 5 | 155 | 165 | 95 | 105 | −180 | −175 |
| 155 | 165 | −55 | −45 | 175 | 180 | 155 | 165 | 95 | 105 | −5 | 5 |
| 155 | 165 | −45 | −35 | −180 | −175 | 155 | 165 | 95 | 105 | 175 | 180 |
| 155 | 165 | −45 | −35 | −5 | 5 | 155 | 165 | 105 | 115 | −180 | −175 |

TABLE 43

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 155 | 165 | 105 | 115 | −95 | −85 | 155 | 165 | 155 | 165 | −5 | 5 |
| 155 | 165 | 105 | 115 | −5 | 5 | 155 | 165 | 155 | 165 | 175 | 180 |
| 155 | 165 | 105 | 115 | 85 | 95 | 155 | 165 | 165 | 175 | −180 | −175 |
| 155 | 165 | 105 | 115 | 175 | 180 | 155 | 165 | 165 | 175 | −45 | −35 |
| 155 | 165 | 115 | 125 | −180 | −175 | 155 | 165 | 165 | 175 | −5 | 5 |
| 155 | 165 | 115 | 125 | −5 | 5 | 155 | 165 | 165 | 175 | 135 | 145 |
| 155 | 165 | 115 | 125 | 175 | 180 | 155 | 165 | 165 | 175 | 175 | 180 |
| 155 | 165 | 125 | 135 | −180 | −175 | 155 | 165 | 175 | 180 | −180 | −175 |
| 155 | 165 | 125 | 135 | −5 | 5 | 155 | 165 | 175 | 180 | −135 | −125 |
| 155 | 165 | 125 | 135 | 175 | 180 | 155 | 165 | 175 | 180 | −95 | −85 |
| 155 | 165 | 135 | 145 | −180 | −175 | 155 | 165 | 175 | 180 | −45 | −35 |
| 155 | 165 | 135 | 145 | −5 | 5 | 155 | 165 | 175 | 180 | −5 | 5 |
| 155 | 165 | 135 | 145 | 175 | 180 | 155 | 165 | 175 | 180 | 45 | 55 |
| 155 | 165 | 145 | 155 | −180 | −175 | 155 | 165 | 175 | 180 | 85 | 95 |
| 155 | 165 | 145 | 155 | −5 | 5 | 155 | 165 | 175 | 180 | 135 | 145 |
| 155 | 165 | 145 | 155 | 175 | 180 | 155 | 165 | 175 | 180 | 175 | 180 |
| 155 | 165 | 155 | 165 | −180 | −175 | | | | | | |

TABLE 44

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 165 | 175 | −180 | −175 | −175 | −165 | 165 | 175 | −5 | 5 | 25 | 35 |
| 165 | 175 | −180 | −175 | −125 | −115 | 165 | 175 | −5 | 5 | 75 | 85 |
| 165 | 175 | −180 | −175 | −85 | −75 | 165 | 175 | −5 | 5 | 115 | 125 |
| 165 | 175 | −180 | −175 | −35 | −25 | 165 | 175 | −5 | 5 | 165 | 175 |
| 165 | 175 | −180 | −175 | 5 | 15 | 165 | 175 | 5 | 15 | −155 | −145 |
| 165 | 175 | −180 | −175 | 55 | 65 | 165 | 175 | 5 | 15 | −15 | −5 |
| 165 | 175 | −180 | −175 | 95 | 105 | 165 | 175 | 5 | 15 | 25 | 35 |
| 165 | 175 | −180 | −175 | 145 | 155 | 165 | 175 | 5 | 15 | 165 | 175 |
| 165 | 175 | −175 | −165 | −175 | −165 | 165 | 175 | 15 | 25 | −15 | −5 |
| 165 | 175 | −175 | −165 | −35 | −25 | 165 | 175 | 15 | 25 | 165 | 175 |
| 165 | 175 | −175 | −165 | 5 | 15 | 165 | 175 | 65 | 75 | −95 | −85 |
| 165 | 175 | −175 | −165 | 145 | 155 | 165 | 175 | 65 | 75 | 85 | 95 |
| 165 | 175 | −165 | −155 | −175 | −165 | 165 | 175 | 75 | 85 | −165 | −155 |
| 165 | 175 | −165 | −155 | 5 | 15 | 165 | 175 | 75 | 85 | 15 | 25 |
| 165 | 175 | −115 | −105 | −95 | −85 | 165 | 175 | 85 | 95 | −115 | −105 |
| 165 | 175 | −115 | −105 | 85 | 95 | 165 | 175 | 85 | 95 | −75 | −65 |
| 165 | 175 | −105 | −95 | −25 | −15 | 165 | 175 | 85 | 95 | 65 | 75 |
| 165 | 175 | −105 | −95 | 155 | 165 | 165 | 175 | 85 | 95 | 105 | 115 |
| 165 | 175 | −95 | −85 | −115 | −105 | 165 | 175 | 95 | 105 | −25 | −15 |
| 165 | 175 | −95 | −85 | −75 | −65 | 165 | 175 | 95 | 105 | 155 | 165 |
| 165 | 175 | −95 | −85 | 65 | 75 | 165 | 175 | 105 | 115 | −95 | −85 |
| 165 | 175 | −95 | −85 | 105 | 115 | 165 | 175 | 105 | 115 | 85 | 95 |
| 165 | 175 | −85 | −75 | −165 | −155 | 165 | 175 | 155 | 165 | −175 | −165 |
| 165 | 175 | −85 | −75 | 15 | 25 | 165 | 175 | 155 | 165 | 5 | 15 |
| 165 | 175 | −75 | −65 | −95 | −85 | 165 | 175 | 165 | 175 | −175 | −165 |
| 165 | 175 | −75 | −65 | 85 | 95 | 165 | 175 | 165 | 175 | −35 | −25 |
| 165 | 175 | −25 | −15 | −15 | −5 | 165 | 175 | 165 | 175 | 5 | 15 |
| 165 | 175 | −25 | −15 | 165 | 175 | 165 | 175 | 165 | 175 | 145 | 155 |
| 165 | 175 | −15 | −5 | −155 | −145 | 165 | 175 | 175 | 180 | −175 | −165 |
| 165 | 175 | −15 | −5 | −15 | −5 | 165 | 175 | 175 | 180 | −125 | −115 |
| 165 | 175 | −15 | −5 | 25 | 35 | 165 | 175 | 175 | 180 | −85 | −75 |
| 165 | 175 | −15 | −5 | 165 | 175 | 165 | 175 | 175 | 180 | −35 | −25 |
| 165 | 175 | −5 | 5 | −155 | −145 | 165 | 175 | 175 | 180 | 5 | 15 |
| 165 | 175 | −5 | 5 | −105 | −95 | 165 | 175 | 175 | 180 | 55 | 65 |
| 165 | 175 | −5 | 5 | −65 | −55 | 165 | 175 | 175 | 180 | 95 | 105 |
| 165 | 175 | −5 | 5 | −15 | −5 | 165 | 175 | 175 | 180 | 145 | 155 |

TABLE 45

| Φ[°] | | θ[°] | | ψ[°] | | Φ[°] | | θ[°] | | ψ[°] | |
|---|---|---|---|---|---|---|---|---|---|---|---|
| or more | less than | or more | less than | or more | less than | or more | less than | or more | less than | or more | less than |
| 175 | 180 | −180 | −175 | −165 | −155 | 175 | 180 | −5 | 5 | 15 | 25 |
| 175 | 180 | −180 | −175 | −115 | −105 | 175 | 180 | −5 | 5 | 65 | 75 |
| 175 | 180 | −180 | −175 | −75 | −65 | 175 | 180 | −5 | 5 | 105 | 115 |
| 175 | 180 | −180 | −175 | −25 | −15 | 175 | 180 | −5 | 5 | 155 | 165 |
| 175 | 180 | −180 | −175 | 15 | 25 | 175 | 180 | 5 | 15 | −165 | −155 |
| 175 | 180 | −180 | −175 | 65 | 75 | 175 | 180 | 5 | 15 | −25 | −15 |
| 175 | 180 | −180 | −175 | 105 | 115 | 175 | 180 | 5 | 15 | 15 | 25 |
| 175 | 180 | −180 | −175 | 155 | 165 | 175 | 180 | 5 | 15 | 155 | 165 |
| 175 | 180 | −175 | −165 | −165 | −155 | 175 | 180 | 15 | 25 | −165 | −155 |
| 175 | 180 | −175 | −165 | −25 | −15 | 175 | 180 | 15 | 25 | −95 | −85 |
| 175 | 180 | −175 | −165 | 15 | 25 | 175 | 180 | 15 | 25 | −25 | −15 |
| 175 | 180 | −175 | −165 | 155 | 165 | 175 | 180 | 15 | 25 | 15 | 25 |
| 175 | 180 | −165 | −155 | −165 | −155 | 175 | 180 | 15 | 25 | 85 | 95 |
| 175 | 180 | −165 | −155 | −95 | −85 | 175 | 180 | 15 | 25 | 155 | 165 |
| 175 | 180 | −165 | −155 | −25 | −15 | 175 | 180 | 65 | 75 | −165 | −155 |
| 175 | 180 | −165 | −155 | 15 | 25 | 175 | 180 | 65 | 75 | −95 | −85 |
| 175 | 180 | −165 | −155 | 85 | 95 | 175 | 180 | 65 | 75 | −25 | −15 |
| 175 | 180 | −165 | −155 | 155 | 165 | 175 | 180 | 65 | 75 | 15 | 25 |
| 175 | 180 | −115 | −105 | −165 | −155 | 175 | 180 | 65 | 75 | 85 | 95 |
| 175 | 180 | −115 | −105 | −95 | −85 | 175 | 180 | 65 | 75 | 155 | 165 |
| 175 | 180 | −115 | −105 | −25 | −15 | 175 | 180 | 75 | 85 | −165 | −155 |
| 175 | 180 | −115 | −105 | 15 | 25 | 175 | 180 | 75 | 85 | −25 | −15 |
| 175 | 180 | −115 | −105 | 85 | 95 | 175 | 180 | 75 | 85 | 15 | 25 |
| 175 | 180 | −115 | −105 | 155 | 165 | 175 | 180 | 75 | 85 | 155 | 165 |
| 175 | 180 | −105 | −95 | −165 | −155 | 175 | 180 | 85 | 95 | −165 | −155 |
| 175 | 180 | −105 | −95 | −25 | −15 | 175 | 180 | 85 | 95 | −115 | −105 |
| 175 | 180 | −105 | −95 | 15 | 25 | 175 | 180 | 85 | 95 | −75 | −65 |
| 175 | 180 | −105 | −95 | 155 | 165 | 175 | 180 | 85 | 95 | −25 | −15 |

TABLE 45-continued

| Φ[°] or more | Φ[°] less than | θ[°] or more | θ[°] less than | ψ[°] or more | ψ[°] less than | Φ[°] or more | Φ[°] less than | θ[°] or more | θ[°] less than | ψ[°] or more | ψ[°] less than |
|---|---|---|---|---|---|---|---|---|---|---|---|
| 175 | 180 | −95 | −85 | −165 | −155 | 175 | 180 | 85 | 95 | 15 | 25 |
| 175 | 180 | −95 | −85 | −115 | −105 | 175 | 180 | 85 | 95 | 65 | 75 |
| 175 | 180 | −95 | −85 | −75 | −65 | 175 | 180 | 85 | 95 | 105 | 115 |
| 175 | 180 | −95 | −85 | −25 | −15 | 175 | 180 | 85 | 95 | 155 | 165 |
| 175 | 180 | −95 | −85 | 15 | 25 | 175 | 180 | 95 | 105 | −165 | −155 |
| 175 | 180 | −95 | −85 | 65 | 75 | 175 | 180 | 95 | 105 | −25 | −15 |
| 175 | 180 | −95 | −85 | 105 | 115 | 175 | 180 | 95 | 105 | 15 | 25 |
| 175 | 180 | −95 | −85 | 155 | 165 | 175 | 180 | 95 | 105 | 155 | 165 |
| 175 | 180 | −85 | −75 | −165 | −155 | 175 | 180 | 105 | 115 | −165 | −155 |
| 175 | 180 | −85 | −75 | −25 | −15 | 175 | 180 | 105 | 115 | −95 | −85 |
| 175 | 180 | −85 | −75 | 15 | 25 | 175 | 180 | 105 | 115 | −25 | −15 |
| 175 | 180 | −85 | −75 | 155 | 165 | 175 | 180 | 105 | 115 | 15 | 25 |
| 175 | 180 | −75 | −65 | −165 | −155 | 175 | 180 | 105 | 115 | 85 | 95 |
| 175 | 180 | −75 | −65 | −95 | −85 | 175 | 180 | 105 | 115 | 155 | 165 |
| 175 | 180 | −75 | −65 | −25 | −15 | 175 | 180 | 155 | 165 | −165 | −155 |
| 175 | 180 | −75 | −65 | 15 | 25 | 175 | 180 | 155 | 165 | −95 | −85 |
| 175 | 180 | −75 | −65 | 85 | 95 | 175 | 180 | 155 | 165 | −25 | −15 |
| 175 | 180 | −75 | −65 | 155 | 165 | 175 | 180 | 155 | 165 | 15 | 25 |
| 175 | 180 | −25 | −15 | −165 | −155 | 175 | 180 | 155 | 165 | 85 | 95 |
| 175 | 180 | −25 | −15 | −95 | −85 | 175 | 180 | 155 | 165 | 155 | 165 |
| 175 | 180 | −25 | −15 | −25 | −15 | 175 | 180 | 165 | 175 | −165 | −155 |
| 175 | 180 | −25 | −15 | 15 | 25 | 175 | 180 | 165 | 175 | −25 | −15 |
| 175 | 180 | −25 | −15 | 85 | 95 | 175 | 180 | 165 | 175 | 15 | 25 |
| 175 | 180 | −25 | −15 | 155 | 165 | 175 | 180 | 165 | 175 | 155 | 165 |
| 175 | 180 | −15 | −5 | −165 | −155 | 175 | 180 | 175 | 180 | −165 | −155 |
| 175 | 180 | −15 | −5 | −25 | −15 | 175 | 180 | 175 | 180 | −115 | −105 |
| 175 | 180 | −15 | −5 | 15 | 25 | 175 | 180 | 175 | 180 | −75 | −65 |
| 175 | 180 | −15 | −5 | 155 | 165 | 175 | 180 | 175 | 180 | −25 | −15 |
| 175 | 180 | −5 | 5 | −165 | −155 | 175 | 180 | 175 | 180 | 15 | 25 |
| 175 | 180 | −5 | 5 | −115 | −105 | 175 | 180 | 175 | 180 | 65 | 75 |
| 175 | 180 | −5 | 5 | −75 | −65 | 175 | 180 | 175 | 180 | 105 | 115 |
| 175 | 180 | −5 | 5 | −25 | −15 | 175 | 180 | 175 | 180 | 155 | 165 |

A protective film may be disposed on the first principal surface 5a of the piezoelectric layer 5, illustrated in FIG. 2, to cover the IDT electrode 7. In this case, the IDT electrode 7 is less likely to damage. For example, silicon oxide, silicon nitride, silicon oxynitride, and so on can be optionally used as a material of the protective film.

The thickness of the piezoelectric layer 5 is preferably about 2λ or less, for example. In this case, an influence of the monocrystalline spinel substrate 3 upon the frequency temperature characteristics of the acoustic wave device 1 can be relatively increased. As a result, the frequency temperature characteristics of the acoustic wave device 1 can be improved.

The thickness of the piezoelectric layer 5 is more preferably about 1λ or less, for example. In this case, the acoustic wave in the main mode can be efficiently excited. In addition, the acoustic wave in the main mode can be reflected by the monocrystalline spinel substrate 3 toward a side including the piezoelectric layer 5. This enables energy of the acoustic wave in the main mode to be effectively enclosed on the side including the piezoelectric layer 5. Accordingly, a Q-value can be improved.

Figure 47:
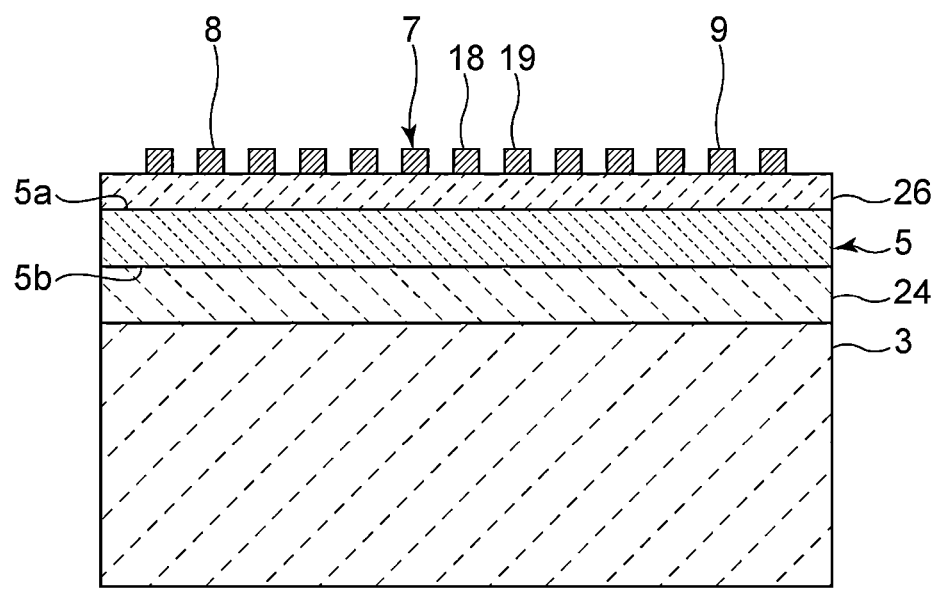
FIG. 47 is a front sectional view of an acoustic wave device according to a second preferred embodiment of the present invention.

FIG. 47 is a front sectional view of an acoustic wave device according to a second preferred embodiment.

This preferred embodiment is different from the first preferred embodiment in that a first dielectric film 26 is disposed between the first principal surface 5a of the piezoelectric layer 5 and the IDT electrode 7. This preferred embodiment is also different from the first preferred embodiment in that a second dielectric film 24 is disposed between the second principal surface 5b of the piezoelectric layer 5 and the monocrystalline spinel substrate 3. The acoustic wave device according to this preferred embodiment has the same structure as the acoustic wave device 1 according to the first preferred embodiment except for the above-described points.

The first dielectric film 26 and the second dielectric film 24 overlap the IDT electrode 7 in a plan view. In this disclosure, the term "plan view" indicates that the acoustic wave device is viewed from a direction corresponding to an upper side in FIGS. 2 and 47. In FIGS. 2 and 47, of the piezoelectric layer 5 and the monocrystalline spinel substrate 3, the piezoelectric layer 5 is positioned, by way of example, on the upper side.

For example, silicon oxide or the like can be used as materials of the first dielectric film 26 and the second dielectric film 24. The materials of the first dielectric film 26 and the second dielectric film 24 are not limited to the above-mentioned example.

In this preferred embodiment, a thickness of the first dielectric film 26 is, for example, about 0.0025λ. A thickness of the second dielectric film 24 is, for example, about 0.25λ. The thicknesses of the first dielectric film 26 and the second dielectric film 24 are not limited to the above-mentioned values.

A band width ratio can be easily adjusted by adjusting the thicknesses of the first dielectric film 26 and the second dielectric film 24. The term "band width ratio" used here is expressed by |fa−fr|/fr×100[%] where fr denotes a resonant frequency and fa denotes an anti-resonant frequency.

In this preferred embodiment, it is preferable that just at least one of the first dielectric film 26 and the second dielectric film 24 is provided. The band width ratio can be easily adjusted by adjusting the thickness of the first dielectric film 26 or the second dielectric film 24.

In this preferred embodiment, as in the first preferred embodiment, φ, θ, and ψ of the Euler angles (φ, θ, ψ) of the magnesium aluminate single crystal of the monocrystalline spinel substrate 3 are the angles within the range of any of the regions A in FIGS. 5 to 41. As a result, the generation of the higher-order mode near the main mode can be effectively suppressed.

Exemplary forms of the acoustic wave device according to preferred embodiments of the present invention are summarized as follows.

<1> An acoustic wave device including a monocrystalline spinel substrate made of a magnesium aluminate single crystal, a piezoelectric layer on the monocrystalline spinel substrate, and an IDT electrode on the piezoelectric layer, wherein φ, θ, and ψ of Euler angles (φ, θ, ψ) of the magnesium aluminate single crystal of the monocrystalline spinel substrate are angles within a range of any of regions A in FIGS. 5 to 41.

<2> The acoustic wave device according to <1>, wherein the piezoelectric layer is a lithium tantalate layer or a lithium niobate layer.

<3> The acoustic wave device according to <1> or <2>, wherein a dielectric film is between the monocrystalline spinel substrate and the piezoelectric layer.

<4> The acoustic wave device according to any one of <1> to <3>, wherein a dielectric film is between the piezoelectric layer and the IDT electrode.

<5> The acoustic wave device according to any one of <1> to <4>, wherein a thickness of the piezoelectric layer is about 2λ or less where a wavelength specified by an electrode finger pitch of the IDT electrode is denoted by λ.

<6> The acoustic wave device according to <5>, wherein the thickness of the piezoelectric layer is about 1λ or less.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a monocrystalline spinel substrate made of a magnesium aluminate single crystal;
a piezoelectric layer on the monocrystalline spinel substrate; and
an IDT electrode on the piezoelectric layer; wherein
φ, θ, and ψ of Euler angles (φ, θ, ψ) of the magnesium aluminate single crystal of the monocrystalline spinel substrate are angles within a range of any of regions A in FIGS 5 to 41.

2. The acoustic wave device according to claim 1, wherein the piezoelectric layer is a lithium tantalate layer or a lithium niobate layer.

3. The acoustic wave device according to claim 1, wherein a dielectric film is between the monocrystalline spinel substrate and the piezoelectric layer.

4. The acoustic wave device according to claim 1, wherein a dielectric film is between the piezoelectric layer and the IDT electrode.

5. The acoustic wave device according to claim 1, wherein a thickness of the piezoelectric layer is about 2λ or less where a wavelength specified by an electrode finger pitch of the IDT electrode is denoted by λ.

6. The acoustic wave device according to claim 5, wherein the thickness of the piezoelectric layer is about 1λ or less.

7. The acoustic wave device according to claim 5, wherein the piezoelectric layer is a rotated Y cut $LiTaO_3$ layer.

8. The acoustic wave device according to claim 1, wherein another layer is located between the piezoelectric layer and the monocrystalline spinel substrate.

9. The acoustic wave device according to claim 1, wherein the magnesium aluminate single crystal is a single crystal of $MgAlO_2$.

10. The acoustic wave device according to claim 1, wherein the piezoelectric layer is a rotated Y cut lithium tantalate layer.

11. The acoustic wave device according to claim 1, wherein the piezoelectric layer is disposed directly on the monocrystalline spinel substrate.

12. The acoustic wave device according to claim 1, further comprising reflectors on the piezoelectric layer.

13. The acoustic wave device according to claim 12, wherein each of the reflectors is made of Al.

14. The acoustic wave device according to claim 12, wherein each of the reflectors is a single-layer metal film or a multilayer metal film.

15. The acoustic wave device according to claim 1, wherein the IDT electrode is made of Al.

16. The acoustic wave device according to claim 1, wherein the IDT electrode is a single-layer metal film or a multilayer metal film.

17. The acoustic wave device according to claim 1, wherein the acoustic wave device is operable in a main mode and a higher-order mode.

18. The acoustic wave device according to claim 17, wherein the higher-order mode is an SH mode or an SV mode.

19. The acoustic wave device according to claim 1, further comprising a protective film on the piezoelectric layer.

20. The acoustic wave device according to claim 19, wherein the protective film includes one of silicon oxide, silicon nitride, or silicon oxynitride.

* * * * *